(12) United States Patent
Ikeda et al.

(10) Patent No.: US 6,512,245 B2
(45) Date of Patent: Jan. 28, 2003

(54) SEMICONDUCTOR INTEGRATED CIRCUIT DEVICE

(75) Inventors: Shuji Ikeda, Koganei (JP); Satoshi Meguro, Hinode-machi (JP); Kyoichiro Asayama, Higashiyamato (JP); Eri Fujita, Kodaira (JP); Koichiro Ishibashi, Kodaira (JP); Toshiro Aoto, Musashimurayama (JP); Sadayuki Morita, Akishima (JP); Atsuyoshi Koike, Kokubunji (JP); Masayuki Kojima, Kokubunji (JP); Yasuo Kiguchi, Higashimurayama (JP); Kazuyuki Suko, Tachikawa (JP); Fumiyuki Kanai, Houya (JP); Naotaka Hashimoto, Koganei (JP); Toshiaki Yamanaka, Iruma (JP)

(73) Assignees: Hitachi, Ltd., Tokyo (JP); Hitachi ULSI Engineering Corp., Kodaira (JP)

( * ) Notice: Subject to any disclaimer, the term of this patent is extended or adjusted under 35 U.S.C. 154(b) by 0 days.

(21) Appl. No.: 09/859,045

(22) Filed: May 17, 2001

(65) Prior Publication Data

US 2001/0023965 A1 Sep. 27, 2001

Related U.S. Application Data

(63) Continuation of application No. 08/181,545, filed on Jan. 14, 1994, now Pat. No. 6,307,217.

(30) Foreign Application Priority Data

Jan. 14, 1993 (JP) .................................................. 5-4502

(51) Int. Cl.$^7$ .............................................. H01L 29/72
(52) U.S. Cl. ............................. 257/68; 257/69; 257/71; 257/296; 257/300; 257/316; 257/336; 257/344; 257/903; 257/904

(58) Field of Search ............................... 257/68, 69, 71, 257/296, 300, 316, 336, 344, 903, 904

(56) References Cited

U.S. PATENT DOCUMENTS

4,597,824 A * 7/1986 Shinada et al. ............. 257/336

(List continued on next page.)

FOREIGN PATENT DOCUMENTS

| JP | 62-33763 | 6/1987 |
| JP | 62-219559 | 9/1987 |
| JP | 1-166554 | 6/1989 |
| JP | 4-291959 | 10/1992 |

OTHER PUBLICATIONS

"A Split Wordline Cell for 16Mb SRAM Using Polysilicon Sidewall Contracts", Itabashi, et al., International Electron Device Mtg., Tech. Ig., pp. 477–480 (1991).

"A 5.9 $\mu m^2$ Super Low Power SRAM Cell Using A New Phase–Shift Lithography", Yamanaka, et al., IEDM Tech, Dig., pp. 477–480 (1990).

First page of U.S. patent No. 5,483,083; 5,619,055; 5,646, 423; 5,700,705.

Primary Examiner—Edward Wojciechowicz
(74) Attorney, Agent, or Firm—Antonelli, Terry, Stout & Kraus, LLP

(57) ABSTRACT

A static random access memory comprising memory cells each composed of transfer MISFETs controlled by word lines and of a flip-flop circuit made of driver MISFETs and load MISFETs. The top of the load MISFETs is covered with supply voltage lines so that capacitor elements of a stacked structure are formed between the gate electrodes of the load MISFETs and the supply voltage lines.

9 Claims, 45 Drawing Sheets

U.S. PATENT DOCUMENTS

| | | |
|---|---|---|
| 4,918,333 A | 4/1990 | Anderson et al. |
| 5,018,102 A | 5/1991 | Houston |
| 5,051,951 A | 9/1991 | Maly et al. |
| 5,057,898 A | 10/1991 | Adan et al. |
| 5,126,916 A | 6/1992 | Tseng |
| 5,162,889 A | 11/1992 | Itomi |
| 5,194,749 A | 3/1993 | Meguro et al. |
| 5,239,196 A | 8/1993 | Ikeda et al. |
| 5,300,802 A | 4/1994 | Komori et al. |
| 5,327,003 A | 7/1994 | Itabashi et al. |
| 5,334,863 A | 8/1994 | Ohkawa et al. |
| 5,363,324 A | 11/1994 | Hashimoto et al. |
| 5,373,170 A | 12/1994 | Pfiester et al. |

* cited by examiner

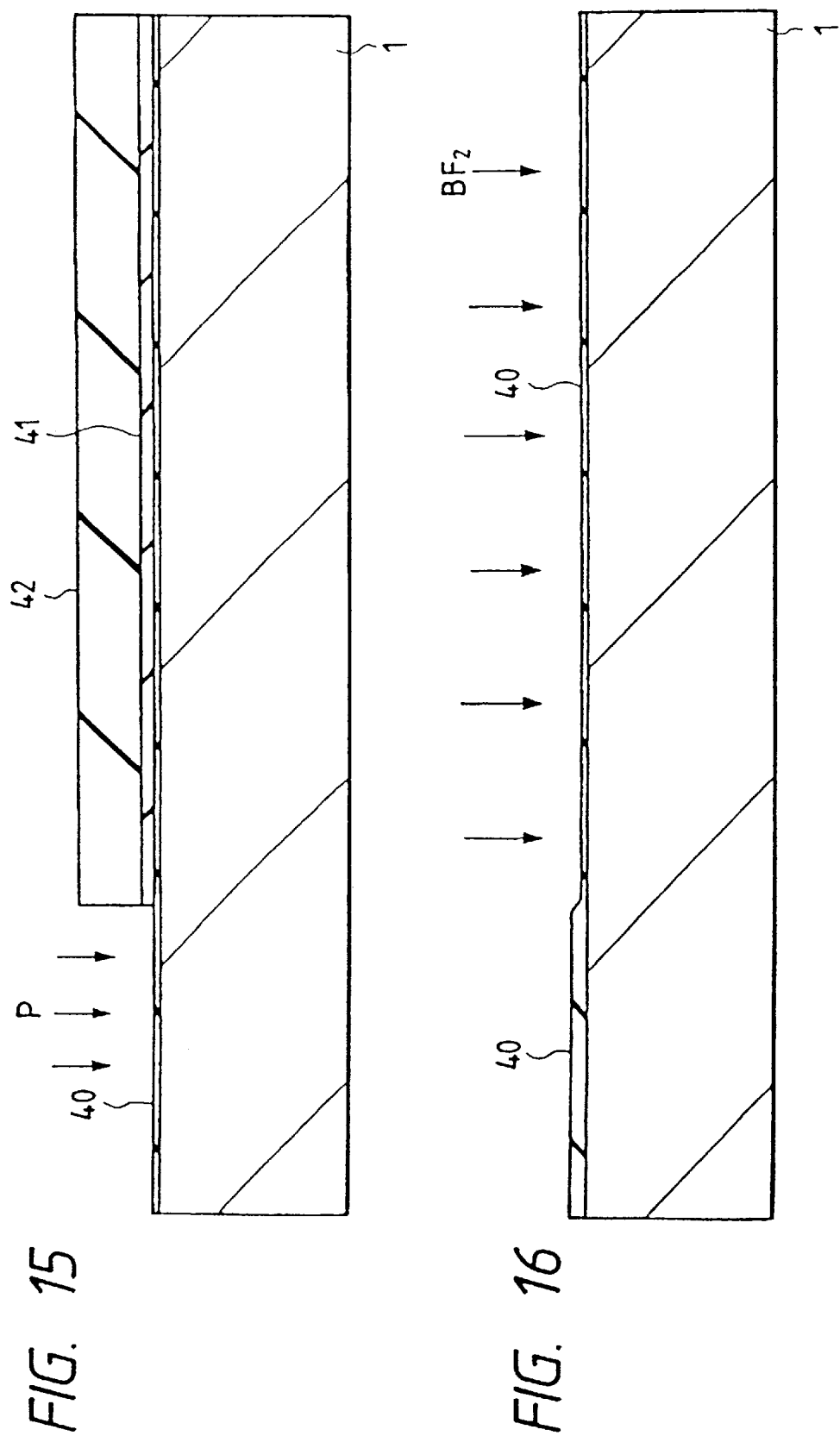

SEMICONDUCTOR INTEGRATED CIRCUIT DEVICE

This application is a Continuation application of Ser. No. 08/181,545, filed Jan. 14, 1994 now U.S. Pat. No. 6,307,217 issued Oct. 23, 2001.

BACKGROUND OF THE INVENTION

The present invention relates to a semiconductor integrated circuit device and a method for manufacturing the same. More particularly, the invention relates to a semiconductor integrated circuit device comprising an SRAM (static random access memory). A general description of the SRAM is found illustratively in IEDM (International Electron Device Meeting), Tech. Dig., pp. 477–480, 1991.

As a semiconductor memory, the SRAM comprises memory cells each composed of a flip-flop circuit and two transfer MISFETs (metal insulator semiconductor field effect transistors) at an intersection formed by complementary data lines and word lines.

Each transfer MISFET constituting part of a memory cell has one of its semiconductor regions connected to the I/O terminals of the flip-flop circuit; the other semiconductor region is connected to one complementary data line. The word lines, connected to the gate electrodes of the transfer MISFETs, control the conduction thereof.

The flip-flop circuit of each memory cell is constituted as a data retaining unit made of two driver MISFETs and two load resistance elements. Each driver MISFET has one of its semiconductor regions (drain) connected to one semiconductor region of one transfer MISFET; the other semiconductor region (source) of the driver MISFET is connected to a reference voltage line. The gate electrode of the driver MISFET is connected to the other semiconductor region of the transfer MISFET.

One end of each load resistance element is connected to one semiconductor region of each transfer MISFET. The other end of the load resistance elements is connected to supply voltage lines. The load resistance elements are deposited in layered fashion on top of the driver MISFETs in order to reduce the memory cell area for higher integration.

Recent years have seen SRAMs of the above-described type further integrated to accommodate large amounts of data and to operate at high speeds. This type of SRAM is described illustratively in U.S. Pat. No. 5,239,196 (U.S. Ser. No. 653,493), assigned to the assignee of the present application on Feb. 11, 1991 with the United States Patent and Trademark Office.

The technology disclosed in the above document primarily involves forming in each memory cell the gate electrodes of the driver MISFETs and those of the transfer MISFETs (word lines) using different conductive strips. The drive and transfer MISFETs intersect with one another in their gate length direction. The word lines extend in the gate length direction of the gate electrodes of the driver MISFETs, and intersect with part of these gate electrodes.

According to the prior art above, part of the driver MISFETs is made to overlap with part of the word lines. The structure reduces the memory cell area, in the gate width direction of the driver MISFETs, by the amount equivalent to the overlapping region. Thus the degree of integration of the SRAM is enhanced.

The above technology also involves connecting in each memory cell a first word line to the gate electrode of a first transfer MISFET while connecting a second word line to the gate electrode of a second transfer MISFET, the second word line being separated from the first word line and extending in the same direction of the latter. Between the first and the second word lines are a first and a second driver MISFET. The first driver MISFET has its drain region connected to one semiconductor region of the first transfer MISFET. The second driver MISFET has its drain region connected to one semiconductor region of the second transfer MISFET. The plane shape of the first transfer and driver MISFETs and that of the second transfer and driver MISFETs are arranged to be symmetrical around the center point of each memory cell. The gate width size of the first and the second transfer MISFETs is made smaller than that of the first and the second driver MISFETs.

The above-described construction inside the memory cell allows for greater margins of alignment in photolithography between the first and the second transfer MISFETs as well as between the first and the second driver MISFETs. The construction contributes to reducing size disparities among the memory elements while ensuring stable memory cell operation. With each memory element reduced in size, the memory cell area is reduced and the SRAM is boosted in terms of integration.

The above technology makes it possible to determine uniquely the separation inside each memory cell between the first transfer MISFET and first driver MISFET on the one hand, and the second transfer MISFET and second driver MISFET on the other. The separation is so determined on the basis of the size of an element-separating region between the first and the second driver MISFETs. Because the unnecessary size (i.e., an empty region equivalent to the clearance between the driver and the transfer MISFETs) is eliminated from the size of the separation, the memory cell size is reduced and the degree of integration of the SRAM is enhanced.

Furthermore, the above technology involves connecting two word lines to the gate electrodes of the two transfer MISFETs in each memory cell. This constitution eliminates the need to wind around the word line (i.e., one word line per memory cell) inside the memory cell to connect the gate electrodes of the two transfer MISFETs. With the two word lines extending over a short distance in a substantially linear manner, the resistance values of the word lines are lowered. This translates into higher speeds at which to write and read data to and from each memory cell, which results in higher operation speeds of the SRAM.

The above technology adopts the so-called complete CMOS (complementary metal oxide semiconductor) structure. The structure involves forming the flip-flop circuit of each memory cell from two driver MISFETs and two load MISFETs in order to lower the standby current. The load MISFETs are deposited in layered fashion on the driver MISFETs to reduce the memory cell area while improving the degree of integration.

SUMMARY OF THE INVENTION

In developing new SRAMs of higher integration operating at higher speeds, the inventors of this invention noted the following problems:

The above technology has capacitor elements formed in each memory cell between the gate electrodes of the driver MISFETs and the load MISFETs deposited on top of the former. The constitution makes it difficult to provide capacitor elements of large capacitance. With the SRAM getting smaller in size, the resistance to α-ray soft errors of the memory cell tends to be insufficient.

According to the above technology, each memory cell has the drain region of one driver MISFET, the gate electrode of one load MISFET, the gate electrode of the other driver MISFET, and the drain region of the other load MISFET interconnected through a plurality of contact holes. This structure tends to increase the contact hole area, which poses an impediment to reducing the memory cell area.

It is therefore an object of the present invention to provide a semiconductor integrated circuit device and a method for manufacturing the same, the device comprising an SRAM providing each memory cell with higher resistance to α-ray soft errors.

It is another object of the present invention to provide a semiconductor integrated circuit device and a method for manufacturing the same, the device affording higher degrees of SRAM integration.

It is a further object of the present invention to provide a semiconductor integrated circuit device and a method for manufacturing the same, the device providing higher SRAM operation speeds.

Other objects, features and advantages of the present invention will become apparent in the following specification and accompanying drawings.

Major features of the invention disclosed in this specification are outlined below:

(1) According to one aspect of the invention, there is provided a semiconductor integrated circuit device comprising: a semiconductor substrate having a main surface; a plurality of memory cells constituting a static random access memory, each of the plurality of memory cells being composed of transfer MISFETs controlled by word lines and of a flip-flop circuit including driver MISFETs and load MISFETs; a first conductive strip formed over the main surface of the semiconductor substrate and constituting gate electrodes of the driver MISFETs; a second conductive strip formed over the main surface of the semiconductor substrate and constituting gate electrodes of the transfer MISFETs; a third conductive strip formed over the first and the second conductive strips and including channel regions, source regions and drain regions of the load MISFETs; a fourth conductive strip formed over the third conductive strip and constituting gate electrodes of the load MISFETs; a fifth conductive strip formed over the fourth conductive strip and constituting supply voltage lines connected to the source regions of the load MISFETs; and a dielectric film formed between the gate electrodes of the load MISFETs and the supply voltage lines; wherein the supply voltage lines and the load MISFETs are positioned relative to one another so that capacitor elements are formed between the gate electrodes of the load MISFETs and the supply voltage lines.

(2) In a preferred structure of the invention as defined in (1) above, a sixth conductive strip is formed over the first and the second conductive strips so as to constitute reference voltage lines connected to the source regions of the driver MISFETs, wherein the third conductive strip is formed over the sixth conductive strip to constitute the channel regions, source regions and drain regions of the load MISFETs, and wherein that plane part of the sixth conductive strip over which the load MISFETs are not furnished has holes formed thereon.

(3) In another preferred structure of the invention as defined in (1) above, a contact hole is formed over the drain region of one driver MISFET so as to interconnect the drain region of that one driver MISFET, the gate electrode of one load MISFET, the gate electrode of the other driver MISFET, and the drain region of the other load MISFET.

(4) In a further preferred structure of the invention as defined in (3) above, a sixth conductive strip is formed over the first and the second conductive strips so as to constitute reference voltage lines connected to the source regions of the driver MISFETs, wherein the third conductive strip is formed over the sixth conductive strip to constitute the channel regions, source regions and drain regions of the load MISFETs, and wherein the contact hole is surrounded by the second and the sixth conductive strips over which a thick insulating film is deposited.

(5) In an even further preferred structure of the invention as defined in (1) above, a sixth conductive strip is formed over the first and the second conductive strips so as to constitute reference voltage lines connected to the source regions of the driver MISFETs, wherein the third conductive strip is formed over the sixth conductive strip to constitute the channel regions, source regions and drain regions of the load MISFETs, the sixth conductive strip being formed into a pad layer over the drain regions of the transfer MISFETs so that data lines are connected via the pad layer to the drain regions of the transfer MISFETs.

(6) In a still further preferred structure of the invention as defined in (1) above, a sixth conductive strip is formed over the first and the second conductive strips so as to constitute reference voltage lines connected to the source regions of the driver MISFETs, wherein the third conductive strip is formed over the sixth conductive strip to constitute the channel regions, source regions and drain regions of the load MISFETs, the sixth conductive strip being formed into a pad layer over one semiconductor region of n-channel MISFETs constituting part of the peripheral circuits of the static random access memory, so that that one semiconductor region of the n-channel MISFETs is wired via the pad layer.

(7) In a yet further preferred structure of the invention as defined in (1) above, a sixth conductive strip is formed over the first and the second conductive strips so as to constitute reference voltage lines connected to the source regions of the driver MISFETs, wherein the third conductive strip is formed over the sixth conductive strip to constitute the channel regions, source regions and drain regions of the load MISFETs, the fifth conductive strip being formed into a pad layer over one semiconductor region of p-channel MISFETs constituting part of the peripheral circuits of the static random access memory, so that that one semiconductor region of the p-channel MISFETs is wired via the pad layer.

(8) In another preferred structure of the invention as defined in (1) above, peripheral circuits of the static random access memory include asymmetrically constructed n-channel MISFETs having source regions of a double diffused drain structure composed of a high-density $n^+$-type semiconductor region and a low-density n-type semiconductor region, the asymmetrically constructed n-channel MISFETs further having drain regions of an LDD structure made of a high-density $n^+$-type semiconductor region and a low-density n-type semiconductor region.

(9) In a further preferred structure of the invention as defined in (1) above, peripheral circuits of the static random access memory include n-channel MISFETs having source regions and drain regions of LDD structures each composed of a high-density $n^+$-type semiconductor region and a low-density n-type semiconductor region, the latter region being formed over a low-density p-type semiconductor region.

(10) In an even further preferred structure of the invention as defined in (1) above, peripheral circuits of the static random access memory include p-channel MISFETs having source regions and drain regions of LDD structures each composed of a high-density p+-type semiconductor region and a low-density p-type semiconductor region, the latter region being formed over a low-density n-type semiconductor region.

(11) In a still further preferred structure of the invention as defined in (1) above, the dielectric film between those gate electrodes of the load MISFETs which are made of the fourth conductive strip on the one hand, and the supply voltage lines made of the fifth conductive strip on the other, is constituted by a silicon oxide film and a silicon nitride film, the latter film being deposited over the former in layered fashion.

(12) According to another aspect of the invention, there is provided a method for manufacturing a semiconductor integrated circuit device having a static random access memory comprising memory cells each composed of transfer MISFETs controlled by word lines and of a flip-flop circuit formed by driver MISFETs and load MISFETs, the method comprising the steps of; forming gate electrodes of the driver MISFETs by use of a first conductive strip deposited over a main surface of a semiconductor substrate; forming gate electrodes of the transfer MISFETs by use of a second conductive strip deposited over the main surface of the semiconductor substrate; forming reference voltage lines connected to source regions of the driver MISFETs by use of a third conductive strip deposited over the first and the second conductive strips; forming channel regions, source regions and drain regions of the load MISFETs by use of a fourth conductive strip formed over the third conductive strip; forming a contact hole on the drain regions of the driver MISFETs; and forming gate electrodes of the load MISFETs by use of a fifth conductive strip deposited over the fourth conductive strip, so that the contact hole interconnects the drain region of one driver MISFET, the gate electrode of one load MISFET, the gate electrode of the other driver MISFET, and the drain region of the other load MISFET.

(13) According to a further aspect of the invention, there is provided a method for manufacturing a semiconductor integrated circuit device having a static random access memory comprising memory cells each composed of transfer MISFETs controlled by word lines and of a flip-flop circuit formed by driver MISFETs and load MISFETs, the method comprising the steps of: forming gate electrodes of the driver MISFETs by use of a first conductive strip deposited over a main surface of a semiconductor substrate; forming gate electrodes of the transfer MISFETs by use of a second conductive strip deposited over the main surface of the semiconductor substrate; forming reference voltage lines connected to source regions of the driver MISFETs by use of a third conductive strip deposited over the first and the second conductive strips; forming gate electrodes of the load MISFETs by use of a fourth conductive strip formed over the third conductive strip; forming side wall spacers on the side wall of the gate electrodes of the load MISFETs by etching an insulating film deposited over the fourth conductive strip; forming a gate insulating film of the load MISFETs over the fourth conductive strip through thermal oxidation of the latter; and forming channel regions, source regions and drain regions of the load MISFETs by use of a fifth conductive strip deposited over the gate insulating film of the load MISFETs.

(14) According to an even further aspect of the invention, there is provided a method for manufacturing a semiconductor integrated circuit device having a static random access memory comprising memory cells each composed of transfer MISFETs controlled by word lines and of a flip-flop circuit formed by driver MISFETs and load MISFETs, the method comprising the steps of: forming gate electrodes of the driver MISFETs by use of a first conductive strip deposited over a main surface of a semiconductor substrate; forming a first insulating film over the first conductive strip; forming a second conductive strip over the first insulating film; forming source regions and drain regions of the driver MISFETs by adding impurities to the main surface of the semiconductor substrate; leaving the second conductive strip intact solely over the gate electrodes of the driver MISFETs by etching the second conductive strip; forming a second insulating film over the second conductive strip; forming a contact hole on the source regions of the driver MISFETs by etching the second insulating film and the first insulating film, in that order; etching a third conductive strip deposited over the second insulating film so as to form reference voltage lines connected to the source regions of the driver MISFETs via the contact hole, the reference voltage lines being further connected to the second conductive strip over the gate electrodes of the driver MISFETs via the side wall of the contact hole.

According to the structure described in (1) above, capacitor elements C of large capacitance are formed between the gate electrodes of the load MISFETs on the one hand, and the supply voltage lines occupying a large area over these gate electrodes on the other. This structure enhances the resistance of the memory cells to α-ray soft errors.

According to the structure described in (2) above, holes are made on part of the supply voltage lines so as to reduce the resistivity thereof. The structure thus prevents drops in the supply voltage fed through the supply voltage lines to the memory cells, permitting stable SRAM operation.

According to the structure described in (3) and (13) above, one contact hole interconnects the drain region of one driver MISFET, the gate electrode of one load MISFET, the drain region of the other load MISFET, and the gate electrode of the other driver MISFET over the main surface of the semiconductor substrate. Compared with prior art setups where these conductive strips are connected via a plurality of contact holes, this single contact hole structure reduces the memory cell area by the amount equivalent to the multiple contact holes eliminated. In addition, the single contact hole structure requires fewer steps to follow for the manufacture thereof than the multiple contact hole setups.

According to the structure described in (4) above, the contact hole formed on the drain regions of the driver MISFETs is surrounded by the second and the sixth conductive strips which in turn are covered with a thick insulating film. The structure provides greater margins of alignment for the contact hole to be formed.

According to the structure described in (5) above, the data lines are connected to the drain regions of the transfer MISFETs via the pad layer made of the sixth conductive strip constituting the reference voltage lines. The structure eliminates the need for margins of alignment for the contact hole to be formed on the drain regions, whereby the area of the drain regions of the transfer MISFETs is reduced.

According to the structure described in (6) above, one semiconductor region of the n-channel MISFETs constituting part of the peripheral circuits of the SRAM is wired via the pad layer formed by the sixth conductive strip. The structure eliminates the need for margins of alignment for the contact hole to be formed on the semiconductor region, whereby the semiconductor region area of the n-channel MISFETs is reduced.

According to the structure described in (7) above, one semiconductor region of the p-channel MISFETs constituting part of the peripheral circuits of the SRAM is wired via the pad layer formed by the fifth conductive strip. The structure eliminates the need for margins of alignment for the contact hole to be formed on the semiconductor region, whereby the semiconductor region area of the p-channel MISFETs is reduced.

According to the structure described in (8) above, the asymmetrically constructed n-channel MISFETs constituting part of the peripheral circuits of the SRAM have the source regions of the so-called double diffused drain structure. This setup reduces the resistance value of the source regions and thereby improves the ability of the SRAM to be driven on currents. Furthermore, building the drain regions in the LDD structure enhances the dielectric strength of these regions.

According to the structure described in (9) above, the low-density p-type semiconductor regions are formed under the low-density n-type semiconductor regions. This structure minimizes the short channel effect of the n-channel MISFETs.

According to the structure described in (10) above, the low-density n-type semiconductor regions are formed under the low-density p-type semiconductor regions. This structure minimizes the short channel effect of the p-channel MISFETs.

According to the structure described in (11) above, the insulating film under the fifth conductive strip is constituted by a silicon oxide film and a silicon nitride film, the latter film being deposited over the former in layered fashion. When the fifth conductive strip is etched to form the supply voltage lines, the insulating film under the fifth conductive strip is protected from erosion. Thus the structure improves the dielectric strength of the capacitor elements composed of the fifth conductive strip, the insulating film and the fourth conductive strip.

According to the manufacturing method described in (13) above, side wall spacers are formed on the side wall of the gate electrodes of the load MISFETs. The side wall spacers protect the edges of the gate electrodes. Thermally oxidizing the gate electrodes rounds the edges thereof, which improves the dielectric strength of the gate insulating film of the load MISFETs. Furthermore, the gate insulating film has a higher dielectric strength when formed by thermal oxidation than by the CVD method.

According to the manufacturing method described in (14) above, capacitor elements are formed between the gate electrodes of the driver MISFETs and the reference voltage lines. The second conductive strip is formed between the first and the second insulating films constituting the dielectric film of the capacitor elements. This arrangement makes it possible effectively to reduce the thickness of the dielectric film, whereby the capacitance of the capacitor elements is boosted.

A brief description below of the drawings accompanying this specification will be followed by a detailed description of preferred embodiments of the invention. Throughout the description of the embodiments with reference to the drawings, the parts that are functionally identical are designated by like reference numerals, and any repetitive description of the same parts is omitted.

BRIEF DESCRIPTION OF THE DRAWINGS

FIG. 15 is a partial sectional view of the semiconductor substrate of the first embodiment, illustrating how the embodiment is manufactured;

FIG. 16 is another partial sectional view of the semiconductor substrate of the first embodiment, illustrating how the embodiment is manufactured;

DESCRIPTION OF THE PREFERRED EMBODIMENT

[First Embodiment]

Figure 2:
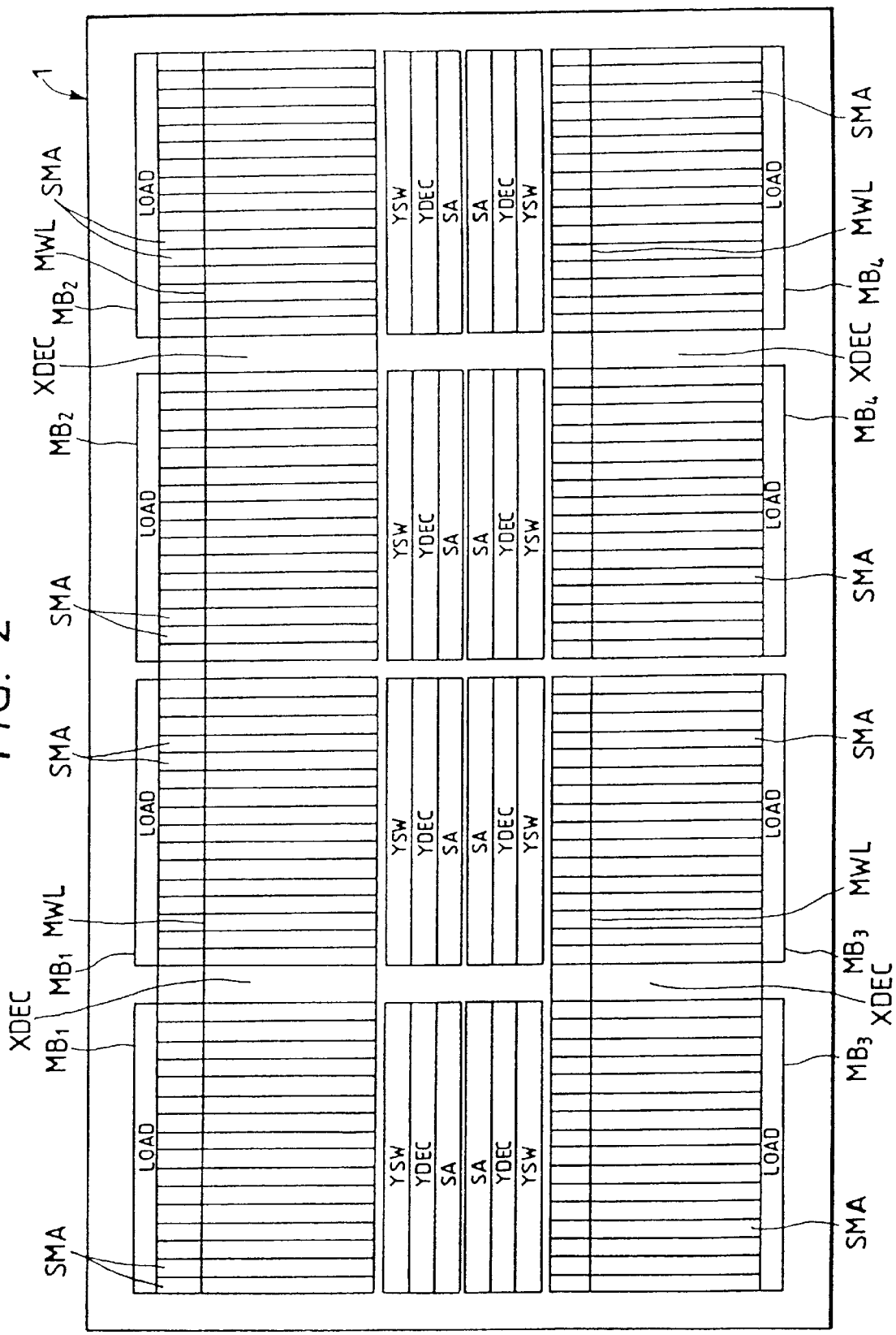
FIG. 2 is a view of an overall chip layout of the first embodiment.
Figure 3:
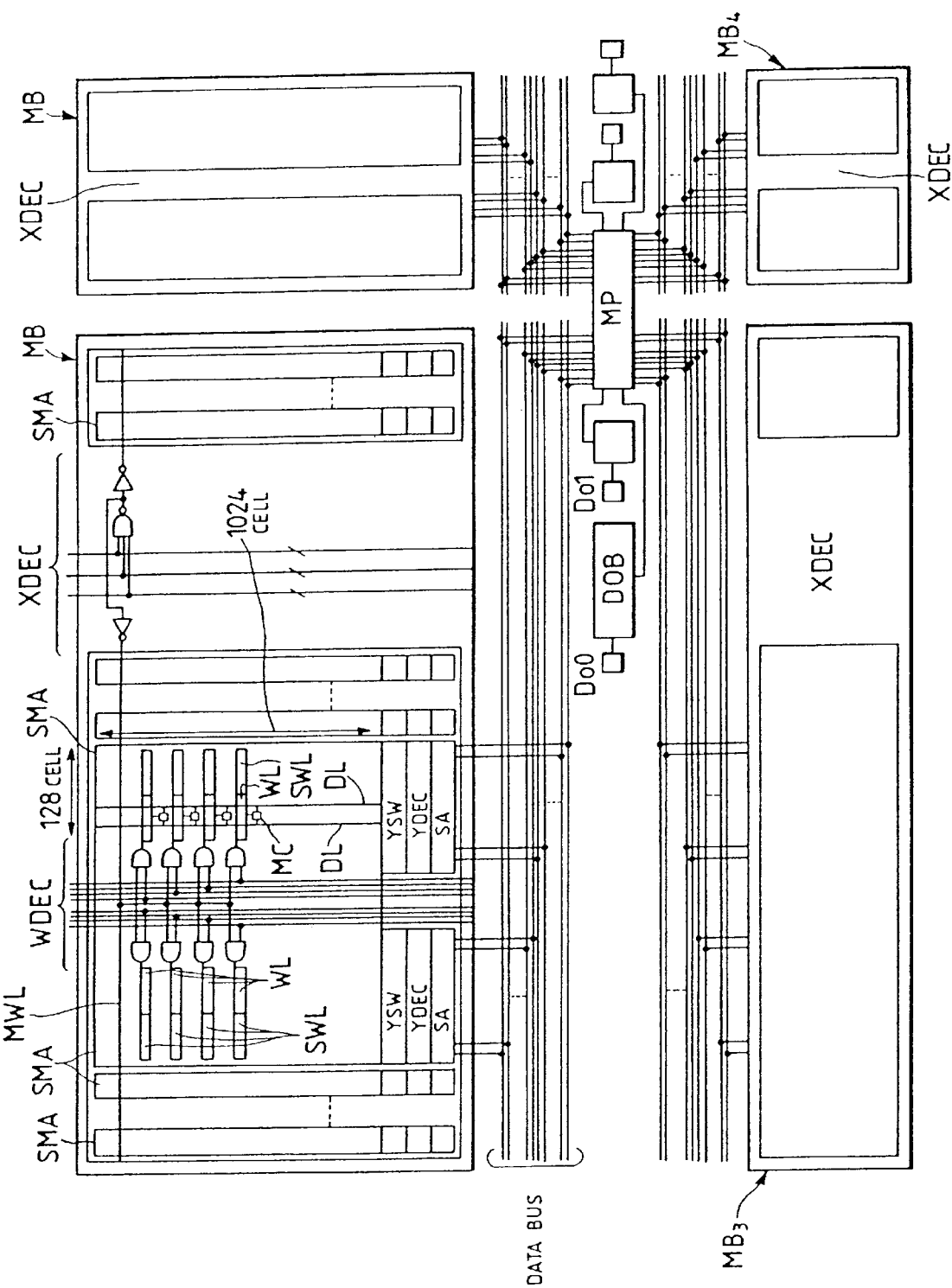
FIG. 3 is a view of a chip layout enlarging part of the layout of FIG. 2.

FIG. 2 shows an overall chip layout of a static random access memory (SRAM) practiced as the first embodiment of the invention, and FIG. 3 provides a chip layout that enlarges part of the layout of FIG. 2.

The main surface of a rectangular semiconductor chip 1 comprises an SRAM illustratively having a capacity of, but not limited to, 16 megabits. The memory cell array of the SRAM is composed of four memory blocks $MB_1$ through $MB_4$. Each memory block has 32 sub-arrays SMA. Each sub-array SMA is made of memory cells arranged in 1,024 rows by 128 columns.

A load circuit LOAD is located at one end of each memory block MB. At the other end of the memory block MB are a Y-selector circuit YSW, a Y-decoder circuit YDEC and a sense amplifier circuit SA. In the middle of each memory block MB is an X-decoder circuit XDEC.

As shown in FIG. 3, a word decoder circuit WDEC is located at one end of each of the sub-arrays SMA. Any one of the word decoder circuits WDEC is selected by one of the X-decoders XDEC via main word lines MWL extended in the column direction of the memory blocks MB.

Each word decoder WDEC selects word lines WL via sub-word lines SWLs extended in the column direction over the sub-arrays SMAs, the word lines WLs being extended in parallel with the sub-word lines SWLs. The word lines WLs are provided to each of the memory cells MCs arranged in the column direction, each memory cell being connected to two word lines WLs (first and second) to which the same selection signal is applied.

Over the sub-arrays SMAs are the main word lines MWLs, sub-word lines SWLs and complementary data lines DLs. The complementary data lines DLs are extended in the row direction so as to intersect with the word lines WLs. One set of complementary data lines DLs is made of a first and a second data line extended in parallel with each other and furnished to each of the memory cells MCs arranged in the row direction. One end of the complementary data lines DLs is connected to the load circuits LOADs; the other end of the complementary data lines DLs is connected to the sense amplifier circuits SAs via the Y-selector circuits YSWs.

Figure 4:
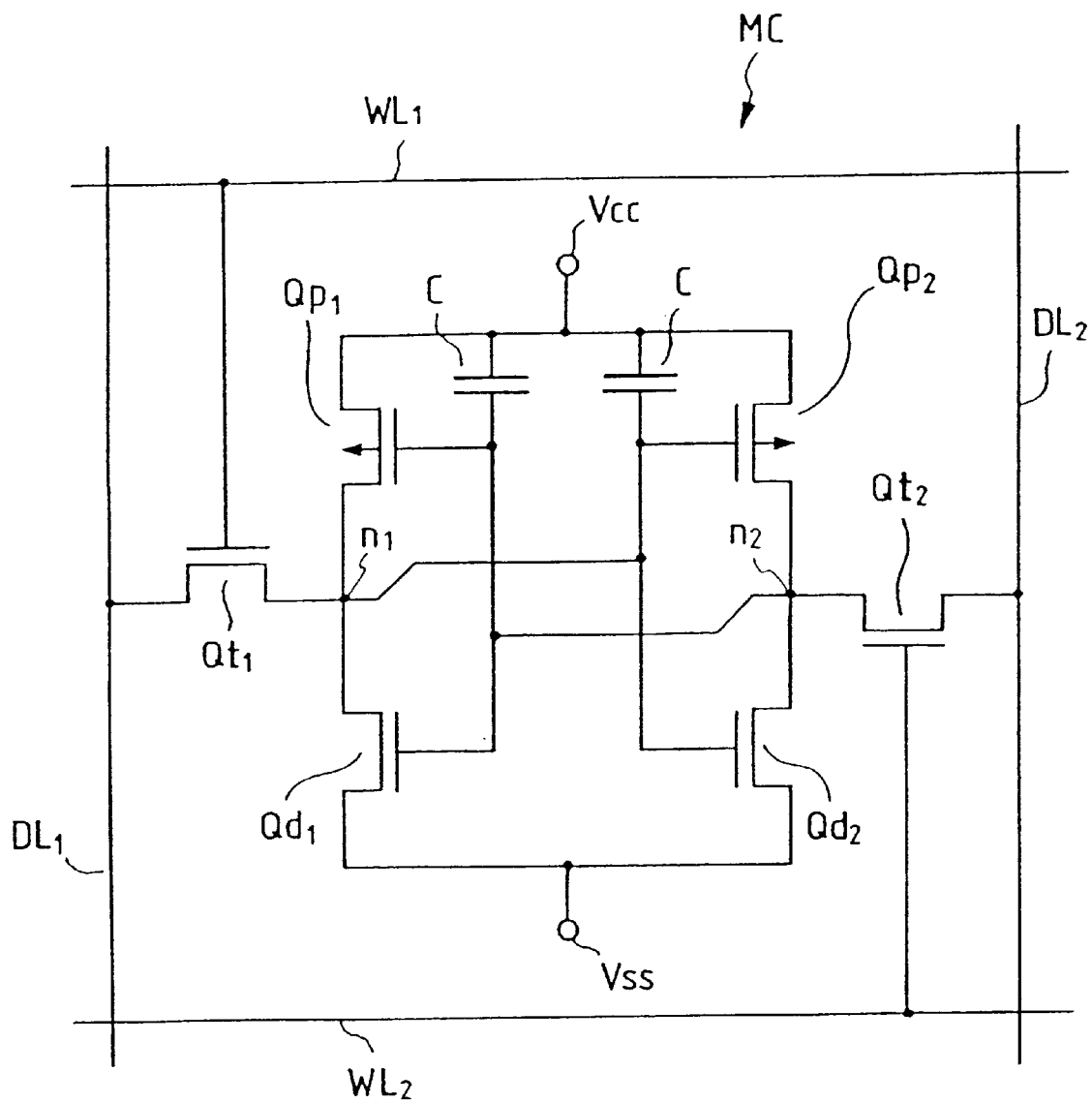
FIG. 4 is an equivalent circuit diagram of a memory cell in the first embodiment.

FIG. 4 is an equivalent circuit diagram of a memory cell MC in the sub-arrays SMAs of the first embodiment. Each memory cell, composed of a flip-flop circuit and two transfer MISFETs $Qt_1$ and $Qt_2$, is located at the intersection formed by the first and the second word lines $WL_1$ and $WL_2$ as well as by the first and the second complementary data lines $DL_1$ and $DL_2$. The flip-flop circuit is a data retaining part that retains one-bit information ("1" or "0").

The two transfer MISFETs $Qt_1$ and $Qt_2$ in each memory cell MS are an n-channel MISFET each. The source regions of the two transfer MISFETs $Qt_1$ and $Qt_2$ are connected to one pair of I/O terminals of the flip-flop circuit. The source or the drain region of the transfer MISFET $Qt_1$ is connected to the first data line $DL_1$; the gate electrode of the transfer MISFET $Qt_1$ is connected to the first word line $WL_1$. The source or the drain region of the transfer MISFET $Qt_2$ is connected to the second data line $DL_2$; the gate electrode of the transfer MISFET $Qt_2$ is connected to the second word line $WL_2$.

Each flip-flop circuit comprises two n-channel type driver MISFETs $Qd_1$ and $Qd_2$ and two p-channel type load MISFETs $Qp_1$ and $Qp_2$. That is, each of the memory cells MCs constituting the SRAM of the invention has a complete CMOS structure.

The drain region of the driver MISFET $Qd_1$ is connected to that of the load MISFET $Qp_1$ and their gate electrodes are interconnected, thereby constituting a CMOS. Likewise, the drain region of the driver MISFET $Qd_2$ is connected to that of the load MISFET $Qp_2$ and their gate electrodes are interconnected so as to constitute another CMOS.

The drain region of the driver MISFET $Qd_1$ and that of the load MISFET $Qp_1$ are connected to the source or the drain region of the transfer MISFET $Qt_1$, whichever is yet to be connected. The drain regions of the driver MISFET $Qd_1$ and load MISFET $Qp_1$ are also connected to the gate electrodes of the driver MISFET $Qd_2$ and load MISFET $Qp_2$.

The drain region of the driver MISFET $Qd_2$ and that of the load MISFET $Qp_2$ (i.e., the other pair of I/O terminals of the flip-flop circuit) are connected to the source or the drain region of the transfer MISFET $Qt_2$, whichever is yet to be connected. The drain regions of the driver MISFET $Qd_2$ and load MISFET $Qp_2$ are also connected to the gate electrodes of the driver MISFET $Qd_1$ and load MISFET $Qp_1$. In FIG. 4, reference characters $n_1$ and $n_2$ denote memory nodes.

The source regions of the driver MISFETs $Qd_1$ and $Qd_2$ are connected to a reference voltage line $V_{SS}$. The source regions of the load MISFETs $Qp_1$ and $Qp_2$ are connected to a supply voltage line $V_{CC}$. The reference voltage $V_{SS}$ and the supply voltage $V_{CC}$ are illustratively 0 V (ground voltage) and 5 V, respectively.

Capacitor elements C are located between the gate electrodes of the load MISFETs $Qp_1$ and $Qp_2$ on the one hand, and the supply voltage line $V_{CC}$ on the other. These capacitor elements provide capacitance to the memory nodes $n_1$ and $n_2$. The primary objective of the capacitor elements is to enhance the resistance of the memory cells MC to α-ray soft errors. The constitution of each capacitor element will be described later in more detail.

As depicted in FIGS. 2 and 3, the SRAM of the invention incorporating the above-described memory cells MC works as follows: an X-decoder XDEC first selects one of the word decoder circuits WDECs for the sub-arrays SMAs via the main word line MWL. In turn, the selected word decoder circuit WDEC selects word lines WLs (first word line $WL_1$ and second word line $WL_2$) via the sub-word lines SWLs. As will be described later, the word lines WLs are composed of a second layer gate material and the sub-word lines SWLs are made of a first layer wiring material.

That is, the SRAM according to the invention adopts the so-called divided word line scheme. Under this scheme, a word decoder circuit WDEC and an X-decoder circuit XDEC select one pair of word lines (first word line $WL_1$ and second word line $WL_2$) from among a plurality of word lines WLs extended over the sub-arrays SMAs. The first and the second word lines $WL_1$ and $WL_2$ of that pair are connected to the word decoder WDEC via the sub-word lines SWLs under what is known as the double word line scheme.

The peripheral circuits of the SRAM comprise the X-decoders XDECs, Y-selector circuits YSWs, Y-decoder circuits YDECs, sense amplifier circuits SAs and load circuits LOADs furnished to the memory blocks MBs. These peripheral circuits are constituted by CMOSs and control operations to write and read data to and from the memory cells MCs as well as to retain data therein.

Figure 1:
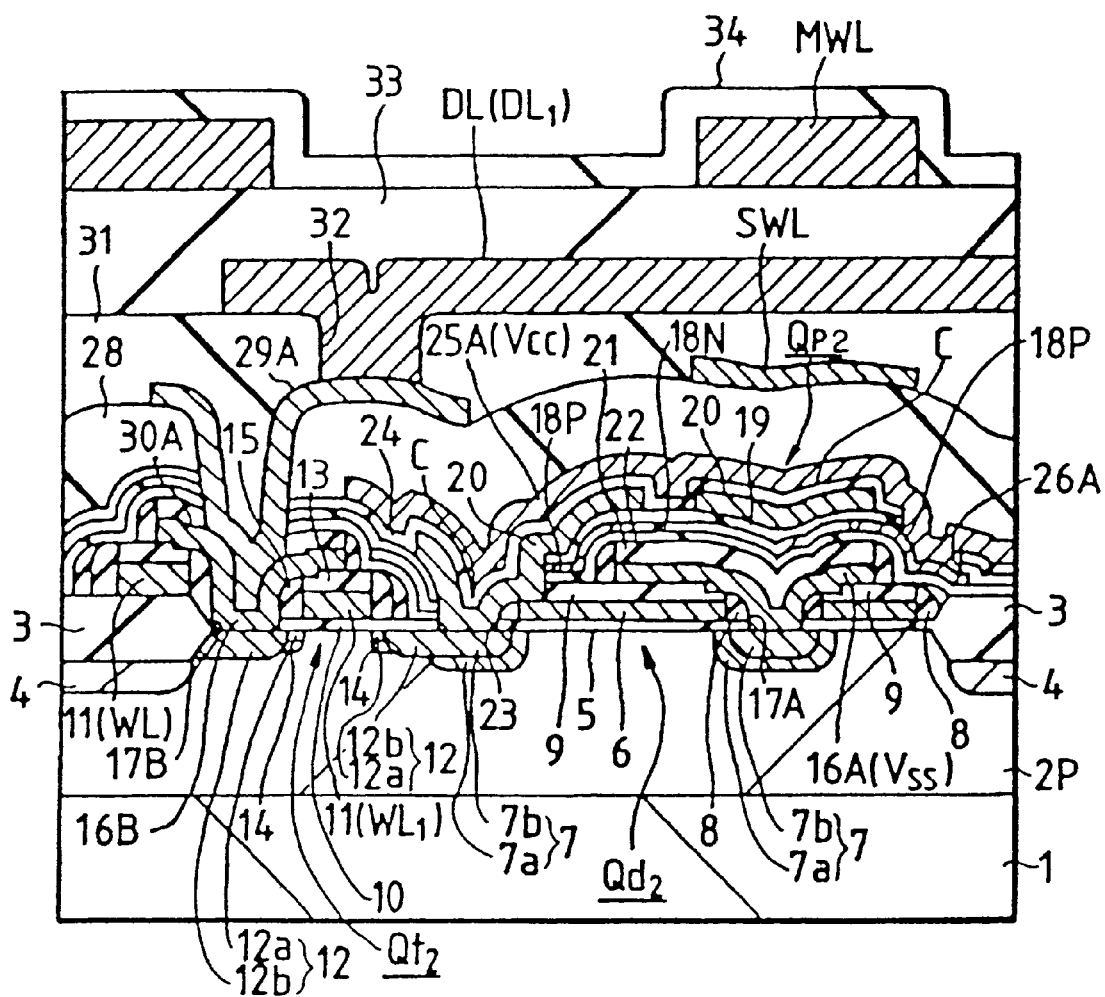
FIG. 1 is a partial sectional view of a semiconductor substrate showing a memory cell of a semiconductor integrated circuit device practiced as a first embodiment of the invention.

The structure of each memory cell MC in the SRAM will now be described more specifically with reference to FIG. 1 and FIGS. 5 through 14. As shown in FIG. 1, a $p^-$-type well $2p$ is formed over the main surface of the semiconductor substrate (wafer) 1 composed of an $n^-$-type silicon single crystal. A field insulating film 3 made of a silicon oxide film for element separation is formed over the main surface of a nonactive region in the $p^-$-type well $2p$. Under the field insulating film 3 is a p-type channel stopper region 4 for preventing inversion.

Figure 5:
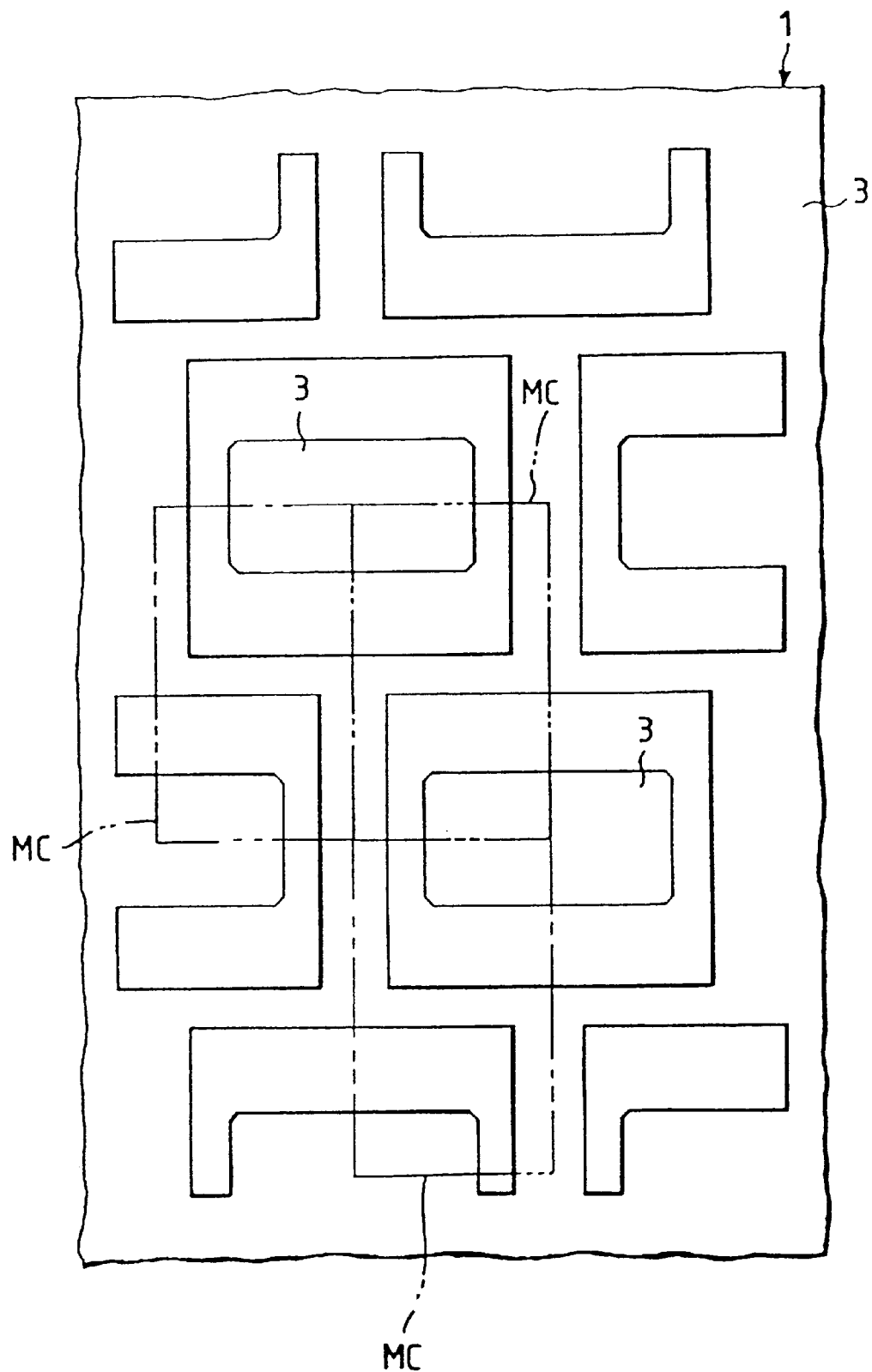
FIG. 5 is a partial plan view of a sub-array pattern layout of the first embodiment.

FIG. 5 shows a pattern layout of the field insulating film 3 formed over the main surface of the semiconductor substrate 1. In FIG. 5, the rectangular region enclosed by two-dot chain lines is the region occupied by a single memory cell MC.

The transfer MISFETs $Qt_1$ and $Qt_2$, driver MISFETs $Qd_1$ and $Qd_2$, and load MISFETs $Qp_1$ and $Qp_2$ constitute each memory cell MC in the SRAM. Of these MISFETs, the transfer MISFETs $Qt_1$ and $Qt_2$ and the driver MISFETs $Qd_1$ and $Qd_2$ are formed on the main surface of an active region in the $p^-$-type well $2p$ surrounded by the field insulating film 3; the load MISFETs $Qp_1$ and $Qp_2$ are formed above the driver MISFETs $Qd_1$ and $Qd_2$.

The driver MISFETs $Qd_1$ and $Qd_2$ are composed of a gate insulating film 5, gate electrodes 6 and n-type semiconductor regions (source and drain regions) 7. Of these MISFET components, one of the semiconductor regions (drain region) of the driver MISFET $Qd_1$ and the gate electrode 6 of the driver MISFET $Qd_2$ along with one of the semiconductor regions (source region) 7 of the latter are illustrated in FIG. 1.

Figure 6:
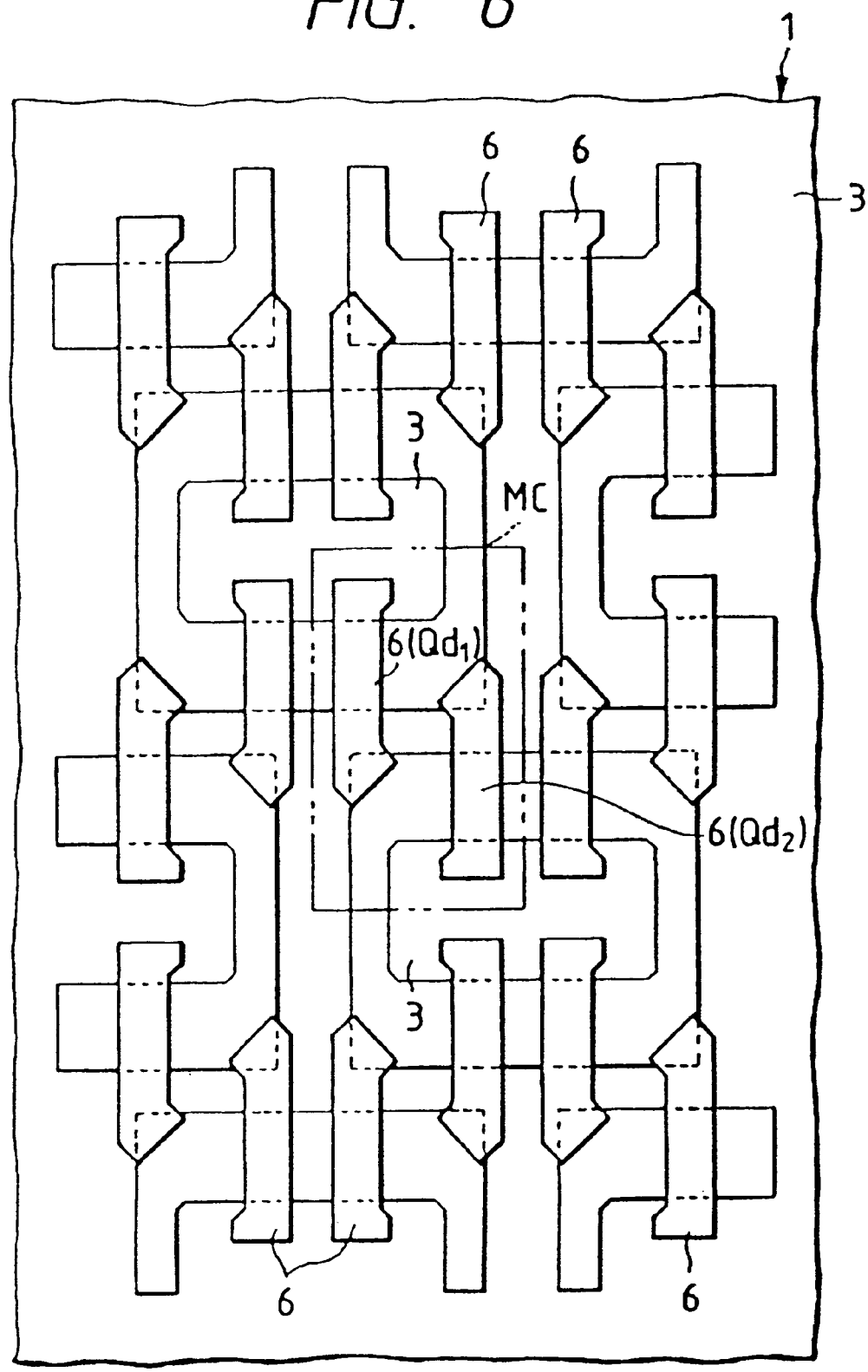
FIG. 6 is a partial plan view of another sub-array pattern layout of the first embodiment.

As shown in FIG. 6, the gate electrodes 6 of the driver MISFETs $Qd_1$ and $Qd_2$ are extended in the row direction (i.e., the direction in which complementary data lines DLs are extended, or the Y direction). That is, the driver MISFETs $Qd_1$ and $Qd_2$ are arranged so that their gate length (Lg) direction and column direction (i.e., the direction in which word lines WLs are extended, or the X direction) coincide with each other.

The gate electrodes 6 on one end of the driver MISFETs $Qd_1$ and $Qd_2$ protrude above the field insulating film 3 in the row direction at least by the amount equivalent to the margin of mask alignment taken during the manufacturing process. The gate electrode 6 on the other end of the driver MISFET $Qd_1$ protrudes above one semiconductor region (drain region) 7 of the driver MISFET $Qd_2$ in the row direction via the field insulating film 3. Likewise, the gate electrode 6 on the other end of the driver MISFET $Qd_2$ protrudes above one semiconductor region (drain region) 7 of the driver MISFET $Qd_1$ in the row direction via the field insulating film 3.

The gate electrodes 6 of the driver MISFETs $Qd_1$ and $Qd_2$, formed during the process of manufacturing the first layer gate material, are composed illustratively of a polycrystalline silicon film. To this polycrystalline silicon film are added n-type impurities phosphorus P or arsenic As) to reduce its resistance value. On top of the gate electrodes 6 is an insulating film 9 that electrically separates the gate electrodes 6 from upper layer conductive strips. The insulating film 9 is made illustratively of a silicon oxide film.

The semiconductor regions (source and drain regions) 7 of the driver MISFETs $Qd_1$ and $Qd_2$ are constituted by an n-type semiconductor region 7a of low impurity density and an n⁺-type semiconductor region 7b of high impurity density. The n-type semiconductor region 7a and n⁺-type semiconductor region 7b are formed in a self-aligned manner with respect to side wall spacers 8 furnished over the gate electrodes 7 and their side walls.

As described, the driver MISFETs $Qd_1$ and $Qd_2$ have their semiconductor regions (source and drain regions) formed in the so-called double diffused drain structure. Throughout the current paths between the source and drain regions, the double diffused drain structure has a lower parasitic resistance in the n-type semiconductor region 7a than the so-called LDD (lightly doped drain) structure, to be described later, in its n-type semiconductor region. This means that the driver MISFETs $Qd_1$ and $Qd_2$ in the double diffused drain structure offer higher driving capabilities (gm) than the transfer MISFETs $Qt_1$ and $Qt_2$ in the LDD structure. Because the effective β ratio of the memory cells MC is increased in the manner described, the driver MISFETs $Qd_1$ and $Qd_2$ are allowed to have narrower gate widths. This translates into a reduced area occupied by the driver MISFETs $Qd_1$ and $Qd_2$. With the area of the memory cells MC thus reduced, the degree of integration of the SRAM is enhanced.

The transfer MISFETs $Qt_1$ and $Qt_2$ of the memory cell MC are formed over the main surface of the active region in the p⁻-type well 2p surrounded by the field insulating film 3. The transfer MISFETs $Qt_1$ and $Qt_2$ comprise a gate insulating film 10, gate electrodes 11, and n-type semiconductor regions (source and drain regions) 12. FIG. 1 shows the gate insulating film 10, gate electrodes 11 and n-type semiconductor regions (source and drain regions) 12 of the transfer MISFET $Qt_1$.

Figure 7:
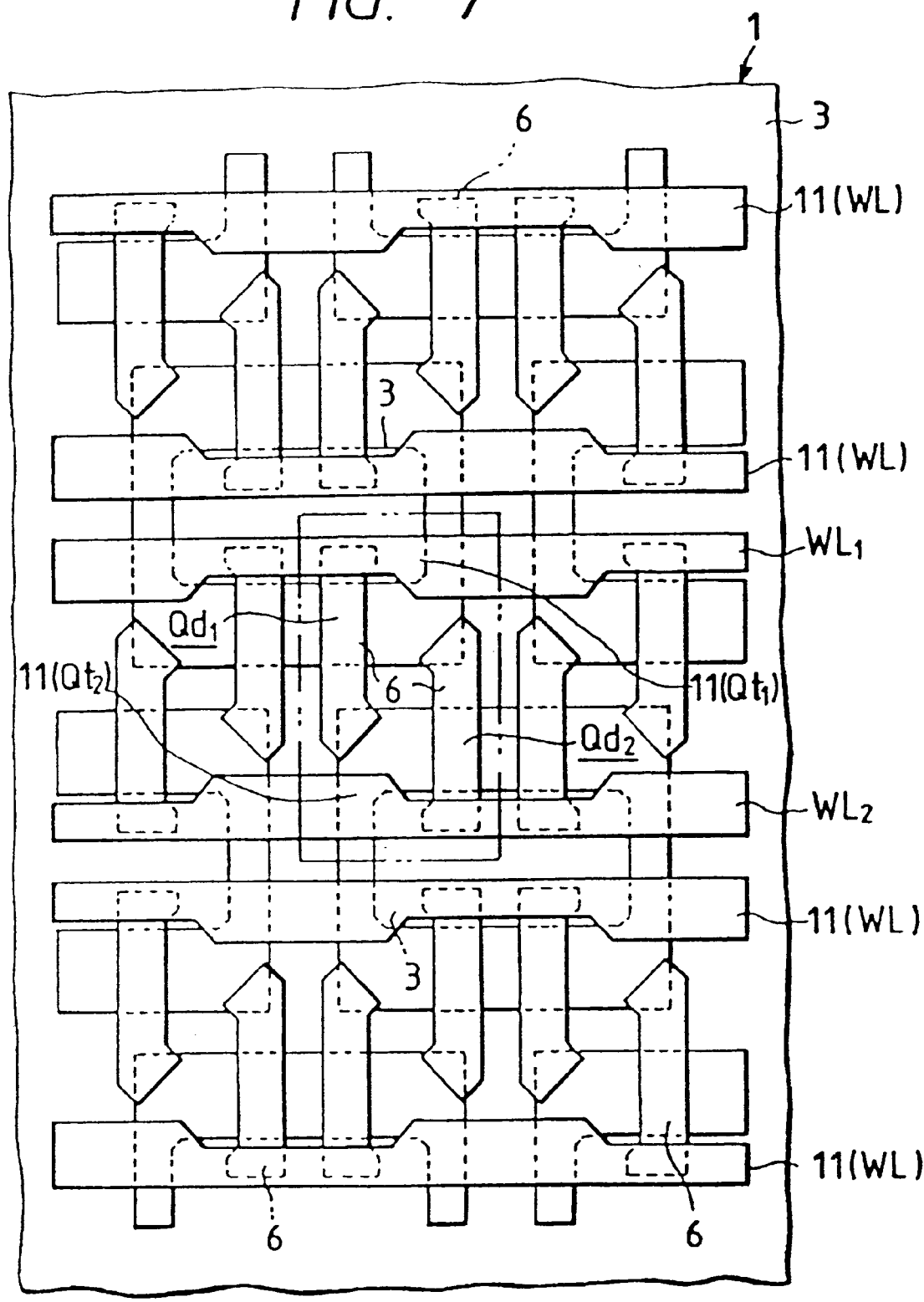
FIG. 7 is a partial plan view of another sub-array pattern layout of the first embodiment.

As depicted in FIG. 7, the gate electrodes 11 of the transfer MISFETs $Qt_1$ and $Qt_2$ are extended in the column direction (i.e., the direction in which word lines WL are extended, or the X direction). That is, the transfer MISFETs $Qt_1$ and $Qt_2$ are arranged so that their gate lengths (Lg) intersect with the gate lengths (Lg) of the driver MISFETs $Qd_1$ and $Qd_2$. With the transfer MISFET $Qt_1$ and driver MISFET $Qd_1$ thus arranged to have their gate lengths (Lg) intersecting with one another, the active region of the driver MISFET $Qd_1$ is provided in the column direction while the active region of the transfer MISFET $Qt_1$ is furnished in the row direction, these active regions centering on the integrated part of the components.

The gate electrodes 11 of the transfer MISFETs $Qt_1$ and $Qt_2$ are formed during the process of manufacturing the second layer gate material. As such, the gate electrodes 11 are composed illustratively of a polycide film comprising a polycrystalline silicon film and a high-melting point metal silicide film having a lower resistivity than the polycrystalline silicon film. The polycrystalline silicon film, formed under the silicide film, is given n-type impurities (phosphorus (P) or arsenic (AS)) to reduce its resistance value. The high-melting point metal silicide film formed above is made illustratively of $WSi_x$, $MoSi_x$, $TiSi_x$ or $TaSi_x$. Over the gate electrodes 11 of the transfer MISFETs $Qt_1$ and $Qt_2$ is an insulating film 13 for electrically separating the gate electrodes 11 from the upper layer conductive strips. The insulating film 13 is constituted illustratively by a silicon oxide film.

The semiconductor regions 12 of the transfer MISFETs $Qt_1$ and $Qt_2$ are composed of an n-type semiconductor region 12a of low impurity density and an n⁺-type semiconductor region 12b of high impurity density. That is, the semiconductor regions 12 of the transfer MISFETs $Qt_1$ and $Qt_2$ constitute an LDD (lightly doped drain) structure. Under the n-type semiconductor region 12a of low impurity density is a p-type semiconductor region 14 of low impurity density.

Of the n-type and n⁺-type semiconductor regions 12a and 12b making up the semiconductor regions 12 of the transfer MISFETs $Qt_1$ and $Qt_2$ as well as of the p-type semiconductor region 14, the n- and p-type semiconductor regions 12a and 14 are self-aligned with respect to the gate electrodes 11. The n⁺-type semiconductor region 12b is self-aligned relative to the side wall spacers formed on the gate electrodes 11 and their side walls.

As described, the semiconductor regions 12 of the transfer MISFETs $Qt_1$ and $Qt_2$ are in the LDD structure, and the p-type semiconductor region 14 is formed under the n-type semiconductor region 12a of low impurity density. The LDD structure boosts the dielectric strength of the semiconductor regions 12 and lowers the electric field strength thereof. This in turn reduces the amount of the hot carrier generated. The p-type semiconductor region 14 suppresses the short channel effect and prevents fluctuation of the threshold voltage for the transfer MISFETs $Qt_1$ and $Qt_2$. With the occupied area of the transfer MISFETs $Qt_1$ and $Qt_2$ thus reduced, the area occupied by the memory cells MC is made smaller and the degree of integration of the SRAM made higher.

As shown in FIG. 7, the gate electrodes 11 of the transfer MISFETs $Qt_1$ and $Qt_2$ are formed integrally with the word lines WL extended in the column direction over the field insulating film 3. In the memory cell MC, the first and the second word lines $WL_1$ and $WL_2$ are connected to the gate electrodes 11 of the transfer MISFETs $Qt_1$ and $Qt_2$, respectively.

That is, each memory cell MC comprises two word lines WL (first word line $WL_1$ and second word line $WL_2$) that are separate and are extended in parallel in the column direction. The first word line $WL_1$ intersects with a protruded part of the gate electrode 7 of the driver MISFET $Qd_1$ above the field insulating film 3; the second word line $WL_2$ intersects with a protruded part of the gate electrode 7 of the driver MISFET $Qd_2$ above the field insulating film 3.

The basic memory array structure and the plane layout patterns of the driver MISFETs $Qd_1$ and $Qd_2$ and of the transfer MISFETs $Qt_1$ and $Qt_2$ are the same as those of the SRAM disclosed in U.S. Pat. No. 5,239,196 filed by this applicant. The content of U.S. Pat. No. 5,239,196 is incorporated in this specification by reference in its entirety.

The driver MISFETs $Qd_1$ and $Qd_2$ as well as the transfer MISFETs $Qt_1$ and $Qt_2$ are formed over the main surface of the active region in the p⁻-type well $2p$ surrounded by the field insulating film 3. On top of the driver MISFETs $Qd_1$ and $Qd_2$ and the transfer MISFETs $Qt_1$ and $Qt_2$ are reference voltage lines (source lines $V_{SS}$) 16A. The reference voltage lines 16A are connected to the semiconductor regions (source regions) 7 of the driver MISFETs $Qd_1$ and $Qd_2$ through contact holes 17A made on an insulating film that is on the same layer as the gate insulating film 5 for the driver MISFETs $Qd_1$ and $Qd_2$.

Figure 8:
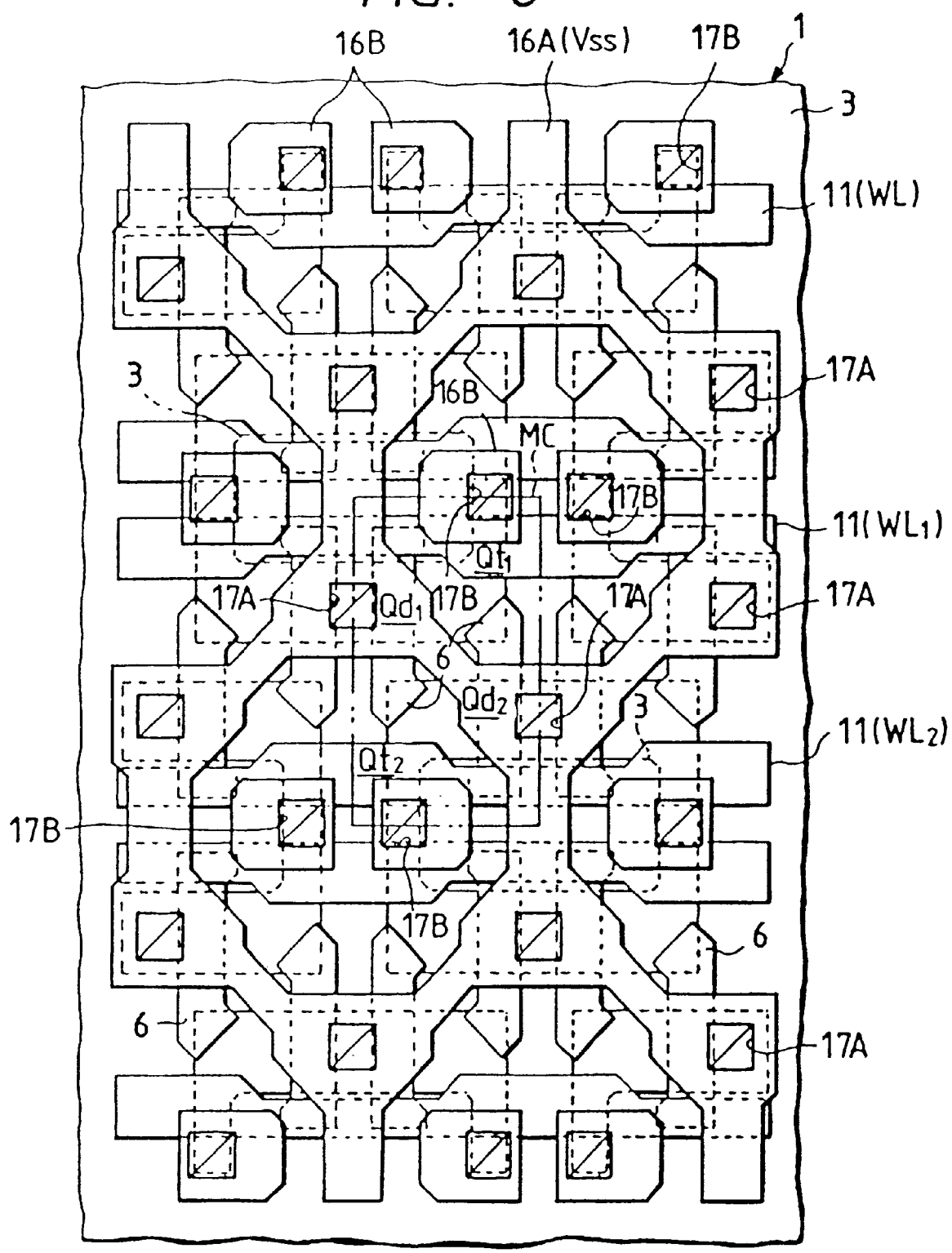
FIG. 8 is a partial plan view of another sub-array pattern layout of the first embodiment.

As depicted in FIG. 8, in a sub-array SMA, the reference voltage lines ($V_{SS}$) 16A are formed integrally with the region over the contact holes 17A made on the semiconductor regions (source regions) 7 of the driver MISFETs $Qd_1$ and $Qd_2$ for each memory cell MC; the reference voltage lines 16A are also formed integrally with the region interconnecting the contact holes 17A. That is, the reference voltage lines ($V_{SS}$) 16A are provided as source lines common to the driver MISFETs $Qd_1$ and $Qd_2$ for each memory cell MC. The reference voltage lines ($V_{SS}$) are formed continuously in the row and column directions to constitute a mesh-like structure. This structure reduces the resistance value of the reference voltage lines ($V_{SS}$) 16A.

The reference voltage lines 16A ($V_{SS}$) are formed during the process of manufacturing the third layer gate material. As with the gate electrodes 11 of the transfer MISFETs $Qt_1$ and $Qt_2$, the reference voltage lines 16A are made illustratively of a polycide film comprising a polycrystalline silicon film and a high-melting point metal silicide film. The polycrystalline silicon film, formed under the silicide film, is given n-type impurities (phosphorus P or arsenic As) to reduce its resistance value. The high-melting point metal silicide film formed above is made illustratively of $WSi_x$, $MoSi_x$, $TiSi_x$ or $TaSi_x$.

Because the reference voltage lines ($V_{SS}$) 16A and the word lines WL are each composed of the polycide film comprising the polycrystal line silicon film and high-melting point metal silicide film, the resistivities of these lines are reduced. This in turn makes operations faster for writing and reading information to and from the memory cells MC and thereby boosts the operating speed of the SRAM.

Figure 9:
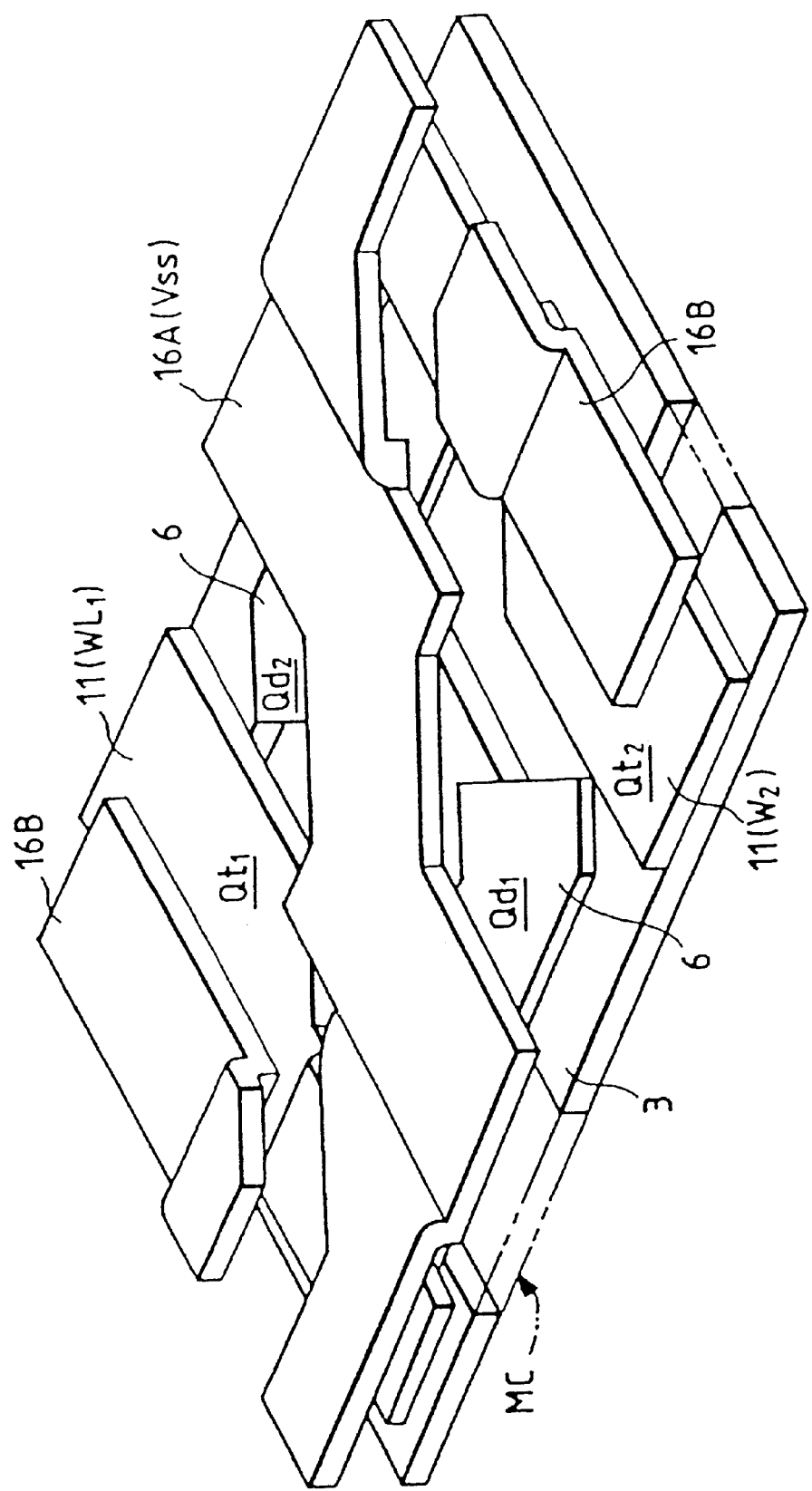
FIG. 9 is a schematic perspective view of a memory cell pattern layout of the first embodiment.

As shown in FIGS. 1 and 8, in the sub-array SMA, pad layers 16B are located in insular fashion over the contact holes 17B formed on one of the semiconductor regions 12 of the transfer MISFETs $Qt_1$ and $Qt_2$ of each memory cell MC. FIG. 9 depicts a layout of the gate electrodes 6 of the driver MISFETs $Qd_1$ and $Qd_2$, the gate electrodes 11 (first word line $WL_1$ and second word line $WL_2$) of the transfer MISFETs $Qt_1$ and $Qt_2$, the reference voltage lines ($V_{SS}$) 16A and the pad layers 16B in the area occupied by one memory cell MC. The layout shows how these parts are related to one another.

In the memory cell MC, the load MISFET $Qp_1$ is located over the driver MISFET $Qd_2$, and the load MISFET $Qp_2$ over the driver MISFET $Qd_1$. Each of the load MISFETs $Qp_1$ and $Qp_2$ is constituted by a p-type source region 18P, a drain region 18P, an n-type channel region 18N, a gate insulating film 19 and gate electrodes 20. FIG. 1 includes the source region 18P, drain region 18P, channel region 18N and gate insulating film 19 of the load MISFET $Qp_1$ as well as the gate electrodes 20 of the load MISFET $Qd_2$.

The channel region 18N of the load MISFET $Qp_1$ is formed over the driver MISFET $Qd_2$ with insulating films 21 and 22 interposed therebetween. The channel region 18N of the load MISFET $Qp_2$ is formed over the driver MISFET $Qd_1$ also with the insulating films 21 and 22 interposed therebetween. The insulating films 21 and 22 are made illustratively of a silicon oxide film each.

Figure 10:
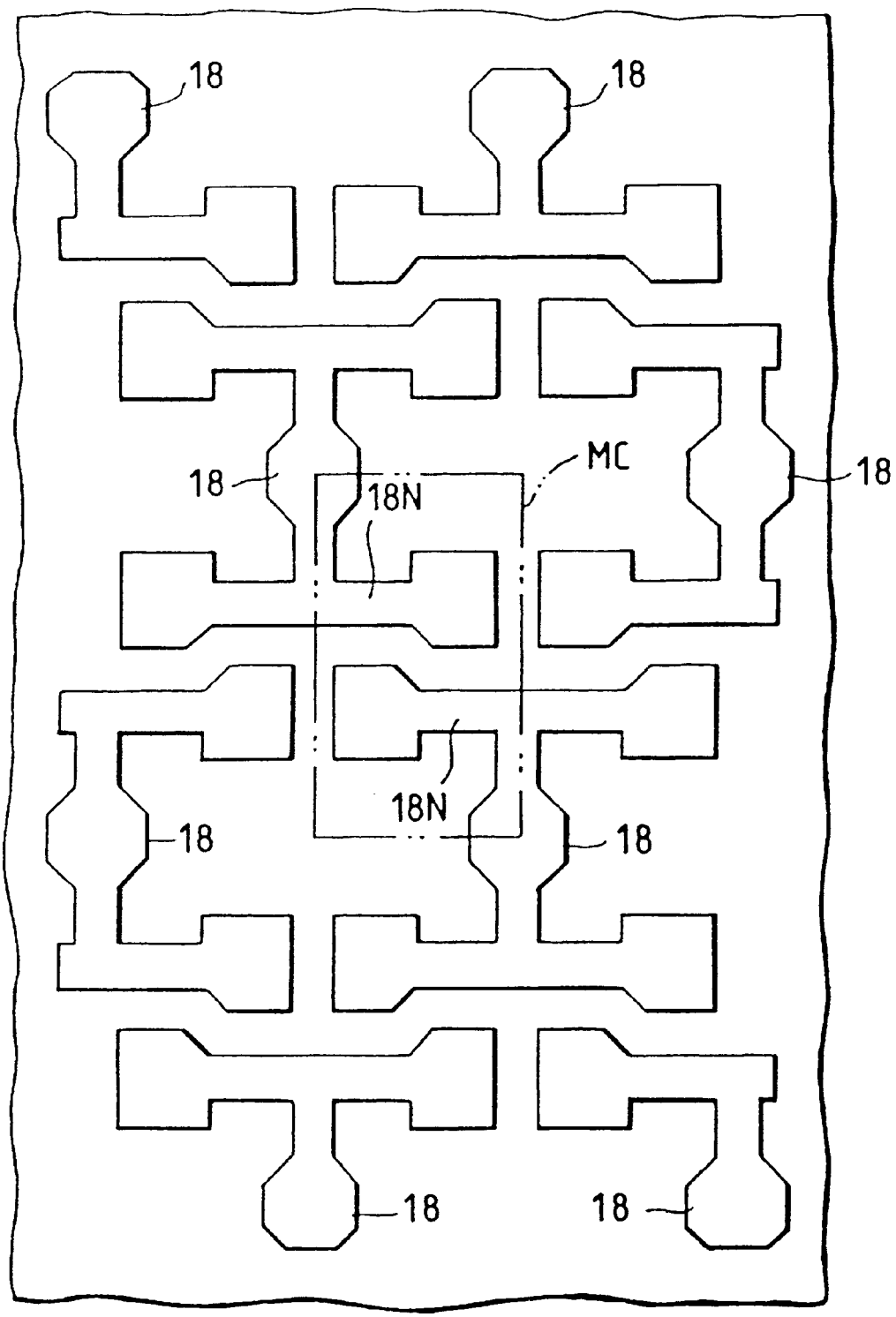
FIG. 10 is a partial plan view of another sub-array pattern layout of the first embodiment.

FIG. 10 shows a pattern layout of the channel regions 18N of the load MISFETs $Qp_1$ and $Qp_2$. For a better view, FIG. 10 omits the components located below the channel regions 18N such as the reference voltage lines ($V_{SS}$) 16A, driver MISFETs $Qd_1$ and $Qd_2$, transfer MISFETs $Qt_1$ and $Qt_2$, and the field insulating film 3. The channel regions 18N of the load MISFETs $Qp_1$ and $Qp_2$, formed during the process of manufacturing the fourth layer gate material, are composed of a polycrystal silicon film 18 each. Part (the source side) or all of the polycrystal silicon film 18 is given n-type impurities (e.g., phosphorus P). The addition of the impurities to the film 18 sets the threshold voltage of the load MISFETs $Qp_1$ and $Qp_2$ for the so-called enhancement type.

At one end of the channel regions 18N for the load MISFETs $Qp_1$ and $Qp_2$ is the drain region 18P; at the other end of the channel regions 18N is the source region 18P. As with the channel regions 18N, the drain and source regions 18P are produced during the process of manufacturing the fourth layer gate material (i.e., polycrystal silicon film 18). The drain and source regions 18P are formed integrally with the channel regions 18N. For the fourth layer gate material (polycrystal silicon film 18), p-type impurities (e.g., $BF_2$ or boron B) are added to the polycrystal silicon film 18 of the area comprising the drain and source regions 18P.

The gate insulating film 19 of the load MISFETs $Qp_1$ and $Qp_2$ is formed over the polycrystal silicon film constituting the channel regions 18N, drain regions 18P and source regions 18P of these MISFETs. The gate insulating film 19 is made illustratively of a silicon oxide film.

The gate electrodes 20 of the load MISFETs $Qp_1$ and $Qp_2$ are formed over the gate insulating film 19. The gate electrodes 20, formed during the process of manufacturing the fifth layer gate material, are composed illustratively of a polycrystal silicon film. The polycrystal silicon film is given n-type impurities (e.g., phosphorus P) to reduce its resistance value.

Figure 11:
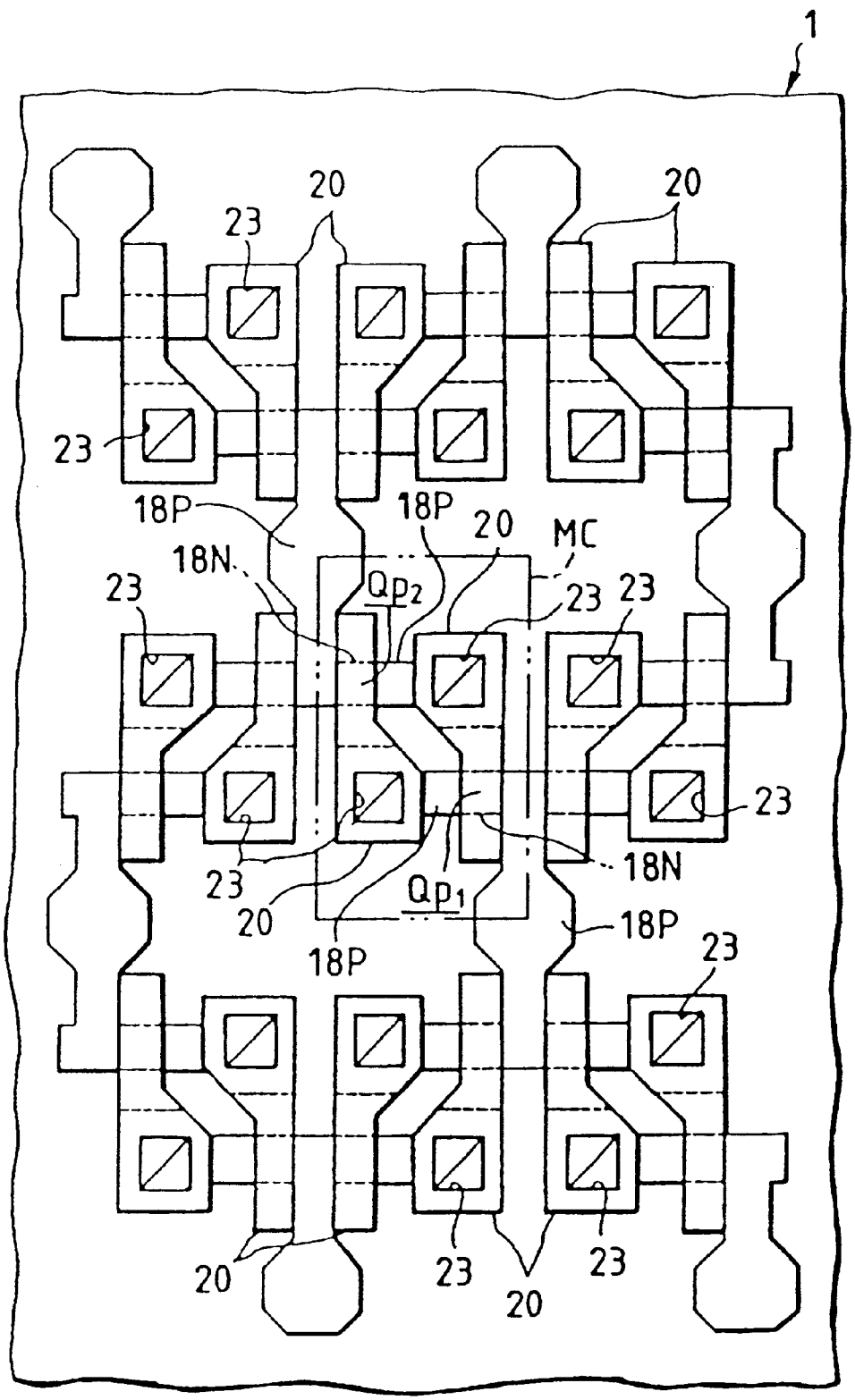
FIG. 11 is a partial plan view of another sub-array pattern layout of the first embodiment.

As shown in FIG. 11, the gate electrodes 20 of the load MISFETs $Qp_1$ and $Qp_2$ are extended in the row direction. The channel regions 18N of the load MISFETs $Qp_1$ and $Qp_2$ are formed in regions different from those of the gate electrodes 20. The drain and source regions 18P are formed elsewhere. For a better view, FIG. 11 omits the components located below the channel regions 18N such as the reference voltage lines ($V_{SS}$) 16A, driver MISFETs $Qd_1$ and $Qd_2$, transfer MISFETs $Qt_1$ and $Qt_2$, and field insulating film 3.

Figure 12:
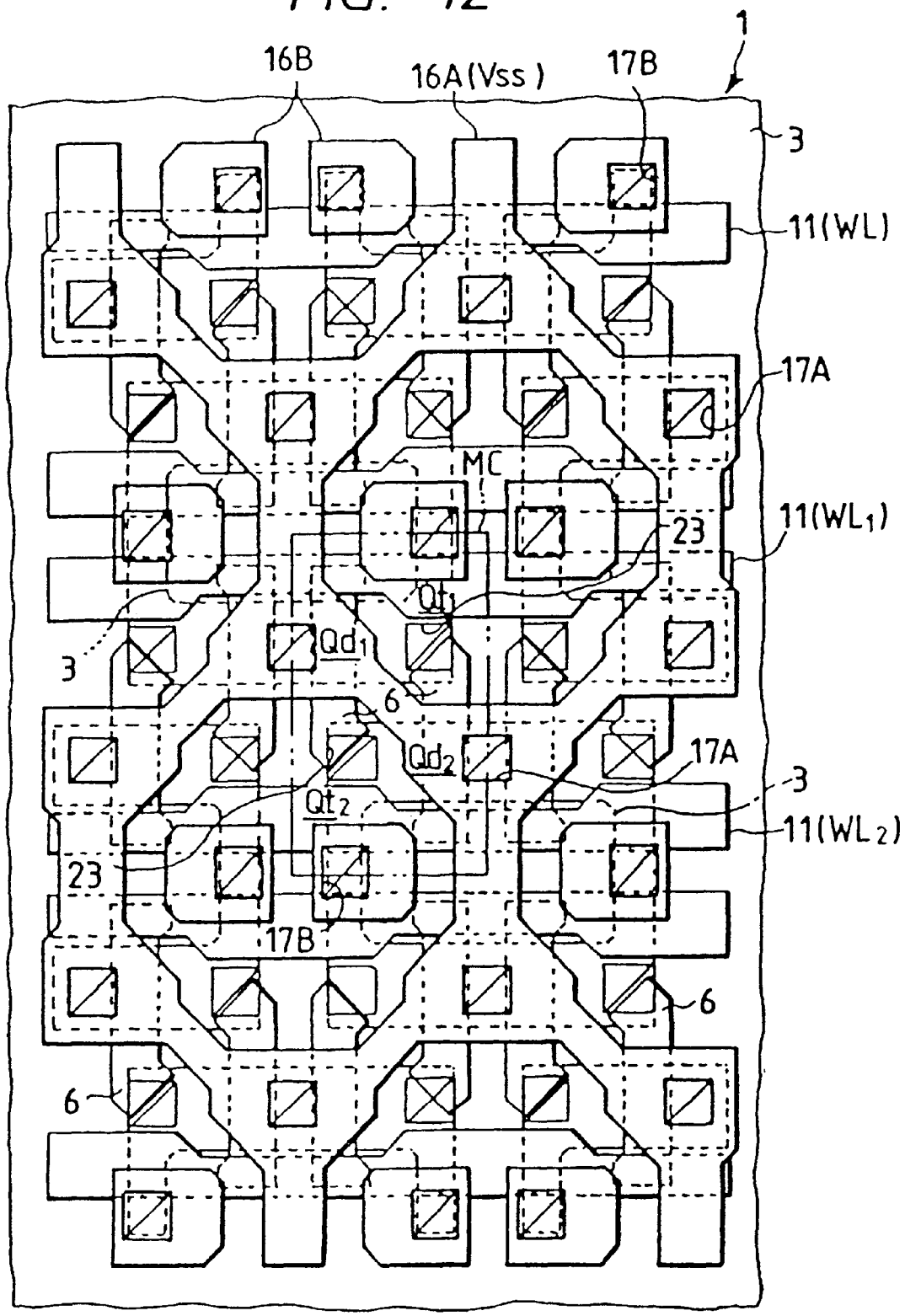
FIG. 12 is a partial plan view of another sub-array pattern layout of the first embodiment.

As illustrated in FIGS. 1, 11 and 12, the gate electrodes 20 of the load MISFET $Qp_2$ are connected to one of the semiconductor regions (drain region) 7 of the driver MISFET $Qd_1$ (one of the semiconductor regions 12 of the transfer MISFET $Qt_1$) via a contact hole 23 formed through the gate insulating film 19 and insulating films 22 and 9. The gate electrodes 20 of the load MISFET $Qp_1$ are connected to one of the semiconductor regions (drain region) 7 of the driver MISFET $Qd_2$ (one of the semiconductor regions 12 of the transfer MISFET $Qt_2$) via the contact hole 23.

As depicted in FIG. 1, cross sections of the drain regions 18P are exposed above the side wall of the contact hole 23 through which the gate electrodes 20 of the load MISFET $Qp_2$ are connected to one of the semiconductor regions (drain region) 7 of the driver MISFET $Qd_1$ (one of the semiconductor regions 12 of the transfer MISFET $Qt_1$). The exposed drain regions 18P and the gate electrodes 20 are electrically connected on the side wall surface of the contact hole 23. In addition, the main surface part at one end of the gate electrodes 6 for the driver MISFET $Qd_2$ is exposed above the side wall of the contact hole 23. The exposed gate electrodes 6 and the gate electrodes 20 of the load MISFET $Qp_2$ are electrically connected on the side wall surface of the contact hole 23.

In other words, each contact hole 23 interconnects the gate electrodes 20 of the load MISFET $Qp_2$, one of the semiconductor regions (drain region) 7 of the driver MISFET $Qd_1$ (one of the semiconductor regions 12 of the transfer MISFET $Qt_1$), the drain region 18P of the load MISFET $Qp_1$, and the gate electrodes 6 of the driver MISFET $Qd_2$.

Likewise, though not shown in FIG. 1, cross sections of the drain region 18P of the load MISFET $Qp_2$ are exposed above the side wall of the contact hole 23 that connects the gate electrodes 20 of the load MISFET $Qp_1$ to one of the semiconductor regions (drain region) 7 of the driver MISFET $Qd_2$ (one of the semiconductor regions of the transfer MISFET $Qt_2$). The exposed drain region 18P and the gate electrodes 20 are electrically connected on the side wall surface of the contact hole 23. Furthermore, the main surface part at one end of the gate electrodes 6 for the driver MISFET $Qd_1$ is exposed above the side wall of the contact hole 23. The exposed gate electrodes 6 and the gate electrodes 20 of the load MISFET $Qp_1$ are electrically connected on the side wall surface of the contact hole 23.

That is, each contact hole 23 interconnects the gate electrodes 20 of the load MISFET $Qp_1$, one of the semiconductor regions (drain region) 7 of the driver MISFET $Qd_2$ (one of the semiconductor regions 12 of the transfer MISFET $Qt_2$), the drain region 18P of the load MISFET $Qp_2$, and the gate electrodes 6 of the driver MISFET $Qd_1$.

As described, each contact hole 23 interconnects one of the semiconductor regions (drain region) 7 of the driver MISFET Qd (one of the semiconductor regions 12 of the transfer MISFET Qt), those gate electrodes 6 of the driver MISFET Qd which are composed of the first layer gate material, that drain region 18P of the load MISFET Qp which is made of the fourth layer gate material, and those gate electrodes 6 of the driver MISFET Qd which are formed by the fifth layer gate material. Compared with prior art setups where the conductive strips are connected via a plurality of contact holes, this single contact hole structure reduces the memory cell area by the amount equivalent to the multiple contact holes eliminated. This in turn translates into a higher degree of SRAM integration.

Figure 13:
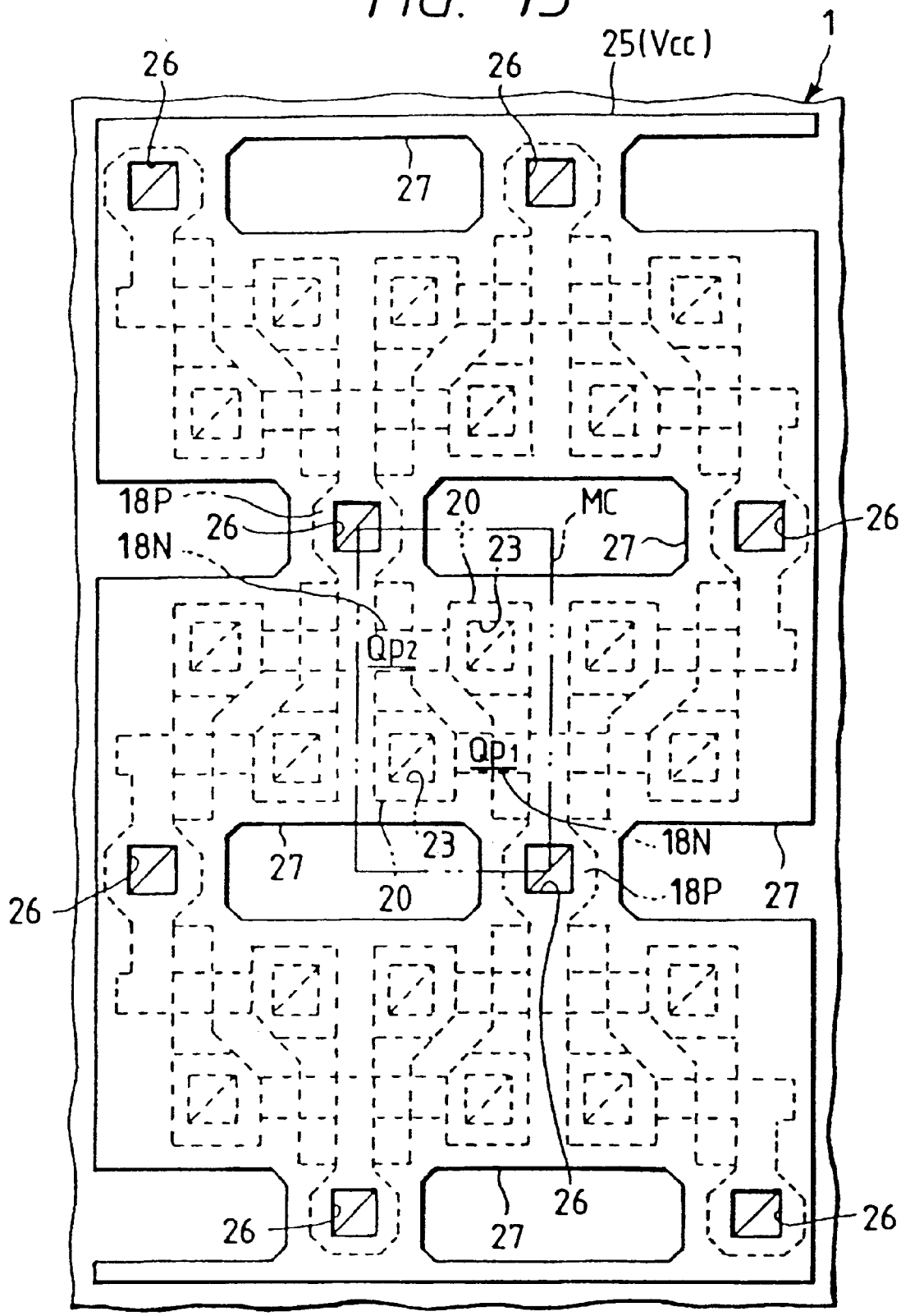
FIG. 13 is a partial plan view of another sub-array pattern layout of the first embodiment.

As shown in FIGS. 1 and 13, supply voltage lines ($V_{CC}$) 25A are formed over the gate electrodes 20 of the load MISFETs $Qp_1$ and $Qp_2$ with an insulating film 24 interposed therebetween. The supply voltage lines ($V_{CC}$) 25A are connected to the source regions 18P of the load MISFETs $Qp_1$ and $Qp_2$ via contact holes 26A made through the insulating film 24. For a better view, FIG. 13 omits the components located below the channel regions 18N of the load MISFETs $Qp_1$ and $Qp_2$ such as the reference voltage lines ($V_{SS}$) 16A, driver MISFETs $Qd_1$ and $Qd_2$, transfer MISFETs $Qt_1$ and $Qt_2$, and field insulating film 3.

As shown in FIG. 13, in the sub-array SMA, the supply voltage lines ($V_{CC}$) 25A are formed integrally with and on top of the gate electrodes 20 of the load MISFETs $Qp_1$ and $Qp_2$ of each memory cell MC. As such, the supply voltage lines ($V_{CC}$) 25A are common to the load MISFETs $Qp_1$ and $Qp_2$. Holes 27 are formed on part of the supply voltage lines ($V_{CC}$) 25A. The holes 27 are located primarily in regions where the load MISFETs $Qp_1$ and $Qp_2$ of the memory cells MC are not formed. That is, the supply voltage lines ($V_{CC}$) 25A are furnished continuously in the row and column directions so as to cover the memory cells MC.

The supply voltage lines ($V_{CC}$) 25A, formed during the process of manufacturing the sixth layer gate material, are made illustratively of a polycrystal silicon film. Because the supply voltage lines ($V_{CC}$) 25A are to be connected to the source regions 18P of the load MISFETs $Qp_1$ and $Qp_2$, the lines are composed of the polycrystal silicon film to which impurities (e.g., $BF_2$) of the same conductive type as that of the source regions 18P (i.e., p-type) are added.

As depicted in FIG. 4, each memory cell MC has two capacitor elements C. With the SRAM according to this invention, the capacitor elements C are formed between the gate electrodes 20 of the load MISFETs $Qp_1$ and $Qp_2$ on the one hand, and the supply voltage lines ($V_{CC}$) 25A on the other. That is, the capacitor elements C constitute a stacked structure. In this structure, the gate electrodes 20 of the load MISFETs $Qp_1$ and $Qp_2$ serve as first electrodes, the supply voltage lines ($V_{CC}$) 25A above the gate electrodes 20 act as second electrodes (plate electrodes), and the insulating film 24 between the gate electrodes 20 and the supply voltage lines ($V_{CC}$) 25A works as a dielectric film. The insulating film 24 illustratively has a layered structure comprising a silicon oxide film and a silicon nitride film.

As described, the capacitor elements C are formed between the gate electrodes 20 of the load MISFETs $Qp_1$ and $Qp_2$ on the one hand, and the large-area supply voltage lines ($V_{CC}$) 25A covering the gate electrodes 20 on the other. These capacitor elements C provide large capacitance that improves the resistance of the memory cells MC to α-ray soft errors.

The supply voltage lines ($V_{CC}$) 25A are furnished continuously in the row and column directions, and the holes 27 are formed on part of the lines 25A so as to lower the resistivity thereof. This arrangement prevents drops in the supply voltage fed to the memory cells MC via the supply voltage lines ($V_{CC}$) 25A, whereby the SRAM operation is stabilized.

Figure 14:
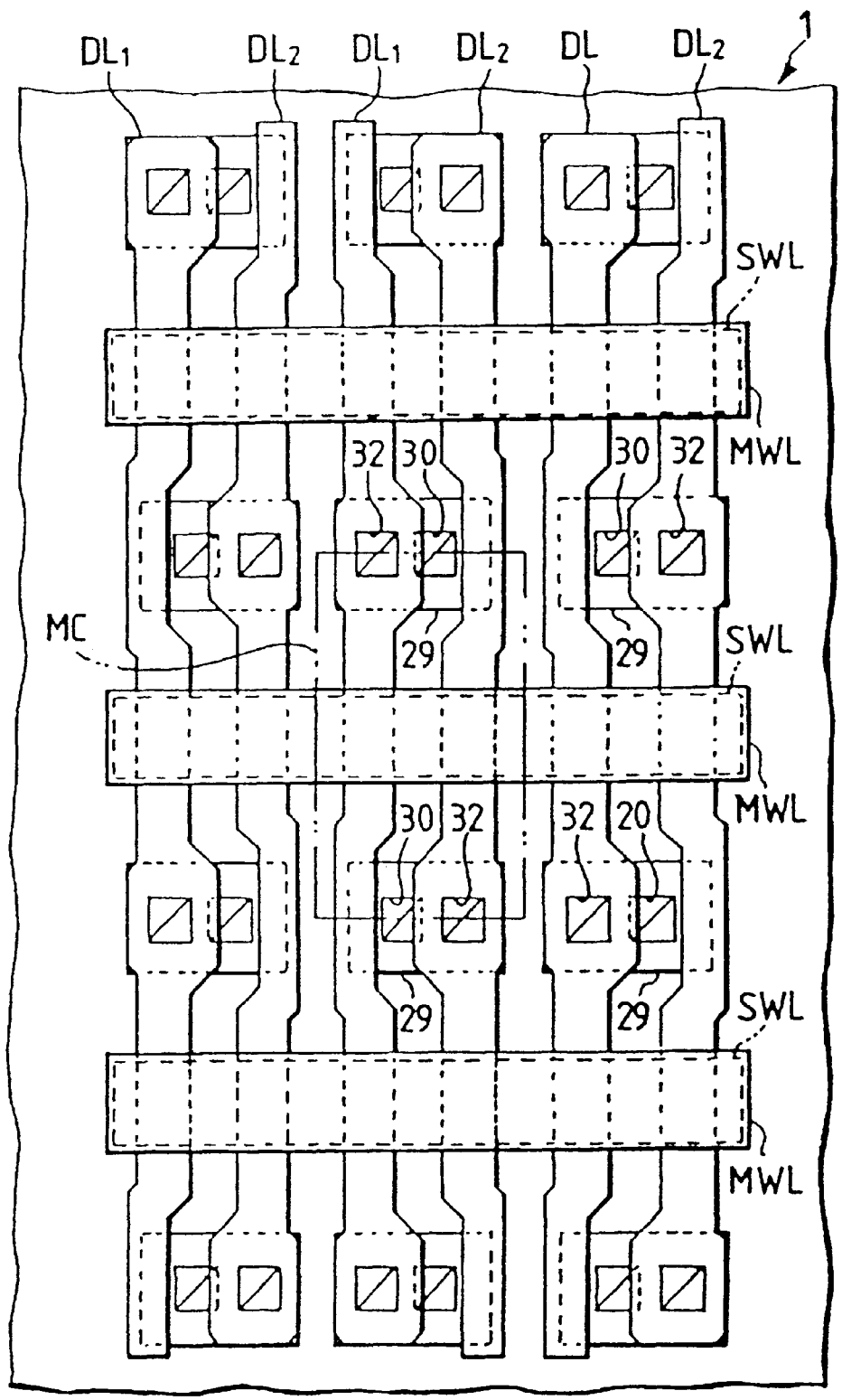
FIG. 14 is a partial plan view of another sub-array pattern layout of the first embodiment.

As shown in FIG. 1, over the supply voltage lines ($V_{CC}$) 25A are sub-word lines SWL with an interlayer isolation film 28 interposed therebetween. As depicted in FIG. 14, the sub-word lines SWL are extended over the sub-array SMA in the column direction. One sub-word line SWL is provided to each of the memory cells MC arranged in the row direction. For a better view, FIG. 14 omits the components located below the sub-word lines SWL such as the load MISFETs $Qp_1$ and $Qp_2$, reference voltage lines ($V_{SS}$) 16A, driver MISFETs $Qd_1$ and $Qd_2$, transfer MISFETs $Qt_1$ and $Qt_2$, and field insulating film 3.

The sub-word lines SWL, formed during the process of manufacturing the first layer wiring material, are made of a layered structure illustratively comprising a barrier metal film and a high melting-point metal film. The barrier metal film and the high melting-point metal film are composed illustratively of titanium tungsten (TiW) and tungsten (W), respectively. The interlayer isolation film 28 is made of a layered structure illustratively comprising a silicon oxide film and a BPSG (boron-doped phospho-silicate glass) film.

As shown in FIG. 1, an intermediate conductive strip 29A made of the same first layer wiring material as that of the sub-word lines SWL, is formed over one of the semiconductor regions (drain region) 12 of the transfer MISFETs $Qt_1$ and $Qt_2$. The intermediate conductive strip 29A is connected to the pad layer 16B via a contact hole 30A formed through the interlayer isolation layer 28 and insulating films 24, 22 and 21. The pad layer 16B is formed over one of the semiconductor regions (drain region) of the transfer MIS- FETs $Qt_1$ and $Qt_2$. As depicted in FIG. 14, in the sub-array SMA, the intermediate conductive strip 29A is furnished in insular fashion over the contact hole 17B made on one of the semiconductor regions (drain region) 12 of the transfer MISFETs $Qt_1$ and $Qt_2$ for each memory cell MC.

As shown in FIG. 1, complementary data lines DL are formed over the sub-word lines SWL and intermediate conductive strips 29A, with a second layer interlayer isolation film 31 interposed therebetween. The complementary data lines DL are connected to the intermediate conductive strip 29A via the contact hole 32A made on the interlayer isolation film 31.

The complementary data lines DL, formed during the process of manufacturing the second layer wiring material, are made of a three-film layered structure illustratively comprising a barrier metal film, an aluminum alloy film and another barrier metal film. The barrier metal film is made illustratively of TiW; the aluminum alloy film is illustratively an aluminum body mixed with Cu and Si. The interlayer isolation film 31 is composed of a three-film layered structure illustratively comprising a silicon oxide film, a spin-on glass (SOG) film and another silicon oxide film.

The complementary data lines DL are connected to one of the semiconductor regions (drain region) of the transfer MISFETs $Qt_1$ and $Qt_2$ for the memory cell MC. Of the complementary data lines DL, the first data line $DL_1$ is connected to one of the semiconductor regions (drain region) 12 of the transfer MISFET $Qt_1$; the second data line $DL_2$ is connected to one of the semiconductor regions (drain region) 12 of the transfer MISFET $Qt_2$. It is through the intermediate conductive strip 29A and the pad layer 16B that the complementary data lines DL are connected to one of the semiconductor regions (drain region) 12 of the transfer MISFETs $Qt_1$ and $Qt_2$.

As depicted in FIG. 14, the complementary data lines DL are extended in the row direction over the sub-array SMA. Of the complementary data lines DL, the first data line $DL_1$ is extended in the row direction over the driver MISFET $Qd_1$, transfer MISFET $Qt_2$ and load MISFET $Qp_2$ of the memory cell MC; the second complementary data line $DL_2$ is extended in the row direction over the driver MISFET $Qd_2$, transfer MISFET $Qt_1$ and load MISFET $Qp_1$.

As shown in FIG. 1, main word lines MWL are formed over the complementary data lines DL, with a third layer interlayer isolation film 33 interposed therebetween. The main word lines MWL are formed during the process of manufacturing the third layer wiring material. As with the second layer wiring material, the main word lines MWL are made of a three-film layered structure illustratively comprising a barrier metal film, an aluminum alloy film and another barrier metal film. The interlayer isolation film 33 is composed of a four-film layered structure illustratively comprising a silicon oxide film, another silicon oxide film, a spin-on glass film and yet another silicon oxide film.

As shown in FIG. 14, the main word lines MWL are extended in the column direction over the sub-arrays SMA. The main word lines MWL are arranged so as to overlap with the sub-word lines SWL extended in the column direction over the sub-arrays SMA.

As depicted in FIG. 1, a final passivation film 34 is formed over the main word lines MWL. The final passivation film 34 is constituted by a four-film layered structure illustratively comprising a silicon oxide film, another silicon oxide film, a silicon nitride film and a polyimide resin film.

The method for manufacturing the above-described SRAM according to the invention will now be described with reference to FIGS. 15 through 43. Initially, there is prepared a semiconductor substrate 1 composed of an $n^-$-type silicon single crystal having a resistivity of about 10 Ω/cm. The main surface of the semiconductor substrate 1 is covered with a silicon oxide film 40. A silicon nitride film 41 is then deposited on the silicon oxide film 40. The silicon oxide film 40 is formed by thermal oxidation to a thickness of 35 to 45 nm. The silicon nitride film 41 is formed by the CVD (chemical vapor deposition) method to a thickness of about 45 to 55 nm.

Next, a photo resist film 42 is formed over the silicon nitride film 41. With the film 42 used as a mask, the silicon nitride film 41 is etched for removal from n-type well forming regions. With the photo resist film 42 again used as a mask, n-type impurities (e.g., phosphorus P) are added to the main surface of the n-type well forming regions on the semiconductor substrate 1. Using ion implantation, the phosphorus impurities are added for a density of about $2.0 \times 10^{13}/cm^2$ at an energy level of 120 to 130 keV (FIG. 15).

With the photo resist film 42 removed by ashing, the silicon oxide film 40 is allowed to grow on the main surface of the n-type well forming regions over the semiconductor substrate 1. The growth of the silicon oxide film 40 is accomplished by thermal oxidation, with the silicon nitride film 41 in the $p^-$-type well forming regions used as an oxidation resisting mask. After its growth, the silicon oxide film 40 reaches a thickness of 130 to 140 nm.

The silicon nitride film 41 is removed by etching with the help of heated phosphoric acid. Thereafter, with the silicon oxide film 40 in the n-type well forming regions used as a mask, p-type impurities (i.e., $BF_2$) are added to the main surface of the $p^-$-type well forming regions over the semiconductor substrate 1. Using ion implantation, the $BF_2$ impurities are added for a density of about $1.0 \times 10^{13}/cm^2$ at an energy level of 60 kev (FIG. 16).

Figure 17:
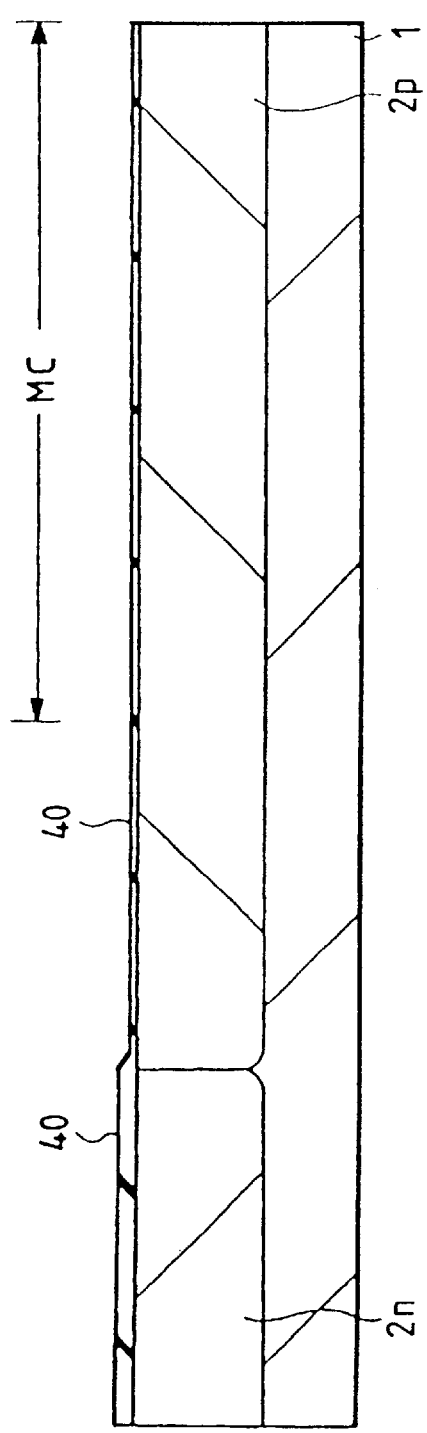
FIG. 17 is another partial sectional view of the semiconductor substrate of the first embodiment, illustrating how the embodiment is manufactured.

The n- and p-type impurities added to the main surface of the semiconductor substrate 1 are diffused therein so that the impurities of the n- and p-types form n-type wells $2n$ and $p^-$-type wells $2p$, respectively. The impurities are allowed to diffuse for about 180 minutes in a nitrogen atmosphere at about 1,200° C. (FIG. 17).

The memory cells MC of the SRAM are formed over part of the main surface of the $p^-$-type wells $2p$ (denoted by MC in FIG. 17) on the semiconductor substrate 1. Of the CMOSs constituting the peripheral circuits, the n-channel type MISFETs are formed in other regions on the main surface of the $p^-$-type wells $2p$; the p-channel type MISFETs are formed on the main surface of the n-type wells $2n$.

Figure 18:
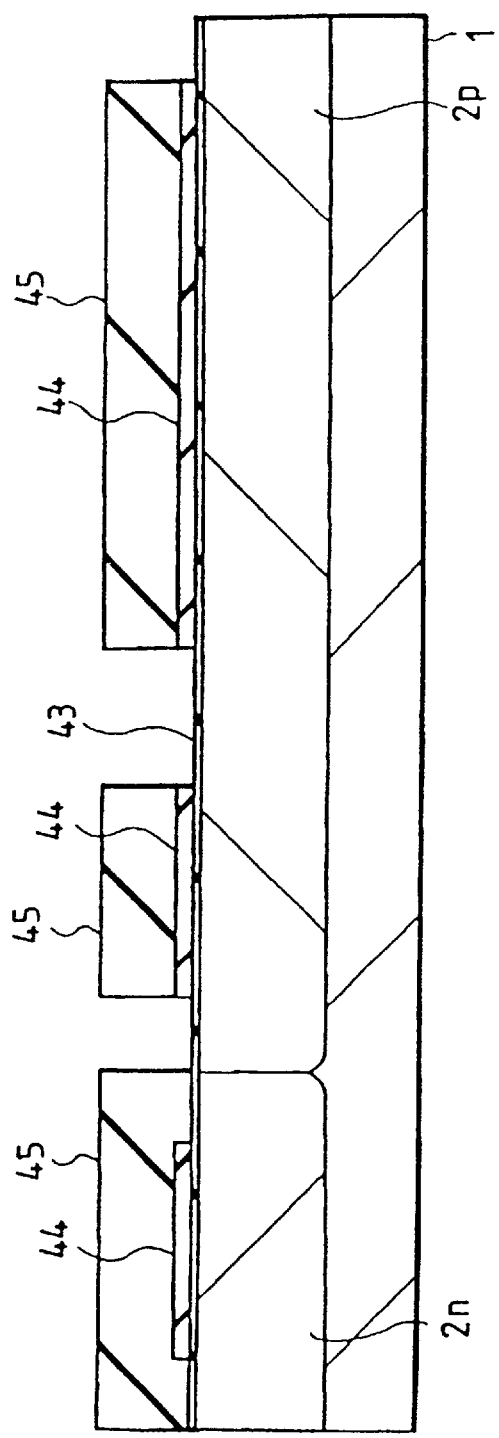
FIG. 18 is another partial sectional view of the semiconductor substrate of the first embodiment, illustrating how the embodiment is manufactured.

The silicon oxide film 40 is then removed from the main surface of the semiconductor substrate 1 by use of etching involving a thin hydrofluoric acid water solution. Thereafter, a new silicon oxide film 43 is formed over the main surface of the semiconductor substrate 1. A silicon nitride film 44 is deposited on the silicon oxide film 43. The silicon oxide film 43 is formed by thermal oxidation to a thickness of about 10 nm. The silicon nitride film 44 is formed by the CVD method to a thickness of 110 to 150 nm. A photo resist film 45 is then formed over the silicon nitride film 44. With the photo resist film 45 used as a mask, the silicon nitride film 44 is removed by etching from element-separating regions of the $p^-$-type wells $2p$ (FIG. 18).

With the photo resist film 45 removed by ashing, a new photo resist film, not shown, is formed over the main surface of the semiconductor substrate 1. A dose of p-type impurities (e.g., $BF_2$) for channel stopper purposes is added to the main surface of the $p^-$-type wells $2p$. Using ion implantation, the BF2 impurities are added for a density of about $7.0 \times 10^{13}/\text{cm}^2$ at an energy level of about 50 keV. Because the new photo resist film and the silicon nitride film 44 act as masks for ion implantation, the $BF_2$ impurities are added only to the element-separating regions of the p⁻-type wells 2p.

With the photo resist film removed by ashing, the silicon oxide film 43 in the element-separating regions is allowed to grow into the field insulating film 3. Specifically, the silicon oxide film 43 is formed to a thickness of 400 to 500 nm through thermal oxidation, with the silicon nitride film 44 used as an oxidation-resisting mask. Channel stopper regions 4 are formed simultaneously under the field insulating film 3 of the p⁻-type wells 2p. The n-type wells 2n are less vulnerable to the generation of inverted regions than the p⁻-type wells 2p and thus provide better element separation. For this reason, there is no need to form channel stopper regions under the field insulating film 3 of the n-type wells 2n. With the above process completed, the silicon nitride film 44 is removed using heated phosphoric acid from the main surface of the semiconductor substrate 1 (FIG. 19).

Figure 19:
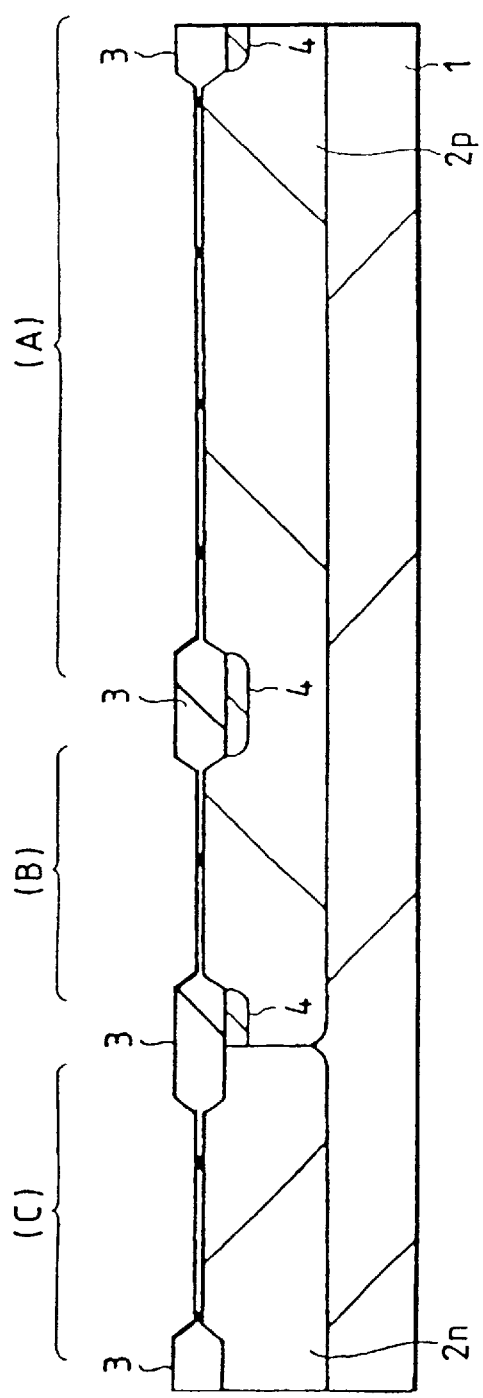
FIG. 19 is another partial sectional view of the semiconductor substrate of the first embodiment, illustrating how the embodiment is manufactured.

In FIG. 19, reference character (A) represents memory cell forming regions, and reference characters (B) and (C) denote peripheral circuit forming regions. Of the peripheral circuit forming regions, the region indicated by (B) is a region in which the n-channel type MISFETs of the peripheral circuits are to be formed; the region denoted by (C) is a region in which the p-channel type MISFETs of the peripheral circuits are to be formed.

Next, a silicon oxide film, not shown, is formed over the main surfaces of the active regions of the p⁻-type wells 2p and n-type wells 2n. The silicon oxide film is formed by thermal oxidation to a thickness of 12 to 14 nm. Thereafter, the main surfaces of the active regions for the p⁻-type wells 2p and n-type wells 2n are fed with impurities (e.g., $BF_2$) that are intended to adjust the threshold voltage of the driver MISFETs $Qd_1$ and $Qd_2$ of the memory cell MC. Using ion implantation, the $BF_2$ impurities are added for a density of about $3.4 \times 10^{13}/\text{cm}^2$ at an energy level of about 40 keV.

The silicon oxide film is then removed from the main surfaces of the active regions of the p⁻-type wells 2p and n-type wells 2n by use of etching involving a thin hydrofluoric acid water solution. The removal of the silicon oxide film is followed by formation of the gate insulating film 5 for the driver MISFETs $Qd_1$ and $Qd_2$ of the memory cell MC over the main surfaces of the active regions of the p⁻-type wells 2p and n-type wells 2n. The gate insulating film 5 is formed by thermal oxidation to a thickness of about 9 nm.

Figure 20:
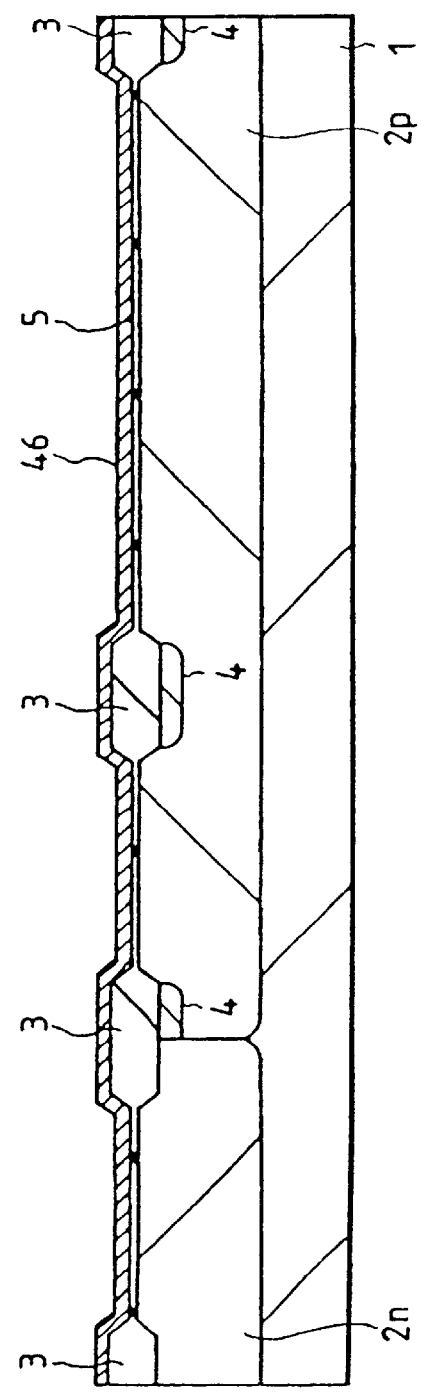
FIG. 20 is another partial sectional view of the semiconductor substrate of the first embodiment, illustrating how the embodiment is manufactured.

The entire surface of the semiconductor substrate 1 is then covered with a polycrystal silicon film 46, which constitutes the first layer gate material. The polycrystal silicon film 46 is used as the gate electrodes 6 for the driver MISFETs $Qd_1$ and $Qd_2$ of the memory cell MC. The polycrystal silicon film 46 is formed by the CVD method to a thickness of 35 to 45 nm. While being deposited, the polycrystal silicon film 46 is given n-type impurities (e.g., phosphorus (P)) to reduce its resistance value. The impurity density is about $1 \times 10^{20}/\text{cm}^2$ (FIG. 20).

Figure 21:
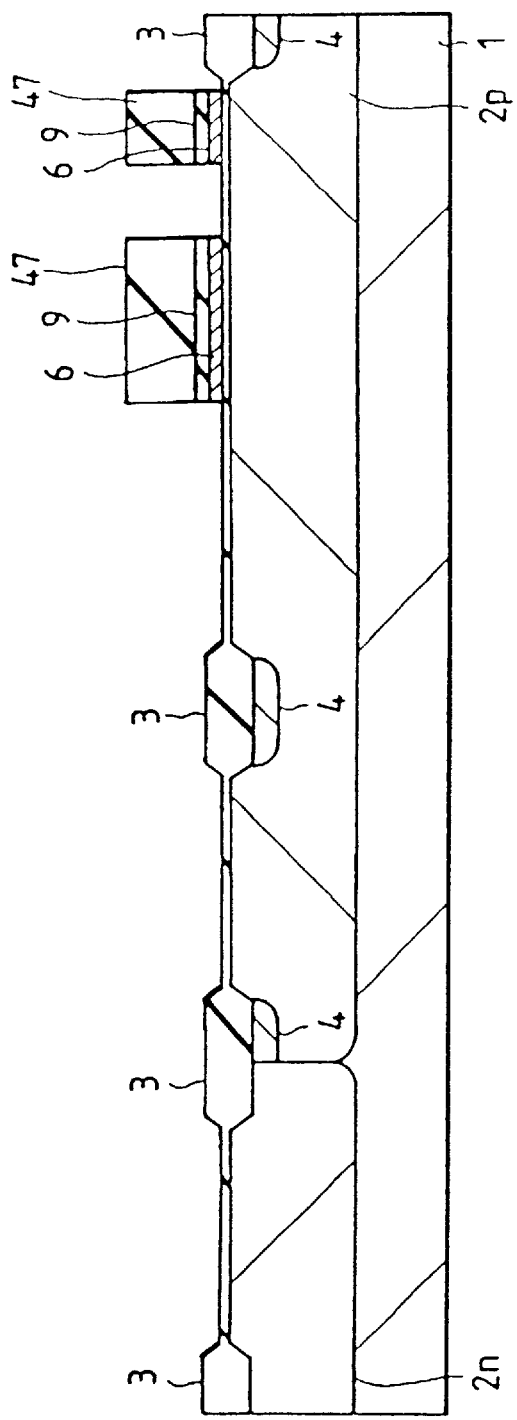
FIG. 21 is another partial sectional view of the semiconductor substrate of the first embodiment, illustrating how the embodiment is manufactured.

The insulating film 9 made of a silicon oxide film is then formed over the polycrystal silicon film 46. The silicon oxide film (i.e., insulating film 9) is formed by the CVD method to a thickness of 120 to 140 nm. The purpose in forming the insulating film 9 is to separate electrically the gate electrodes 6 of the driver MISFETs $Qd_1$ and $Qd_2$ of the memory cell MC from the conductive strips to be formed above the gate electrodes 6. Then the photo resist film 47 formed over the insulating film 9 is used as a mask in etching the insulating film 9 and then the polycrystal silicon film 46 thereunder. This process forms the gate electrodes 6 for the driver MISFETs $Qd_1$ and $Qd_2$ of the memory cell MC (FIG. 21).

Figure 22:
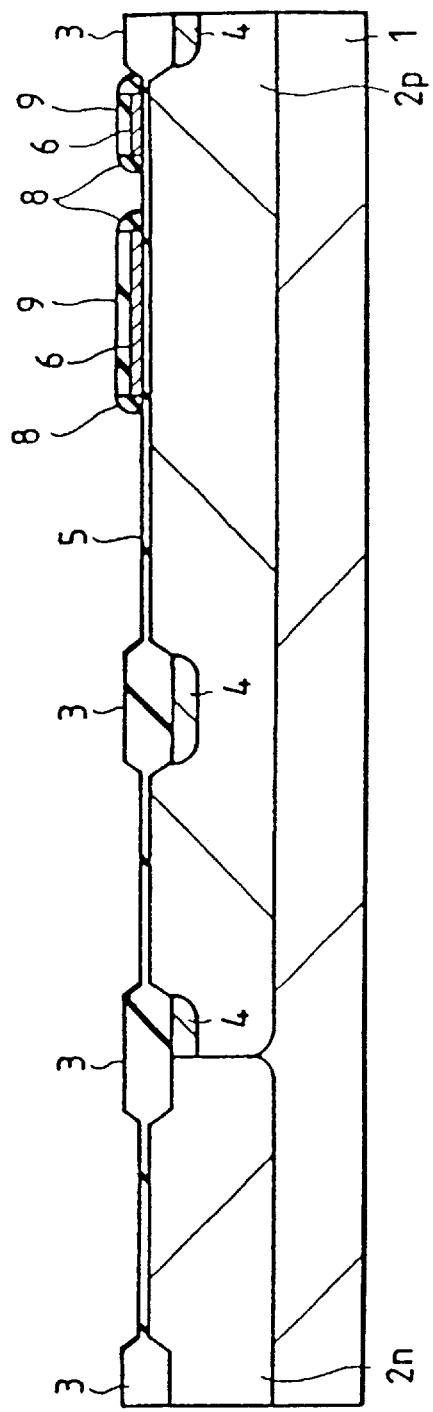
FIG. 22 is another partial sectional view of the semiconductor substrate of the first embodiment, illustrating how the embodiment is manufactured.

With the photo resist film 47 removed by ashing, the entire surface of the semiconductor substrate 1 is covered with a silicon oxide film, not shown. The silicon oxide film is formed by the CVD method to a thickness of 120 to 140 nm. The silicon oxide film is then etched by the anisotropic etching method such as RIE (reactive ion etching). The process forms side wall spacers 8 over the side walls of the gate electrodes 6 for the driver MISFETs $Qd_1$ and $Qd_2$ (FIG. 22).

The formation of the side wall spacers 8 is followed by removal of the gate insulating film 5 through etching involving a thin hydrofluoric acid water solution. Specifically, the gate insulating film 5 is removed from the main surfaces of the active regions for the p⁻-type wells 2p and n-type wells 2n except under the gate electrodes 6 of the driver MISFETs $Qd_1$ and $Qd_2$. After the removal, a new silicon oxide film, not shown, is formed over the main surfaces of the active regions for the p⁻-type wells 2p and n-type wells 2n. The silicon oxide film is formed by thermal oxidation to a thickness of about 10 nm.

The main surfaces of the active regions for the p⁻-type wells-2p and n-type wells 2n are then fed with impurities (e.g., $BF_2$) that are intended to adjust the threshold voltage of the transfer MISFETs $Qt_1$ and $Qt_2$ of the memory cell MC. Using ion implantation, the $BF_2$ impurities are added for a density of about $1.6 \times 10^{12}/\text{cm}^2$ at an energy level of about 40 keV.

Figure 23:
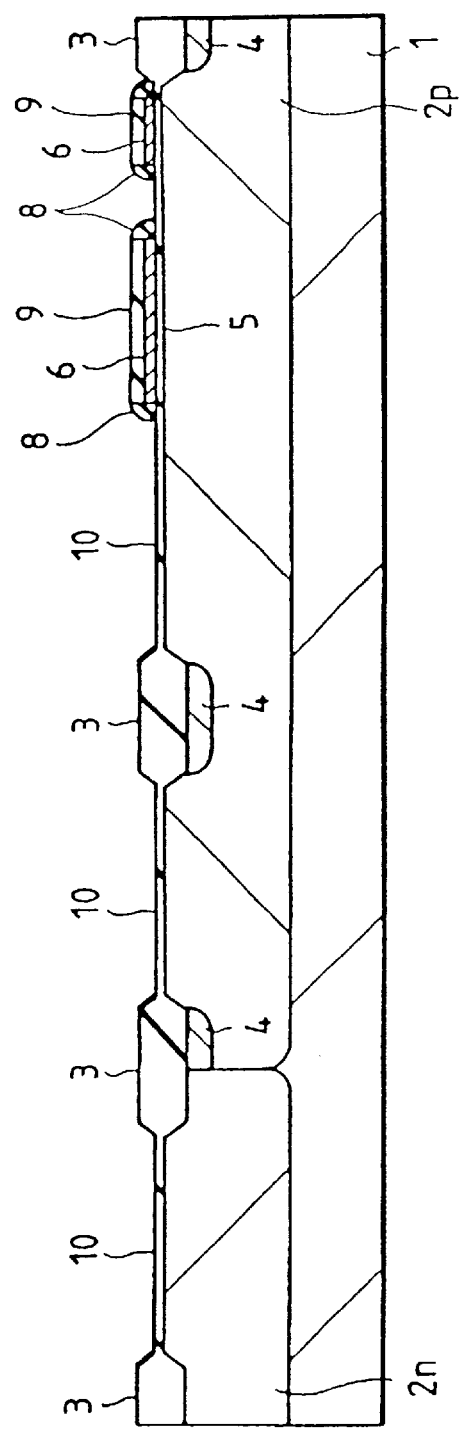
FIG. 23 is another partial sectional view of the semiconductor substrate of the first embodiment, illustrating how the embodiment is manufactured.

The addition of the $BF_2$ impurities is followed by removal of the silicon oxide film through etching involving a thin hydrofluoric acid water solution. Specifically, the silicon oxide film is removed from the main surfaces of the active regions for the p⁻-type wells 2p and n-type wells 2n. Thereafter, the gate insulating film 10 is formed over the main surfaces of the active regions for the p⁻-type wells 2p and n-type wells 2n. The gate insulating film 10 is furnished for use with each of the transfer MISFET $Qt_1$ and $Qt_2$ of the memory cell MC as well as for use with each of the n-channel and p-channel type MISFETs of the peripheral circuits. The gate insulating film 10 is formed by thermal oxidation to a thickness of about 9 nm (FIG. 23).

A second layer gate material, not shown, is then deposited all over the main surface of the semiconductor substrate 1. This gate material is provided as the gate electrodes 11 for use with each of the transfer MISFET $Qt_1$ and $Qt_2$ of the memory cell MC as well as for use with each of the n-channel and p-channel type MISFETs of the peripheral circuits. The gate material is made of a polycide film comprising a polycrystal silicon film and a tungsten silicide ($WSi_x$) film. The polycrystal silicon film is formed by the CVD method to a thickness of 35 to 45 nm under the tungsten silicide film. While being deposited, the polycrystal silicon film is given n-type impurities (e.g., phosphorus (P)) to reduce its resistance value. The density of the phosphorus impurities is about $2.5 \times 10^{20}/\text{cm}^2$. The tungsten silicide film is formed by the CVD method to a thickness of 55 to 65 nm over the polycrystal silicon film.

The insulating film 13 made of a silicon oxide film is then deposited on the second layer gate material (polycide film). The silicon oxide film (i.e., insulating film 13) is formed by the CVD method to a thickness of 160 to 200 nm. The insulating film 13 composed of the silicon oxide film is formed in order to separate electrically the gate electrodes 11 for the transfer MISFETs $Qt_1$ and $Qt_2$ of the memory cell MC and for the n- and p-channel type MISFETs of the peripheral circuits from the conductive strips to be formed over the electrodes 11.

Figure 24:
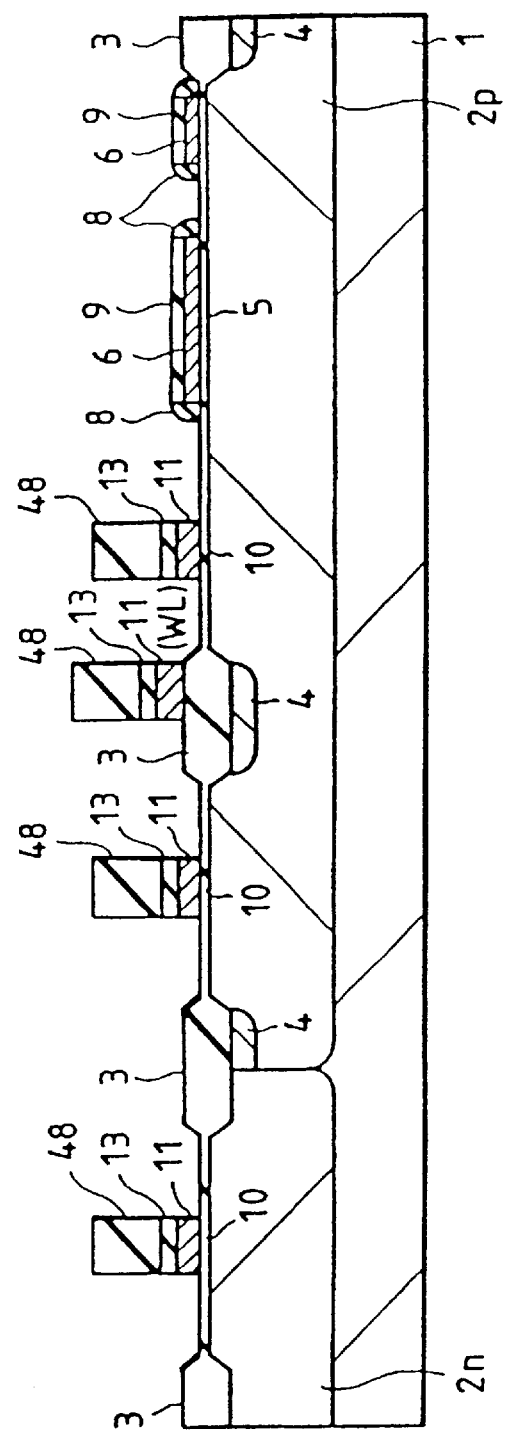
FIG. 24 is another partial sectional view of the semiconductor substrate of the first embodiment, illustrating how the embodiment is manufactured.

A photo resist film 48 is then formed over the insulating film 13. With the film 48 used as a mask, the insulating film 13 and the second layer gate material (i.e., polycide film) thereunder are etched successively. The process forms the gate electrodes 11 (and word lines WL) for the transfer MISFETs $Qt_1$ and $Qt_2$ of the memory cell MC and for the n- and p-channel type MISFETs of the peripheral circuits (FIG. 24).

With the photo resist film 48 removed by ashing, a new photo resist film, not shown, is formed over the main surface of the semiconductor substrate 1. The new photo resist film is used as a mask through which to add impurities to the main surface of the semiconductor substrate 1. More specifically, p-type impurities are first added to the regions where the transfer MISFETs $Qt_1$ and $Qt_2$ of the memory cell MC are to be formed, and n-type impurities are then added to the regions where the n-channel type MISFETs of the peripheral circuits are to be formed, over the main surface of the semiconductor substrate 1. The n-type impurities can also be added to the regions where the driver MISFETs $Qd_1$ and $Qd_2$ are to be formed, although not required to be added therein. The p-type impurities, illustratively composed of $BF_2$, are added through ion implantation for a density of about $1\times10^{13}/cm^2$ at an energy level of about 40 keV. The n-type impurities, illustratively composed of phosphorus P, are added through ion implantation for a density of about $3.5\times10^{13}/cm^2$ at an energy level of about 50 keV.

With the photoresist film removed by ashing, the n- and p-type impurities added to the main surface of the semiconductor substrate 1 are allowed to diffuse therein. The process forms n-type semiconductor regions 12a and p-type semiconductor regions 14 in the source- and drain-forming regions for the transfer MISFETs $Qt_1$ and $Qt_2$ of the memory cell MC as well as for the n-channel type MISFETs of the peripheral circuits, over the main surface of the semiconductor substrate 1. Where n-type impurities are added to regions where the driver MISFETs $Qd_1$ and $Qd_2$ are to be formed, regions 12a will also be formed in the source-drain forming regions for the driver MISFETs $Qd_1$ and $Qd_2$.

Figure 25:
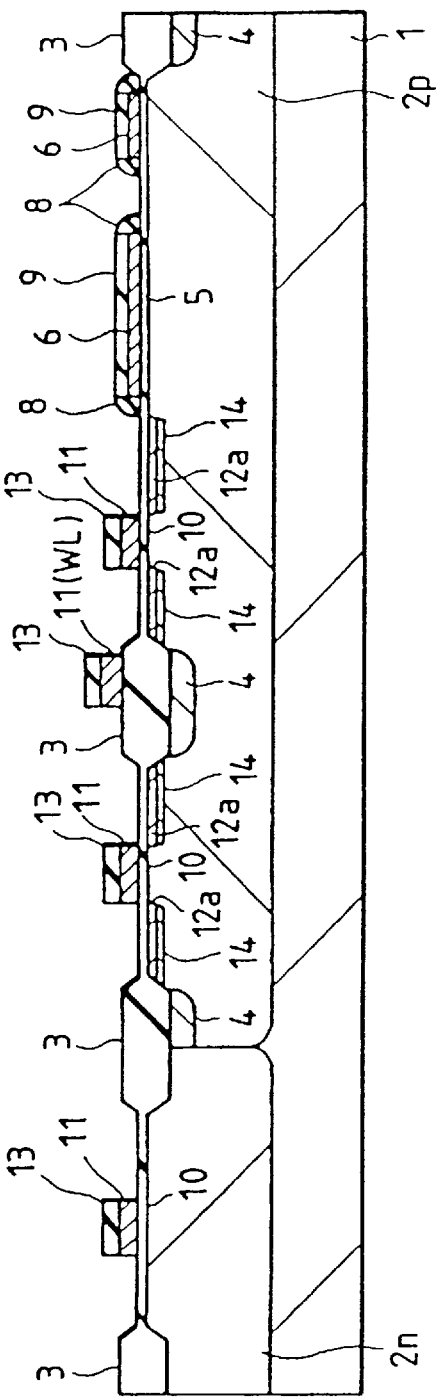
FIG. 25 is another partial sectional view of the semiconductor substrate of the first embodiment, illustrating how the embodiment is manufactured.

The n-type semiconductor regions 12a and p-type semiconductor regions 14 are formed in self-aligned fashion with respect to the gate electrodes 11. The p-type impurities diffuse at a higher speed than the n-type impurities and are implanted with higher energy than the latter. This causes the p-type semiconductor regions 14 to be located under the n-type semiconductor regions 12a when formed (FIG. 25).

A photo resist film, not shown, is then formed over the main surface of the semiconductor substrate 1. With this photo resist film used as a mask, n-type impurities are first added, followed by p-type impurities, to that main surface part of the semiconductor substrate 1 which covers the regions where the p-channel type MISFETs of the peripheral circuits are to be formed.

The n-type impurities, illustratively composed of phosphorus P, are added through ion implantation for a density of about $7\times10^{12}/cm^2$ at an energy level of about 100 keV. The p-type impurities, illustratively made of $BF_2$, are also added through ion implantation for a density of about $5\times10^{12}/cm^2$ at an energy level of about 40 keV.

Figure 26:
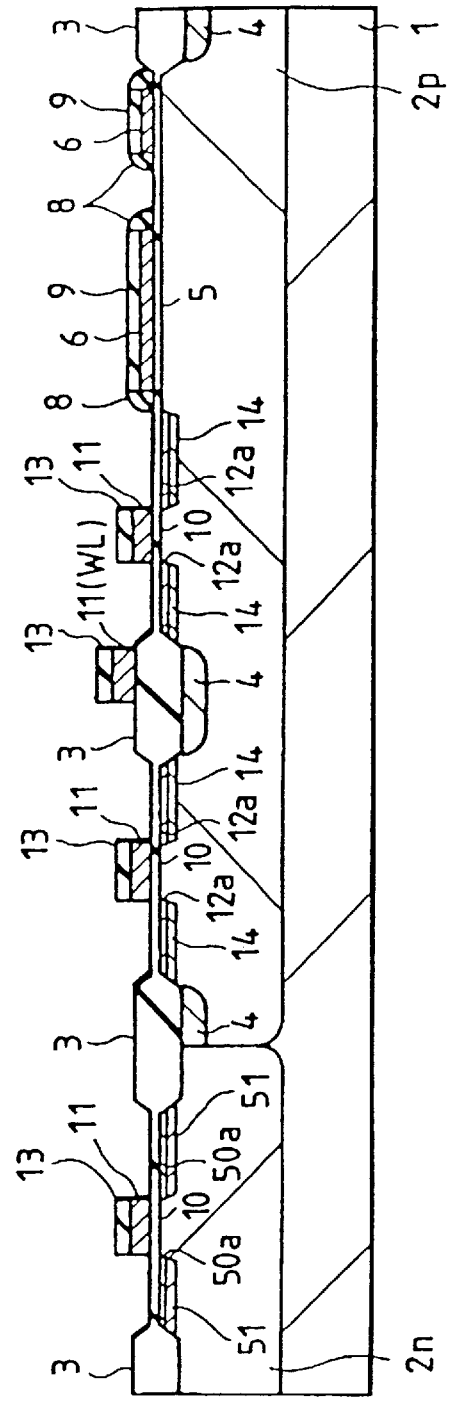
FIG. 26 is another partial sectional view of the semiconductor substrate of the first embodiment, illustrating how the embodiment is manufactured.

With the above photo resist film removed by ashing, the n- and p-type impurities added to the main surface of the semiconductor substrate 1 are allowed to diffuse therein. This process forms p-type semiconductor regions 50a and n-type semiconductor regions 51 in the source- and drain-forming regions for the p-channel type MISFETs of the peripheral circuits, over the main surface of the semiconductor substrate 1. The p-type semiconductor regions 50a and n-type semiconductor regions 51 are formed in self-aligned fashion relative to the gate electrodes 11. Because the n-type impurities are implanted with higher energy than the p-type impurities, the n-type semiconductor regions 51 are located under the p-type semiconductor regions 50a when formed (FIG. 26).

Figure 28:
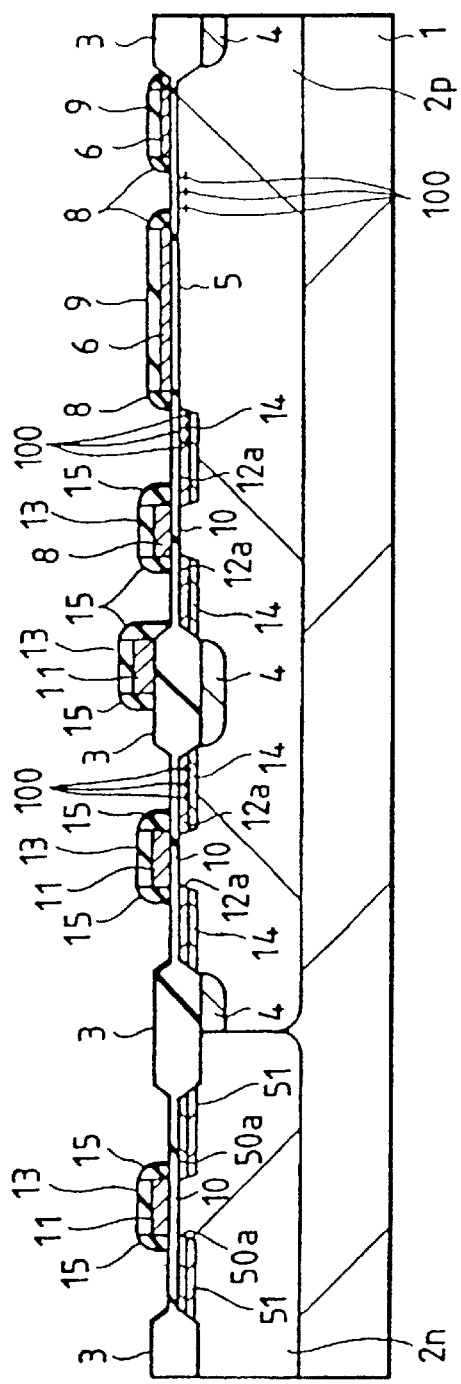
FIG. 28 is another partial sectional view of the semiconductor substrate of the first embodiment, illustrating how the embodiment is manufactured.

Then a photo resist film, not shown, is formed over the main surface of the semiconductor substrate 1. With this photo resist film used as a mask, n-type impurities 100 are added to the regions where the driver MISFETs $Qd_1$ and $Qd_2$ of the memory cell MC are to be formed, over the main surface of the semiconductor substrate 1 (FIG. 28). The n-type impurities 100, composed illustratively of phosphorus P, are added through ion implantation for a density of about $3\times10^{14}/cm^2$ at an energy level of about 50 keV.

At the same time, the n-type impurities are also added to the source-forming regions of some of the n-channel MISFETs constituting the peripheral circuits, over the main surface of the semiconductor substrate 1 (FIG. 28). The n-channel MISFETs to which the n-type impurities may be added are limited to the so-called asymmetrical n-channel type MISFETs wherein currents flow only in one direction of each pair of semiconductor regions. The n-type impurities are not to be added to the symmetrical n-channel type MISFETs wherein currents flow in both directions of each pair of semiconductor regions.

Figure 27:
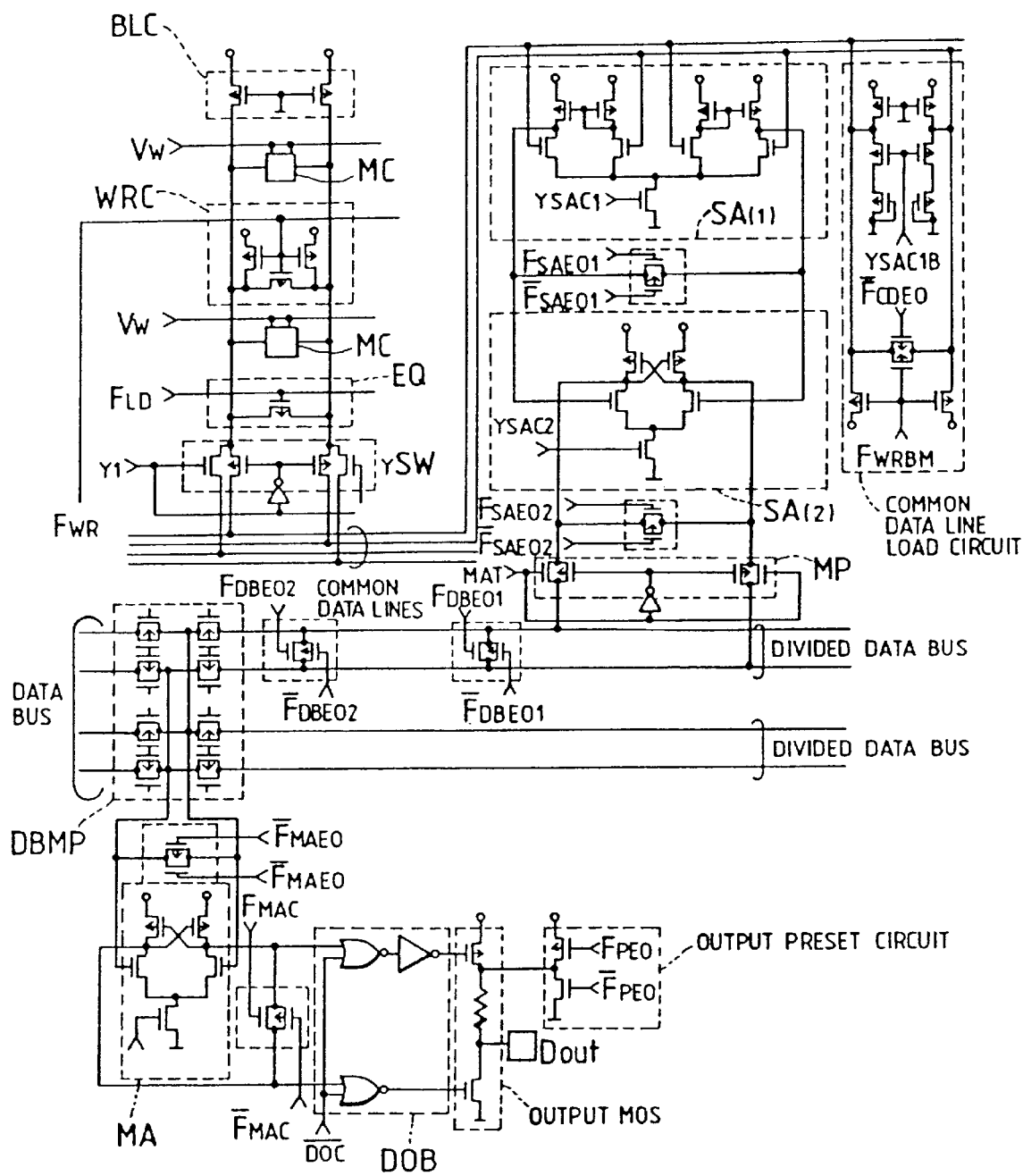
FIG. 27 is a circuit diagram showing part of the peripheral circuits of the first embodiment.

Of the peripheral circuits of the SRAM, the sense amplifier circuits SA in a corner of the memory block MB and the circuits associated with these sense amplifier circuits are illustratively shown in FIG. 27. In FIG. 27, the n-channel type MISFETs enclosed by thick broken lines (i.e., in the Y-selector YSW, multiplexer MP, data bus multiplexer DBMP, etc.) are of the symmetrical structure each; the n-channel MISFETs in the other regions (i.e., in the bit line load circuit BLC, write recovery circuit WRC, equalizer EQ, sense amplifiers A(1) and A(2), main amplifier MA, output buffer DOB, output MOS, etc.) are of the asymmetrical structure each. Thus the n-type impurities are added only to the source-forming regions of the n-channel type MISFETs excluding the n-channel type MISFETs within the regions enclosed by the thick broken lines in FIG. 27.

With the above photo resist film removed by ashing, a silicon oxide film, not shown, is deposited all over the semiconductor substrate 1. The silicon oxide film is formed by the CVD method to a thickness of 140 to 160 nm. Thereafter, the silicon oxide film is etched by the anisotropic etching method such as RIE. The process forms side wall spacers 15 over the side walls of the gate electrodes 11 (word lines WL) for the transfer MISFETs $Qt_1$ and $Qt_2$ of the memory cell MC as well as for the n- and p-channel type MISFETs of the peripheral circuits (FIG. 28).

With the side wall spacers 15 thus furnished, a photo resist film, not shown, is formed over the main surface of the semiconductor substrate 1. This photo resist film is used as a mask through which n-type impurities are added: to the regions where the driver MISFETs $Qd_1$ and $Qd_2$ Of the memory cell MC are to be formed; to the regions where the transfer MISFETs $Qt_1$ and $Qt_2$ are to be formed; and to the regions where the n-channel MISFETs of the peripheral circuits are to be formed, over the main surface of the semiconductor substrate 1. The n-type impurities, typically composed of arsenic (As), are applied through ion implantation for a density of about $3\times10^{15}/cm^2$ at an energy level of about 50 keV.

Figure 29:
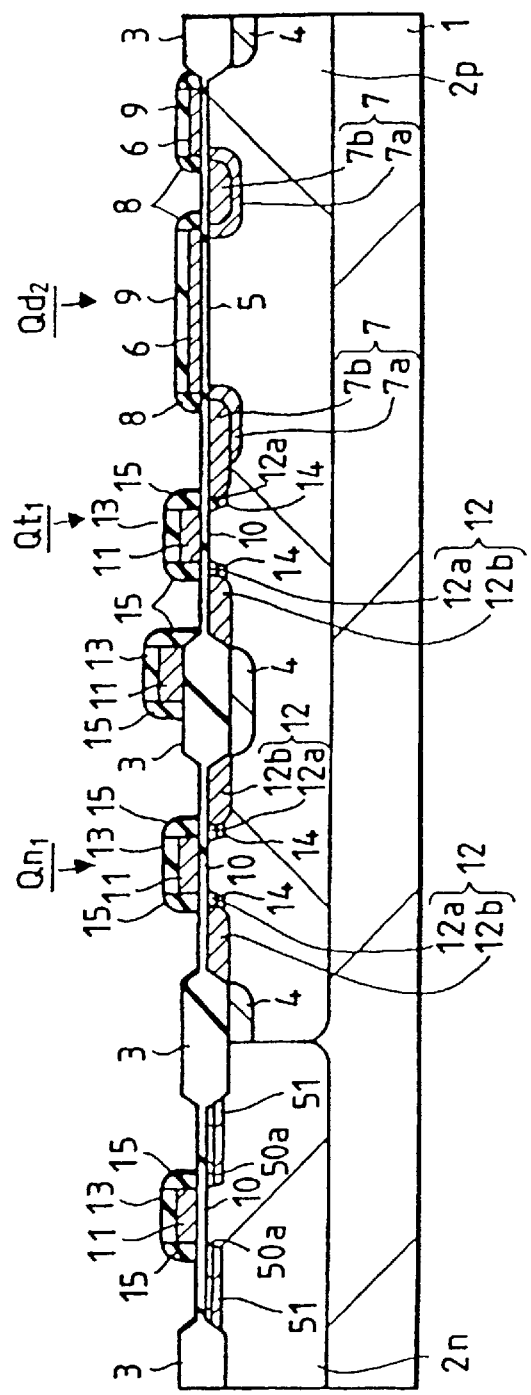
FIG. 29 is another partial sectional view of the semiconductor substrate of the first embodiment, illustrating how the embodiment is manufactured.

With the above photo resist film removed by ashing, the n-type impurities added to the main surface of the semiconductor substrate 1 are allowed to diffuse therein. Two kinds of n-type impurities (phosphorus(P) (n-type impurities 100) and arsenic (As)) having different diffusion rates and different densities are implanted in that main surface part of the semiconductor substrate 1 which includes the regions where the driver MISFETs $Qd_1$ and $Qd_2$ Of the memory cell MC are to be formed. This causes the As impurities to form $n^+$-type semiconductor regions 7b of high impurity density, and the P impurities (n-type impurities 100) to form n-type semiconductor regions 7a under the regions 7b. The impurity density of the n-type semiconductor regions 7a is lower than that of the $n^+$-type semiconductor regions 7b. Allowing these impurities to diffuse where appropriate completes the driver MISFETs $Qd_1$ and $Qd_2$ of the double diffused drain structure (and the source regions of the transfer MISFETs $Qt_1$ and $Qt_2$). The $n^+$-type semiconductor regions 7b and the n-type semiconductor regions 7a are formed in self-aligned fashion with respect to the side wall spacers 8 furnished on the gate electrodes 6 of the driver MISFETs $Qd_1$ and $Qd_2$ and the side walls associated therewith (FIG. 29).

Only the As impurities are added to that main surface part of the semiconductor substrate 1 which includes the regions where the transfer MISFETs $Qt_1$ and $Qt_2$ of the memory cell MC are to be formed. Upon addition, the As impurities form $n^+$-type semiconductor regions 12b of high impurity density. The $n^+$-type semiconductor regions 12b are formed in self-aligned fashion relative to the side wall spacers 15 furnished on the gate electrodes 11 of the transfer MISFETs $Qt_1$ and $Qt_2$ and the side walls associated therewith. In the previous process, the n-type semiconductor regions 12a (and p-type semiconductor regions 14) of low impurity density were formed in that main surface part of the semiconductor substrate 1 which includes the regions where the transfer MISFETs $Qt_1$ and $Qt_2$ are to be formed. The diffusion of the impurities in these regions completes the transfer MISFETs $Qt_1$ and $Qt_2$ having the semiconductor regions 12 of the LDD structure (FIG. 29).

Only the As impurities are added to that main surface part of the semiconductor substrate 1 which includes the regions for accommodating n-channel type MISFETs $Qn_1$ of the above-mentioned symmetrical structure among the n-channel type MISFETs of the peripheral circuits. Upon addition, the As impurities form $n^+$-type semiconductor regions 12b of high impurity density. The $n^+$-type semiconductor regions 12b are formed in self-aligned fashion relative to the side wall spacers 15 furnished on the gate electrodes 11 of the n-channel type MISFETs and the side walls associated therewith. In the previous process, the n-type semiconductor regions 12a (and p-type semiconductor regions 14) of low impurity density were formed in that main surface part of the semiconductor substrate 1 which includes the regions where the n-channel type MISFETs are to be formed. The diffusion of the impurities in these regions completes the n-channel type MISFETs $Qn_1$ of the LDD structure (FIG. 29).

As described, the n-channel type MISFETs $Qn_1$ among the n-channel type MISFETs of the peripheral circuits are of the LDD structure, and the p-type semiconductor regions 14 of low impurity density are formed under the n-type semiconductor regions 12a of low impurity density. This arrangement suppresses the short channel effect. That in turn reduces the occupied area of the n-channel type MISFETs $Qn_1$ and that of the memory cells MC, whereby the degree of integration of the SRAM is enhanced.

Figure 30:
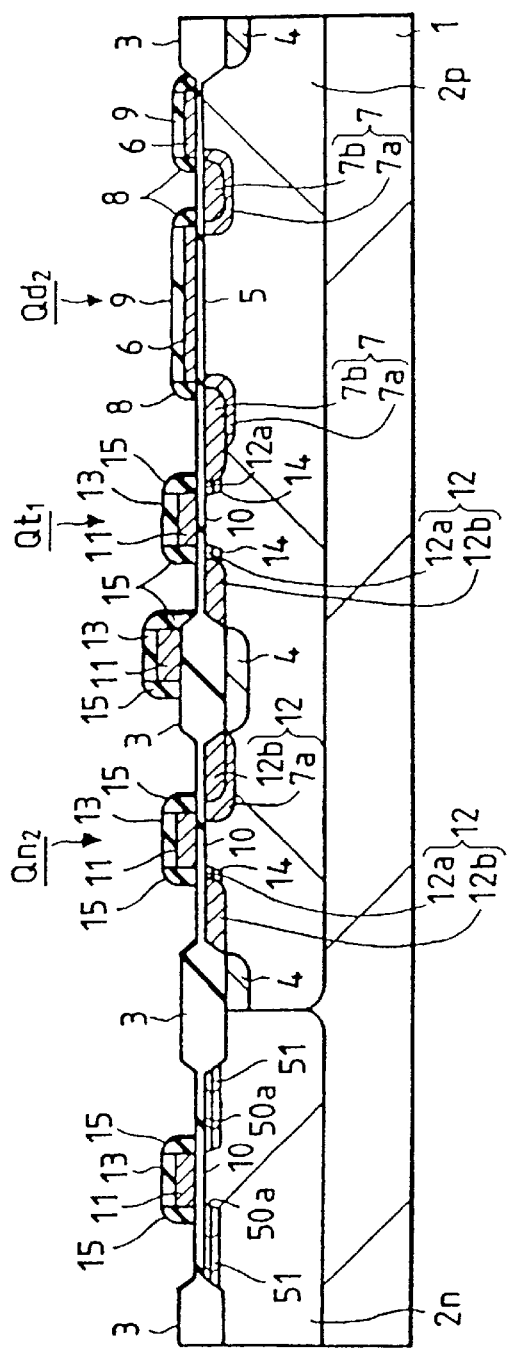
FIG. 30 is another partial sectional view of the semiconductor substrate of the first embodiment, illustrating how the embodiment is manufactured.

The P impurities (n-type impurities 100) and the As impurities are added to that main surface part of the semiconductor substrate 1 which includes the regions for accommodating the source-forming regions of n-channel type MISFETs $Qn_2$ Of the above-mentioned asymmetrical structure among the n-channel type MISFETs of the peripheral circuits. Upon addition, the As impurities form $n^+$-type semiconductor regions 7b of high impurity density in the source-forming regions; the P impurities cause n-type semiconductor regions 7a to be formed under the $n^+$-type semiconductor regions 7b. The n-type semiconductor regions 7a and $n^+$-type semiconductor regions 7b are formed in self-aligned fashion with respect to the side wall spacers 15 furnished on the gate electrodes 11 of the n-channel type MISFETs and the side walls associated therewith. In the previous process, the n-type semiconductor regions 12a (and p-type semiconductor regions 14) of low impurity density were formed in that main surface part of the semiconductor substrate 1 which includes the regions where the n-channel type MISFETs are to be formed. The diffusion of the impurities in these regions completes the n-channel type MISFETs $Qn_2$ wherein one of the semiconductor regions 12 (drain region) is of the LDD structure and the other semiconductor region 12 (source region) is of the dual diffused drain structure (FIG. 30). The n-type semiconductor regions 7a have a higher impurity density than the n-type semiconductor regions 12a or p-type semiconductor regions 14.

As described, the n-channel type MISFETs $Qn_2$ of the asymmetrical structure among the n-channel type MISFETs of the peripheral circuits have one of the semiconductor regions (source region) formed in the double diffused drain structure. This arrangement lowers the resistance value of the semiconductor region (source region) 12 and thereby prevents voltage drops. That in turn makes operations faster for writing and reading data to and from the memory cell MC, whereby the operating speed of the SRAM is improved.

Because the p-type semiconductor regions 14 of low impurity density are formed under the n-type semiconductor regions 12a of low impurity density, the short channel effect is inhibited. This makes it possible to reduce the occupied area of the n-channel type MISFETs $Qn_2$ and that of the memory cells MC, whereby the degree of integration of the SRAM is boosted.

Next, a photo resist film, not shown, is formed over the main surface of the semiconductor substrate 1. This photo resist film is used as a mask through which to make holes: through the insulating film over one of the semiconductor regions (source region) 7 of the driver MISFETs $Qd_1$ and $Qd_2$ of the memory cell MC (i.e., the insulating film formed by the same process as that for forming the gate insulating film 5 of the driver MISFETs $Qd_1$ and $Qd_2$); through the insulating film over one of the semiconductor regions (drain region) 12 of the transfer MISFETs $Qt_1$ and $Qt_2$ (i.e., the insulating film formed by the same process as that for forming the gate insulating film 10 of the transfer MISFETs $Qt_1$ and $Qt_2$); and through the insulating film over one of the semiconductor regions (drain region) 12 of the n-channel type MISFETs Qn of the peripheral circuits (i.e., the insulating film formed by the same process as that for forming the gate insulating film 10 of the n-channel type MISFETs Qn). The holes thus made constitute: a contact hole 17A on one of the semiconductor regions (source region) 7 of the driver MISFETs $Qd_1$ and $Qd_2$; a contact hole 17B on one of the semiconductor regions (drain region) 12 of the transfer MISFETs $Qt_1$ and $Qt_2$; and a contact hole 17C on one of the semiconductor regions (drain region) 12 of the n-channel type MISFETs Qn for the peripheral circuits.

With the above photo resist film removed by ashing, a third layer gate material, not shown, is deposited all over the semiconductor substrate 1. The gate material is made of a polycide film comprising a polycrystal silicon film and a tungsten silicide ($WSi_x$) film. The polycrystal silicon film, located under the tungsten silicide film, is formed by the CVD method to a thickness of 25 to 35 nm. While being deposited, the polycrystal silicon film is given n-type impurities (e.g., phosphorus (p) to reduce its resistance value. The density of the P impurities is about $2.5 \times 10^{20}/cm^2$. The tungsten silicide film located above the polycrystal silicon film is formed by the CVD method to a thickness of 35 to 45 nm.

Figure 31:
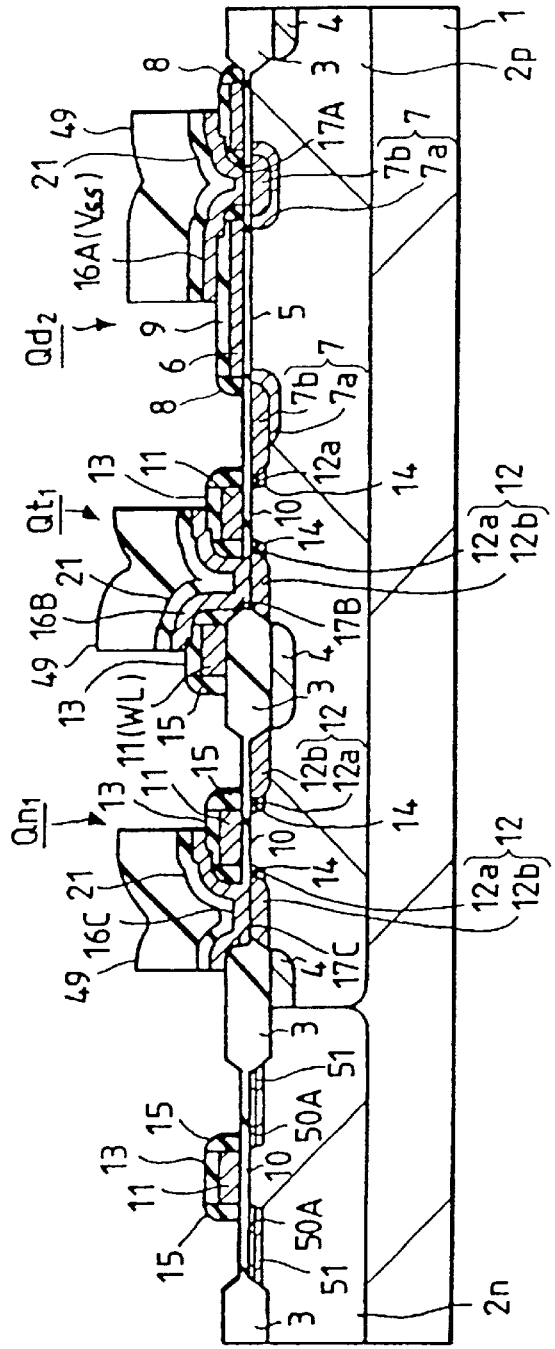
FIG. 31 is another partial sectional view of the semiconductor substrate of the first embodiment, illustrating how the embodiment is manufactured.
Figure 32:
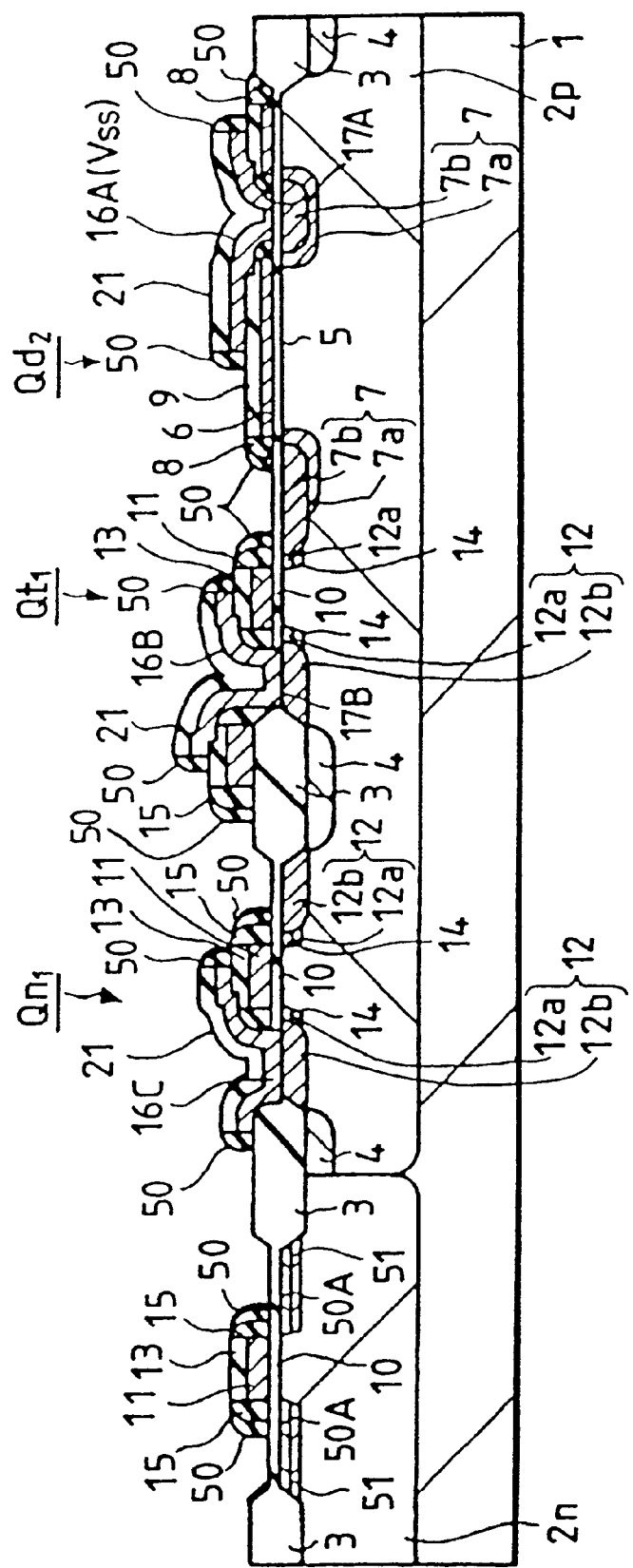
FIG. 32 is another partial sectional view of the semiconductor substrate of the first embodiment, illustrating how the embodiment is manufactured.

An insulating film 21 made illustratively of a silicon oxide film is then deposited over the third layer gate material (polycide film). This silicon oxide film is formed by the CVD method to a thickness of 125 to 155 nm. After a photo resist film 49 is deposited over the insulating film 21, the film 49 is used as a mask through which to etch successively the insulating film 21 and then the third layer gate material (polycide film) thereunder. The process forms: the reference voltage lines ($V_{SS}$) 16A connected via the contact hole 17A to one of the semiconductor regions (source regions) 7 of the driver MISFETs $Qd_1$ and $Qd_2$ of the memory cell MC; the pad layer 16B connected via the contact hole 17B to one of the semiconductor regions (drain regions) of the transfer MISFETs $Qt_1$ and $Qt_2$; and the pad layer 16C connected via the contact hole 17C to one of the semiconductor regions (drain region) of the n-channel type MISFETs Qn for the peripheral circuits (FIG. 31).

The reference voltage lines ($V_{SS}$) 16A and the pad layers 16B and 16C may be formed by the phase-shift lithography technique described in IEDM, Tech. Dig., pp. 477–480, 1990. What is described in this publication is outlined below for reference.

With the photo resist film 49 removed by ashing, a silicon oxide film, not shown, is deposited all over the semiconductor substrate 1. The silicon oxide film is formed by the CVD method to a thickness of 110 to 130 nm. Thereafter, the silicon oxide film is etched by the anisotropic etching method such as RIE. The etching process forms side wall spacers 52 (FIG. 32) on one of the side walls for the gate electrodes 6 of the driver MISFETs $Qd_1$ and $Qd_2$ of the memory cell MC; on the side walls of the reference voltage lines ($V_{SS}$) 16A (and of the insulating film 21 thereabove); on one of the side walls of the gate electrodes 11 (word lines WL) for the transfer MISFETs $Qt_1$ and $Qt_2$; on the side walls of the pad layer 16B (and of the insulating layer 21 thereabove); on one of the side walls of the gate electrodes 11 for the n-channel type MISFETs Qn of the peripheral circuits; and on the side walls of the pad layer 16C (and of the insulating film 21 thereabove).

Figure 33:
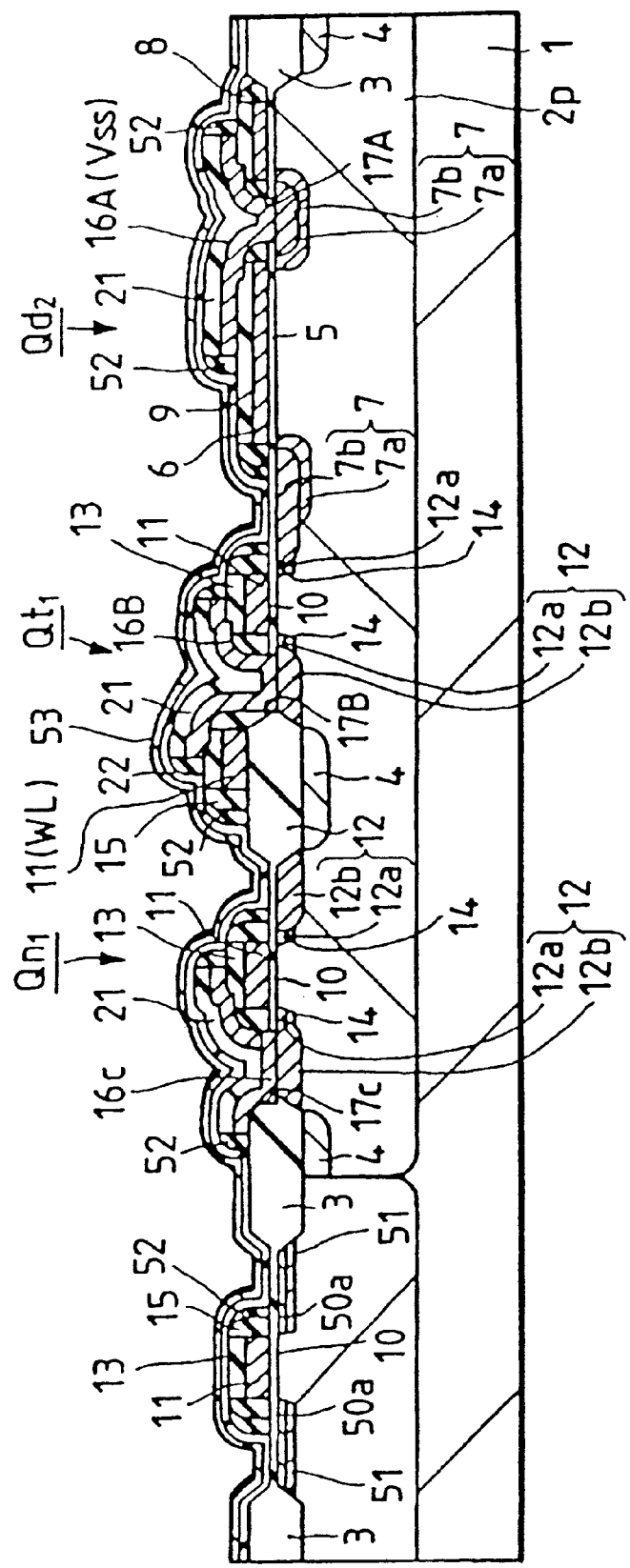
FIG. 33 is another partial sectional view of the semiconductor substrate of the first embodiment, illustrating how the embodiment is manufactured.

After an insulating film 22 made of a silicon oxide film is deposited all over the semiconductor substrate 1, a polycrystal silicon film 53, which constitutes the fourth layer gate material, is furnished over the insulating film 22 (FIG. 33). The silicon oxide film and the polycrystal silicon film 53 are formed by the CVD method to a thickness of about 20 nm each. The polycrystal silicon film 53 is used as a conductive strip constituting the channel regions 18N, drain regions 18P and source regions 18P for the load MISFETs $Qp_1$ and $Qp_2$ of the memory cell MC.

Then n-type impurities (e.g., phosphorus (p)) are added to the polycrystal silicon film 53. The P impurities are added through ion implantation for a density of about $1 \times 10^{12}/cm^2$ at an energy level of 20 keV. The purpose in applying the P impurities is to set the threshold voltage of the load MISFETs $Qp_1$ and $Qp_2$ for the enhancement type.

With the n-type impurities added, a photo resist film, not shown, is formed over the polycrystal silicon film 53. This photo resist film is used as a mask through which to add p-type impurities (e.g., $BF_2$) to part of the polycrystal silicon film 53. The $BF_2$ impurities are added through ion implantation for a density of $1 \times 10^{12}/cm^2$ at an energy level of about 20 keV. When added in this manner, the $BF_2$ impurities form the drain and the source regions 18P of the load MISFETs $Qp_1$ and $Qp_2$. The channel regions 18N of the load MISFETs $Qp_1$ and $Qp_2$ are formed interposingly between the drain regions 18P and the source regions 18P. The drain regions 18P of the load MISFETs $Qp_1$ and $Qp_2$ constitute the so-called offset structure, i.e., they do not overlap with the gate electrodes 20. On the other hand, the source regions 18P of the load MISFETs $Qp_1$ and $Qp_2$ are constructed to overlap with the gate electrodes 20.

Figure 34:
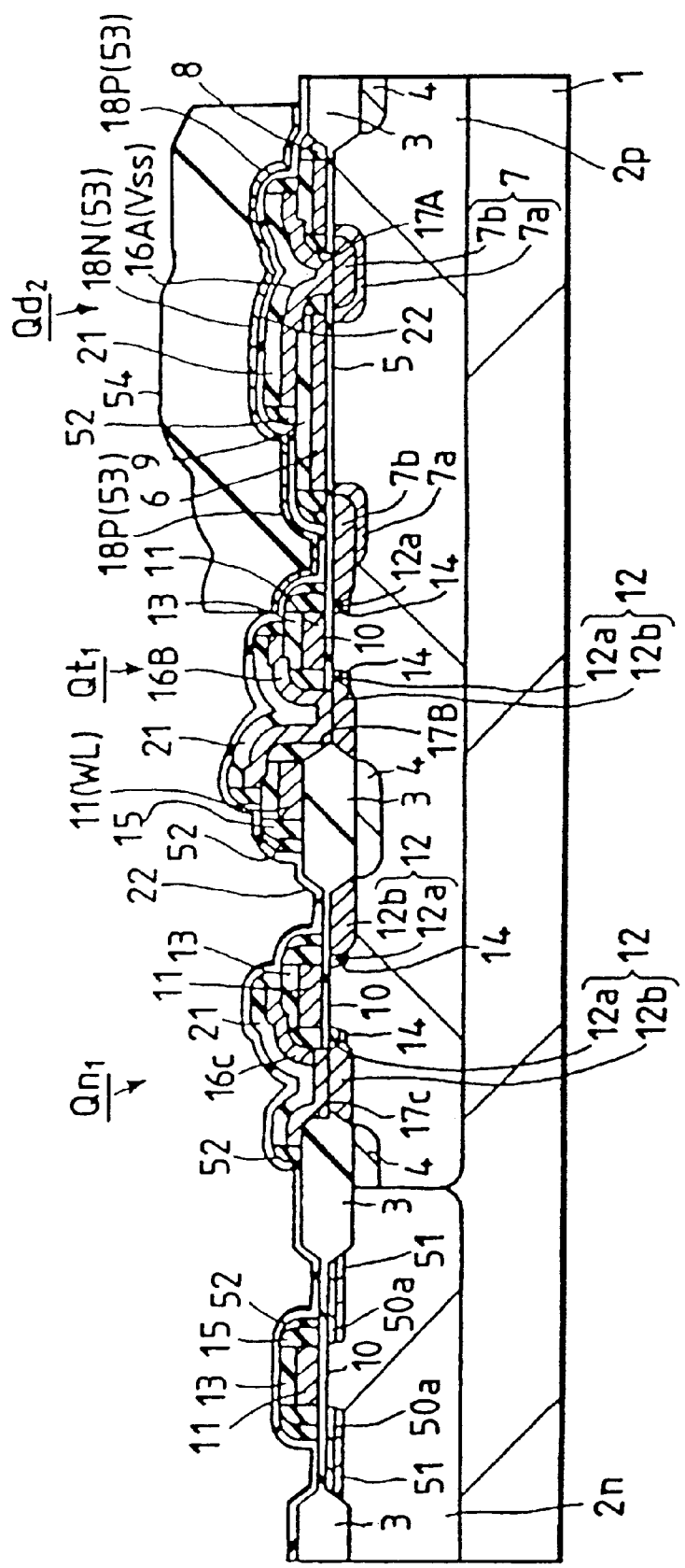
FIG. 34 is another partial sectional view of the semiconductor substrate of the first embodiment, illustrating how the embodiment is manufactured.

With the above photo resist film removed by ashing, a new photo resist film 54 is formed over the polycrystal silicon film 53. The photo resist film 54 is used as a mask through which to etch the polycrystal silicon film 53. The etching process forms the channel regions 18N, drain regions 18P and source regions 18P of the load MISFETs $Qp_1$ and $Qp_2$ (FIG. 34).

After the photo resist film 54 is removed by ashing, a new photo resist film 55 is formed over the main surface of the semiconductor substrate 1. The photo resist film 55 is used as a mask through which to add p-type impurities to that main surface part of the semiconductor substrate 1 which includes the regions where the p-channel type MISFETs of the peripheral circuits are to be formed. Adding the p-type impurities forms $p^+$-type semiconductor regions 50b of high impurity density. The p-type impurities, typically composed of $BF_2$, are added through ion implantation for a density of about $2 \times 10^{15}/cm^2$ at an energy level of about 60 keV.

Figure 35:
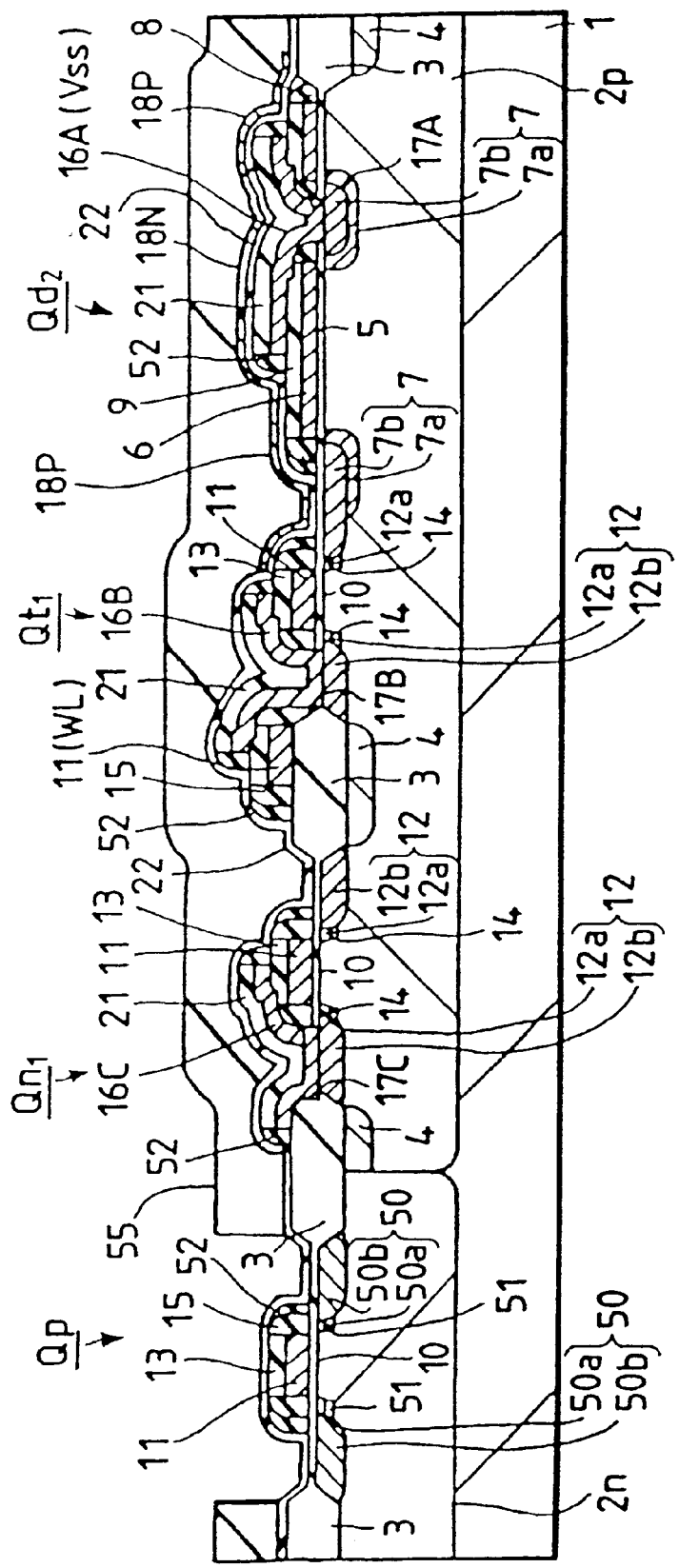
FIG. 35 is another partial sectional view of the semiconductor substrate of the first embodiment, illustrating how the embodiment is manufactured.

The $p^+$-type semiconductor regions 50b are formed in self-aligned fashion relative to the gate electrodes 11 of the p-channel type MISFETs, to the side wall spacers 15 and 52 formed on the side walls of the gate electrodes 11, and to the insulating film 22. In the previous process, the p-type semiconductor regions 50a (and n-type semiconductor regions 51) of low impurity density were formed over that main surface part of the semiconductor substrate 1 which includes the regions where the p-channel type MISFETs are to be formed. In this arrangement, the p-type semiconductor regions 50a and $p^+$-type semiconductor regions 50b furnished as described constitute the semiconductor regions (source and drain regions) of the p-channel type MISFETs. This completes the p-channel type MISFETs Qp of the LDD structure (FIG. 35).

As described, the p-channel MISFETs Qn of the peripheral circuits are furnished in the LDD structure, and the n-type semiconductor regions 51 of low impurity density are located under the p-type semiconductor regions 50a of low impurity density. This arrangement suppresses the short channel effect. That in turn reduces the occupied area of the p-channel type MISFETs Qp and that of the memory cells MC, whereby the degree of integration of the SRAM is enhanced.

After the photo resist film 55 is removed by ashing, the gate insulating film 19 for the load MISFETs $Qp_1$ and $Qp_2$ of the memory cell MC is deposited all over the semiconductor substrate 1. The gate insulating film, made of a silicon oxide film, is formed by the CVD method to a thickness of 35 to 45 nm.

Figure 36:
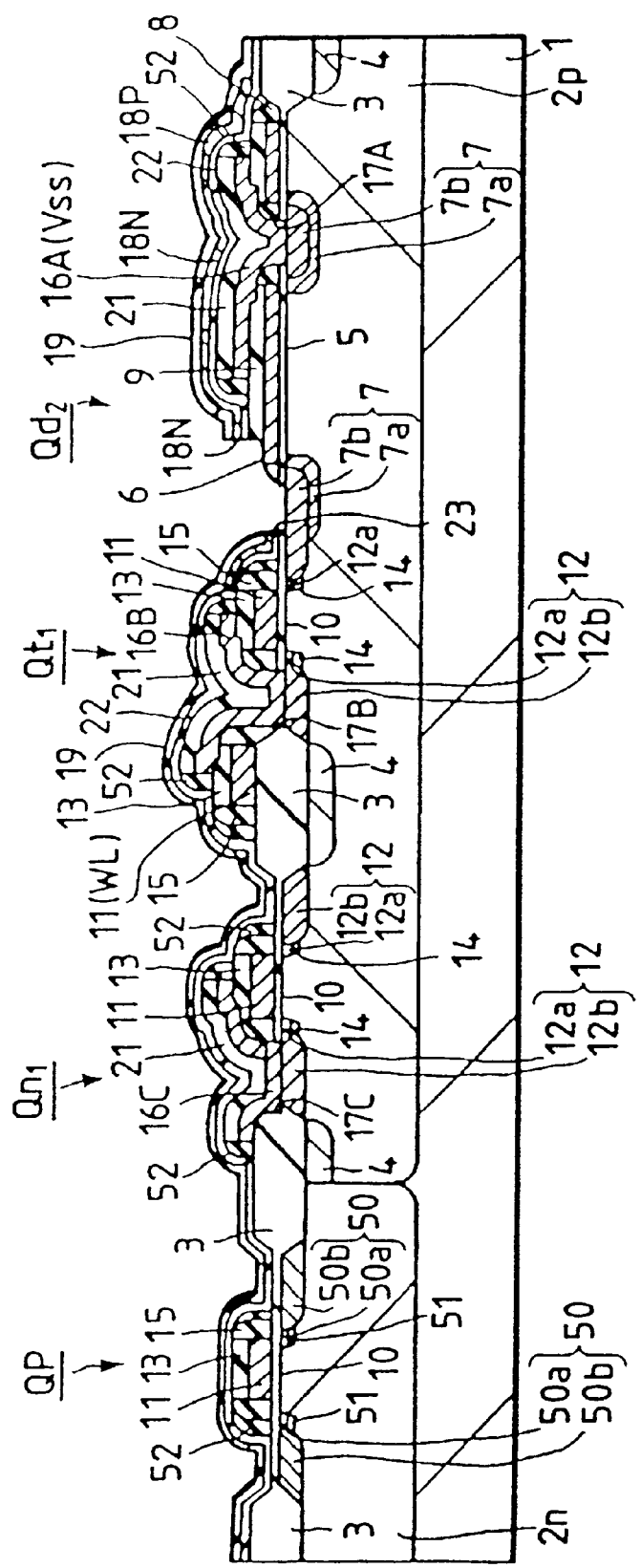
FIG. 36 is another partial sectional view of the semiconductor substrate of the first embodiment, illustrating how the embodiment is manufactured.

A photo resist film, not shown, is then formed over the gate insulating film 19. This photo resist film is used as a mask through which to etch successively the gate insulating film 19 for the load MISFETs $Qp_1$ and $Qp_2$ of the memory cell MC, the drain regions 18P, the insulating film 22, and the insulating film 9. The etching process forms a contact hole 23 (FIG. 36) over the main surface of one of the semiconductor regions (drain region) 7 for the driver MISFET $Qd_1$ of the memory cell MC (one of the semiconductor regions 12 of the transfer MISFET $Qt_1$), and over the main surface of one of the semiconductor regions (drain region) 7 for the driver MISFET $Qd_2$ (one of the semiconductor regions 12 of the transfer MISFET $Qt_2$). As shown in FIG. 36, above the side wall of the contact hole 23, there are exposed the cross sections of the drain regions 18P for the load MISFETs $Qp_1$ and $Qp_2$ as well as the main surface part at one end of the gate electrodes 6 of the driver MISFETs $Qd_1$ and $Qd_2$.

With the above photo resist film removed by ashing, a polycrystal silicon film, which constitutes the fifth layer gate material but is not shown, is deposited all over the semiconductor substrate 1. This polycrystal silicon film is used as a first electrode for the gate electrodes 20 and capacitor elements C of the load MISFETs $Qp_1$ and $Qp_2$ for the memory cell MC. The polycrystal silicon film is formed by the CVD method to a thickness of 65 to 75 nm. While being deposited, the polycrystal silicon film is given n-type impurities (e.g., phosphorus P) to reduce its resistance value. The density of the P impurities is $1\times10^{20}$ to $1\times10^{21}/cm^2$.

Figure 37:
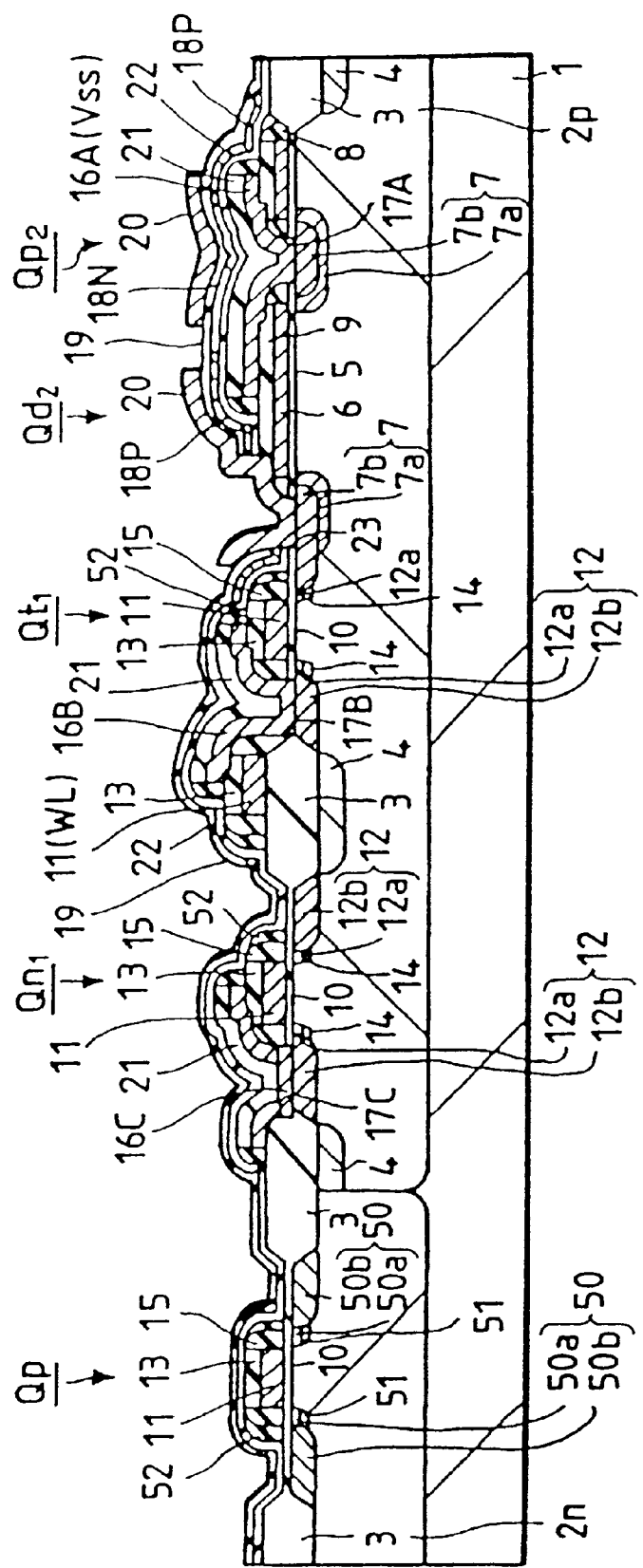
FIG. 37 is another partial sectional view of the semiconductor substrate of the first embodiment, illustrating how the embodiment is manufactured.
Figure 38:
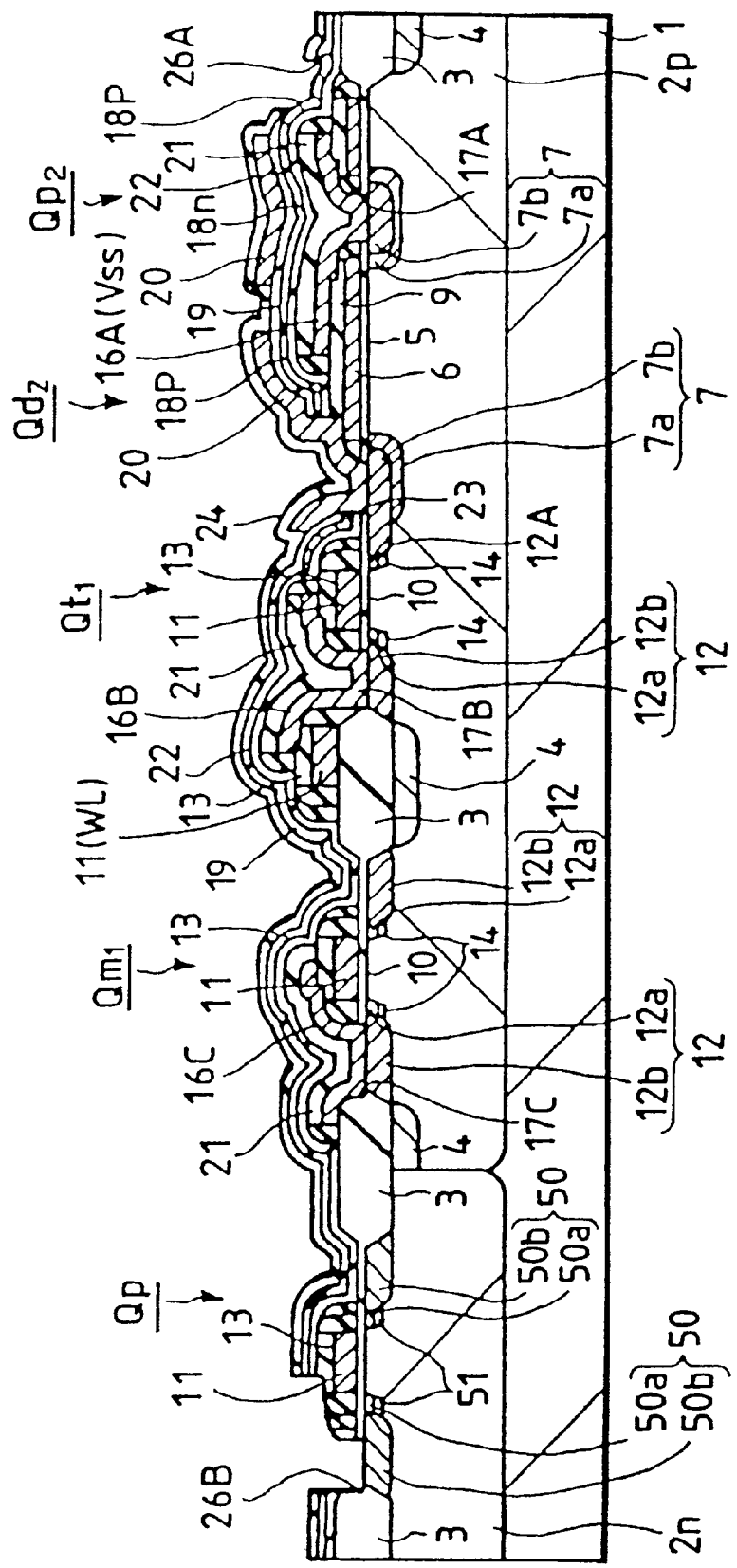
FIG. 38 is another partial sectional view of the semiconductor substrate of the first embodiment, illustrating how the embodiment is manufactured.

After a photo resist film, not shown, is further formed on the polycrystal silicon film, that photo resist film is used as a mask through which to etch the polycrystal silicon film below. The etching process forms the gate electrodes 20 (and the first electrode of capacitor elements C) of the load MISFETs $Qp_1$ and $Qp_2$. This completes the load MISFETs $Qp_1$ and $Qp_2$. After this, the photo resist film is removed by ashing (FIG. 37).

With the gate electrodes 20 of the load MISFET $Qp_2$ thus formed, the contact hole 23 interconnects the gate electrodes 20, one of the semiconductor regions (drain region) 7 of the driver MISFET $Qd_1$ (one of the semiconductor regions 12 of the transfer MISFET $Qt_1$), the drain region 18P of the load MISFET $Qp_1$, and the gate electrodes 6 of the driver MISFET $Qd_2$. Likewise, upon formation of the gate electrodes 20 of the load MISFET $Qp_1$, the contact hole 23 interconnects the gate electrodes 20, one of the semiconductor regions (drain region) 7 of the driver MISFET $Qd_2$ (one of the semiconductor regions 12 of the transfer MISFET $Qt_2$), the drain region 18P of the load MISFET $Qp_2$, and the gate electrodes 6 of the driver MISFET $Qd_1$.

As described, it is not a plurality of contact holes but the single contact hole 23 that interconnects one of the semiconductor regions (drain region) 7 of the driver MISFETs Qd (one of the semiconductor regions 12 of the transfer MISFETs Qt) on the main surface of the semiconductor substrate 1, those gate electrodes 6 of the driver MISFETs Qd which are composed of the first layer gate material, that drain region 18P of the load MISFETs Qp which is made of the fourth layer gate material, and those gate electrodes 20 of the load MISFETs Qp which are constituted by the fifth layer gate material. It obviously takes fewer steps to form one contact hole instead of a plurality of contact holes through which the conductive strips would be interconnected. This translates into fewer processes required in manufacturing the SRAM.

Next, the insulating film 24 is deposited all over the semiconductor substrate 1. The insulating film 24 is used as a dielectric film of the capacitor elements C. The insulating film 24 is made of a layered structure comprising a silicon oxide film and a silicon nitride film. The silicon oxide film located under the silicon nitride film is formed by the CVD method to a thickness of 9 to 11 nm. The silicon nitride film above is formed also by the CVD method to a thickness of 9 to 11 nm. The silicon nitride film in the upper layer acts as a barrier film that prevents entry of moisture into the channel region 18N of the load MISFETs Qp. This arrangement suppresses fluctuations in the threshold voltage of the load MISFETs Qd, whereby the circuit operation of the load MISFETs Qd is enhanced in reliability.

A photo resist film, not shown, is then formed over the insulating film 24. This photo resist film is used as a mask through which to etch the insulating film 24 below. The etching process forms a contact hole 26A on the source regions 18P of the load MISFETs $Qp_1$ and $Qp_2$, and a contact hole 26B on one of the semiconductor regions 50 for the p-channel type MISFETs Qp of the peripheral circuits. Thereafter, the photo resist film is removed by ashing.

Now a polycrystal silicon film of the sixth layer gate material is deposited all over the semiconductor substrate 1. This polycrystal silicon film is used as a pad layer 25B over the supply voltage lines ($V_{CC}$) 25A, over the second electrode (plate electrode) of the capacitor elements C, and over one of the semiconductor regions 50 for the p-channel type MISFETs Qp of the peripheral circuits. The polycrystal silicon film is formed by the CVD method to a thickness of 65 to 75 nm. A dose of p-type impurities (e.g., $BF_2$) is added to the polycrystal silicon film to reduce its resistance value. The $BF_2$ impurities are added through ion implantation for a density of about $3\times10^{15}/cm^2$ at an energy level of about 40 keV.

Figure 39:
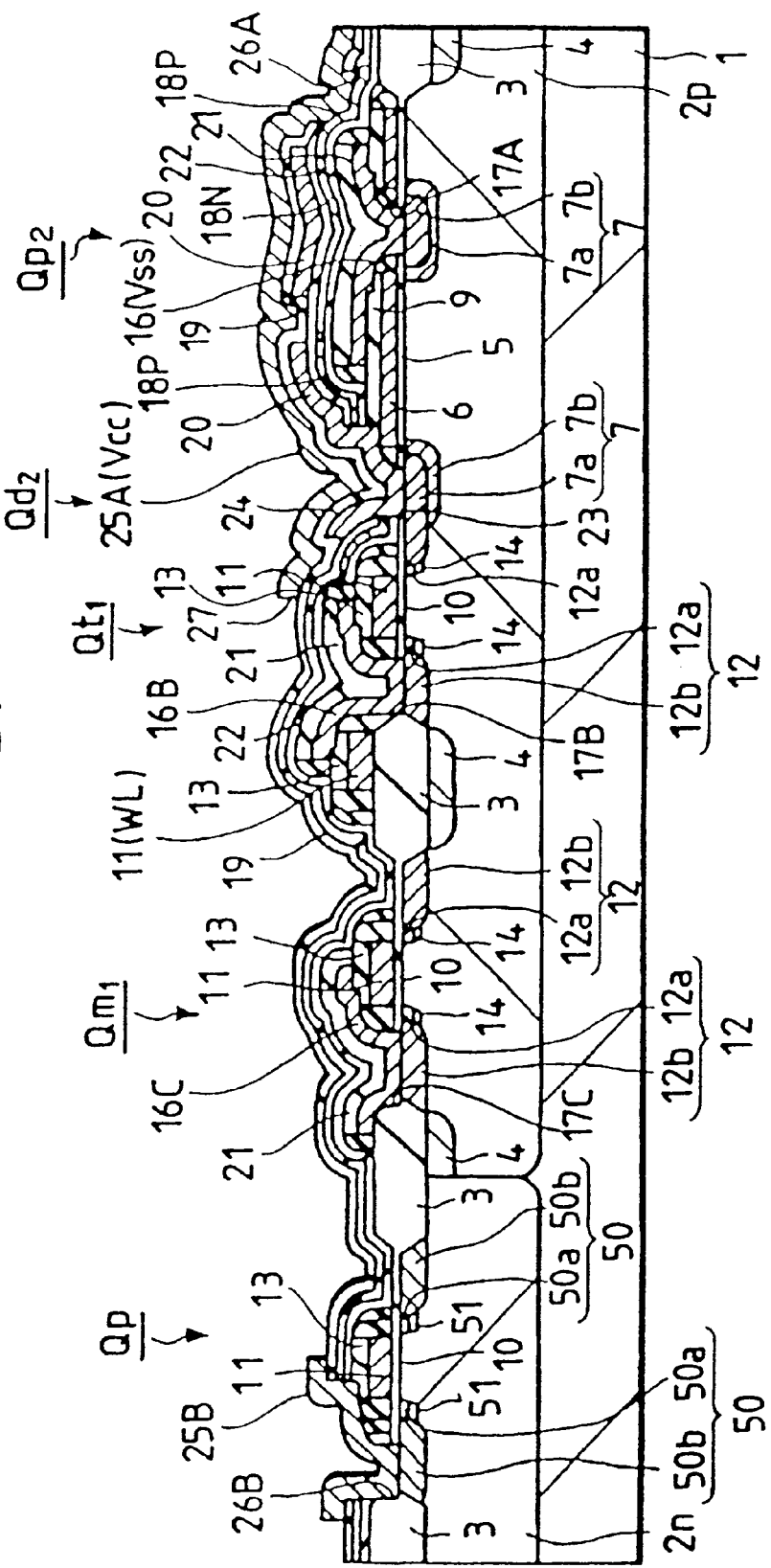
FIG. 39 is another partial sectional view of the semiconductor substrate of the first embodiment, illustrating how the embodiment is manufactured.

A photo resist film, not shown, is then formed over the polycrystal silicon film. This photo resist film is used as a mask through which to etch the polycrystal silicon film below. The etching process forms the supply voltage lines ($V_{CC}$) 25A, capacitor elements C and pad layer 25B, and makes a hole 27 on part of the supply voltage lines ($V_{CC}$) 25A. The supply voltage lines ($V_{CC}$) 25A are connected via the contact hole 26A to the source regions 18P of the load MISFETs $Qp_1$ and $Qp_2$ of the memory cell CM. The pad layer 25B is connected via the contact hole 26B to one of the semiconductor regions 50 of the p-channel type MISFETs Qp for the peripheral circuits. Thereafter, the photo resist film is removed by ashing (FIG. 39).

The interlayer isolation film 28 is then deposited all over the semiconductor substrate 1. The interlayer isolation film is constituted by a layered structure comprising a silicon oxide film and a BPSG film. The silicon oxide film located under the BPSG film is formed by the CVD method to a thickness of 90 to 110 nm. The BPSG film of the upper layer is formed also by the CVD method to a thickness of 270 to 330 nm. After the BPSG film is deposited, the semiconductor substrate 1 is annealed for about 20 minutes illustratively in a nitrogen atmosphere at about 850° C. The annealing process flattens the surface of the BPSG film.

Figure 40:
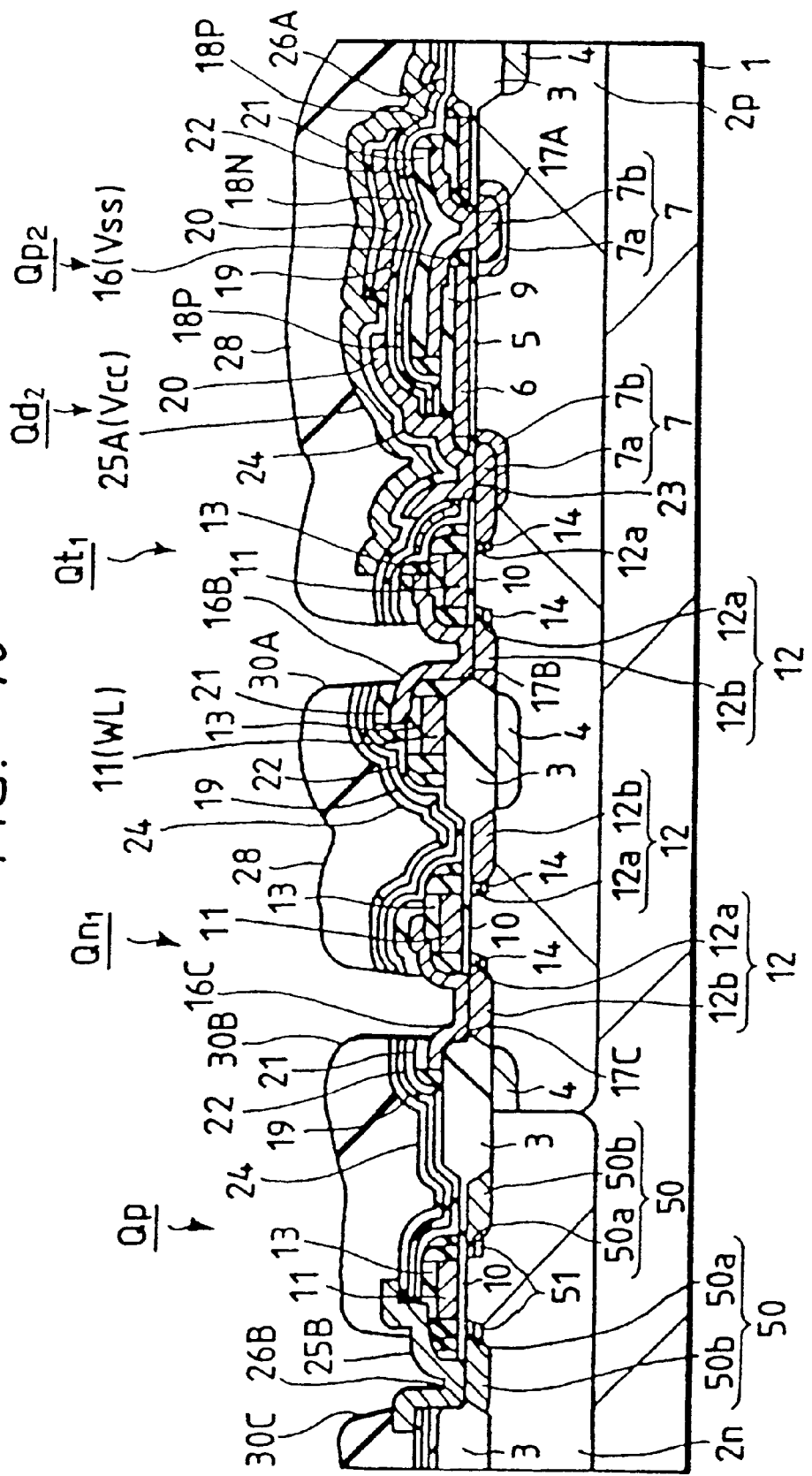
FIG. 40 is another partial sectional view of the semiconductor substrate of the first embodiment, illustrating how the embodiment is manufactured.

A photo resist film, not shown, is then formed over the interlayer isolation film 28. This photo resist film is used as a mask through which to etch the interlayer isolation film 28 and the insulating films 24, 19 and 22. The etching process forms the contact hole 30A on one of the semiconductor regions 12 for the MISFETs $Qt_1$ and $Qt_2$ of the memory cell MC. At the same time, a contact hole 30B is formed on one of the semiconductor regions 12 for the n-channel type MISFETs Qn of the peripheral circuits, and a contact hole 30C is formed on one of the semiconductor regions 50 of the p-channel type MISFETs Qp. After this, the photo resist film is removed by ashing (FIG. 40).

The first layer wiring material is then deposited all over the semiconductor substrate 1. This wiring material is composed of a layered structure comprising a TiW film (lower layer) and a W film (upper layer). The TiW film and the W film are each formed by sputtering, with the W film allowed to grow to a thickness of about 300 nm. Then a photo resist film, not shown, is formed over the wiring material. This photo resist film is used as a mask through which to etch the wiring material below. The etching process forms the sub-word lines SWL and intermediate conductive strip 29A over the sub-arrays SMA, and the wiring 29B and 29C over the peripheral circuits. After the etching, the photo resist film is removed by ashing.

Figure 41:
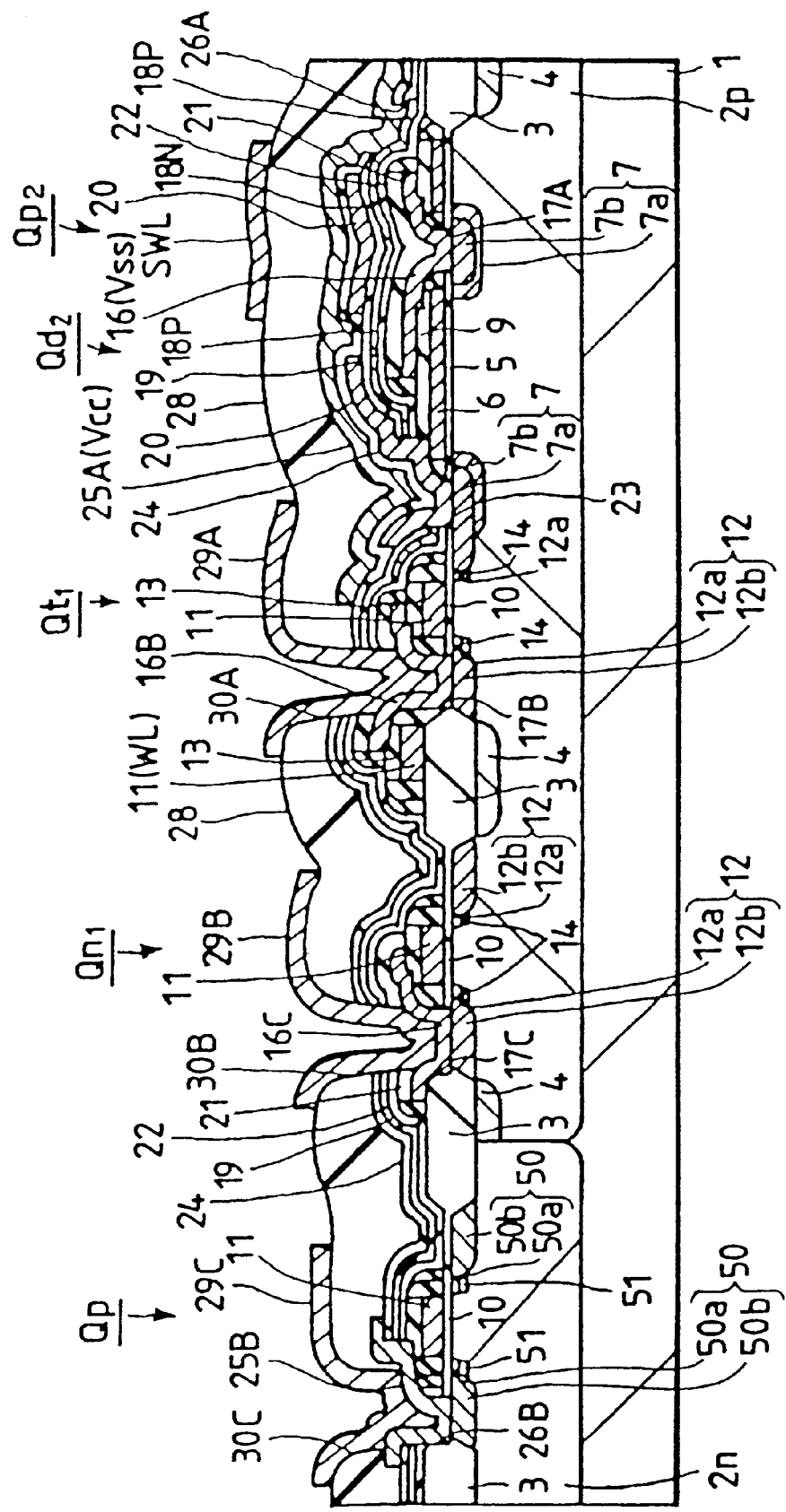
FIG. 41 is another partial sectional view of the semiconductor substrate of the first embodiment, illustrating how the embodiment is manufactured.

The intermediate conductive strip 29A is connected via the contact hole 30A to the pad layer 16B, and also connected via the contact hole 17B to one of the semiconductor regions 12 for the transfer MISFETs $Qt_1$ and $Qt_2$ of the memory cell MC. The wiring 29B is connected via the contact hole 30B to the pad layer 16C, and also connected via the contact hole 17C to one of the semiconductor regions 12 for the n-channel type MISFETs Qn of the peripheral circuits. The wiring 29C is connected via the contact hole 30C to the pad layer 25B, and also connected via the contact hole 26B to one of the semiconductor regions 50 for the p-channel type MISFETs Qp of the peripheral circuits (FIG. 41).

The second layer interlayer isolation film 31 is then deposited all over the semiconductor substrate 1. This interlayer isolation film 31 is made of a three-film layered structure comprising a silicon oxide film, a spin-on glass film and another silicon film. The silicon oxide film of the lower layer is formed by the CVD method to a thickness of 90 to 110 nm. The spin-on glass film of the middle layer is deposited by the spin-on method to a thickness of about 200 nm. After being deposited, the spin-on glass film is subjected to an etch-back process to have its surface flattened. The silicon oxide film of the upper layer is formed by the CVD method to a thickness of 360 to 440 nm.

A photo resist film, not shown, is then formed over the interlayer isolation film 31. This photo resist film is used as a mask through which to etch the interlayer isolation film 31 below. The etching process produces the contact hole 32A on the sub-array SMA and the contact holes 32B and 32C on the peripheral circuits.

After the above photo resist film is removed by ashing, the second layer wiring material is deposited all over the semiconductor substrate 1. This wiring material is made of a three-film layered structure comprising a barrier metal film, an aluminum alloy film and another barrier metal film. The barrier metal film is composed of TiW, and the aluminum (Al) alloy film is formed by an aluminum body mixed with Cu and Si. The TiW film and Al alloy film are formed by sputtering each, with the Al alloy film allowed to grow to a thickness of about 300 nm.

A photo resist film, not shown, is then formed over the wiring material. This photo resist film is used as a mask through which to etch the wiring material below. The etching process produces the complementary data lines DL (first data line $DL_1$ and second data line $DL_2$) over the sub-arrays SMA, and wiring portions 56A and 56B over the peripheral circuits. Thereafter, the photo resist film is removed by ashing.

Of the complementary data lines DL, the first data line $DL_1$ is connected via the contact hole 32A to the intermediate conductive strip 29A, via the contact hole 30A to the pad layer 16B, and via the contact hole 17B to one of the semiconductor regions (drain region) 12 for the transfer MISFET $Qt_1$ of the memory cell MC. The second data line $DL_2$ is connected via the contact hole 32A to the intermediate conductive strip 29A, via the contact hole 30A to the pad layer 16B, and via the contact hole 17B to one of the semiconductor regions (drain region) 12 of the transfer MISFET $Qt_2$.

As described, the complementary data lines DL are connected via the intermediate conductive strip 29A and pad layer 16B to one of the semiconductor regions (drain region) of the transfer MISFETs Qt. This connective arrangement eliminates the need for margins of alignment for the contact holes 32A, 30A and 17B, whereby the area of the semiconductor regions (drain regions) 12 of the transfer MISFETs Qt is reduced.

The arrangement above also translates into a less occupied area of the memory cells MC and thus into a higher degree of integration of the SRAM. With the capacity of the semiconductor regions (drain regions) 12 of the transfer MISFETs Qt lowered in this manner, it takes less time to write and read data to and from the memory cells MC. That is, the operating speed of the SRAM is boosted.

Figure 42:
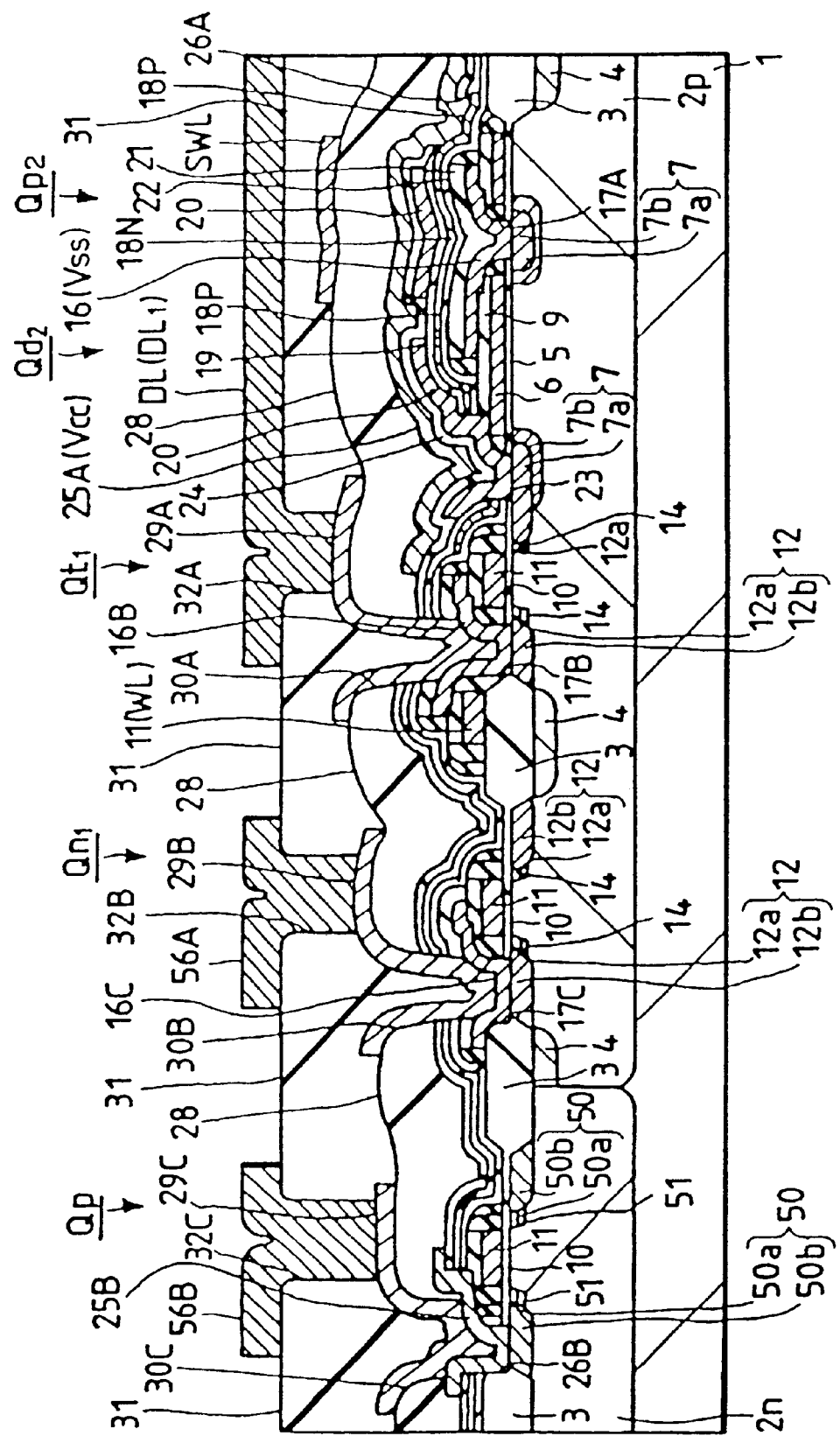
FIG. 42 is another partial sectional view of the semiconductor substrate of the first embodiment, illustrating how the embodiment is manufactured.

The wiring portion 56A is connected via the contact hole 32B to the wiring portion 29B, via the contact hole 30B to the pad layer 16C, and via the contact hole 17C to one of the semiconductor regions 12 of the n-channel type MISFETs Qn for the peripheral circuits. The wiring portion 56B is connected via the contact hole 32C to the wiring portion 29C, via the contact hole 30C to the pad layer 25B, and via the contact hole 26B to one of the semiconductor regions 50 of the p-channel type MISFETs Qp for the peripheral circuits (FIG. 42).

As described, the wiring portion 56A is connected via the wiring portion 29B and pad layer 16C to one of the semiconductor regions 12 of the n-channel type MISFETs Qn for the peripheral circuits. This connective arrangement eliminates the need for margins of alignment for the contact holes 32B, 30B and 17C, whereby the area of the semiconductor regions (drain regions) 12 of the n-channel type MISFETs Qn is reduced.

The arrangement above also translates into a less occupied area of the peripheral circuits and thus into a higher degree of integration of the SRAM. With the capacity of the semiconductor regions 12 of the n-channel type MISFETs Qn for the peripheral circuits lowered in this manner, the speed at which to write and read data to and from the memory cells MC is made higher. That is, the operating speed of the SRAM is improved.

Also as described, the wiring portion 56B is connected via the wiring portion 29C and pad layer 25B to one of the semiconductor regions 50 of the p-channel type MISFETs Qp for the peripheral circuits. This connective arrangement eliminates the need for margins of alignment for the contact holes 32C and 26B, whereby the area of the semiconductor regions 50 for the p-channel type MISFETs Qp of the peripheral circuits is reduced.

The arrangement above also translates into a less occupied area of the peripheral circuits and thus into a higher degree of integration of the SRAM. With the capacity of the semiconductor regions 12 of the p-channel type MISFETs Qp for the peripheral circuits lowered in this manner, the speed at which to write and read data to and from the memory cells MC is made higher. That is, the operating speed of the SRAM is enhanced.

The third layer interlayer isolation film 33 is then deposited all over the semiconductor substrate 1. The interlayer isolation film 33 is made illustratively of a four-film layered structure comprising a silicon oxide film, another silicon oxide film, a spin-on glass film and yet another silicon oxide film. The silicon oxide film is formed by the CVD method. The spin-on glass film of the middle layer is deposited by the spin-on method to a thickness of about 200 nm. After being deposited, the spin-on glass film is subjected to the etch-back process to have its surface flattened.

The third layer wiring material is then deposited all over the semiconductor substrate 1. This wiring material is composed of a three-film layered structure comprising a barrier metal film, an aluminum alloy film and another barrier metal film. The barrier metal film is made of TiW, and the aluminum alloy film is formed by an aluminum body mixed with Cu and Si. The TiW film and the aluminum alloy film are formed by sputtering each, with the aluminum alloy film allowed to grow to a thickness of about 800 nm.

Figure 43:
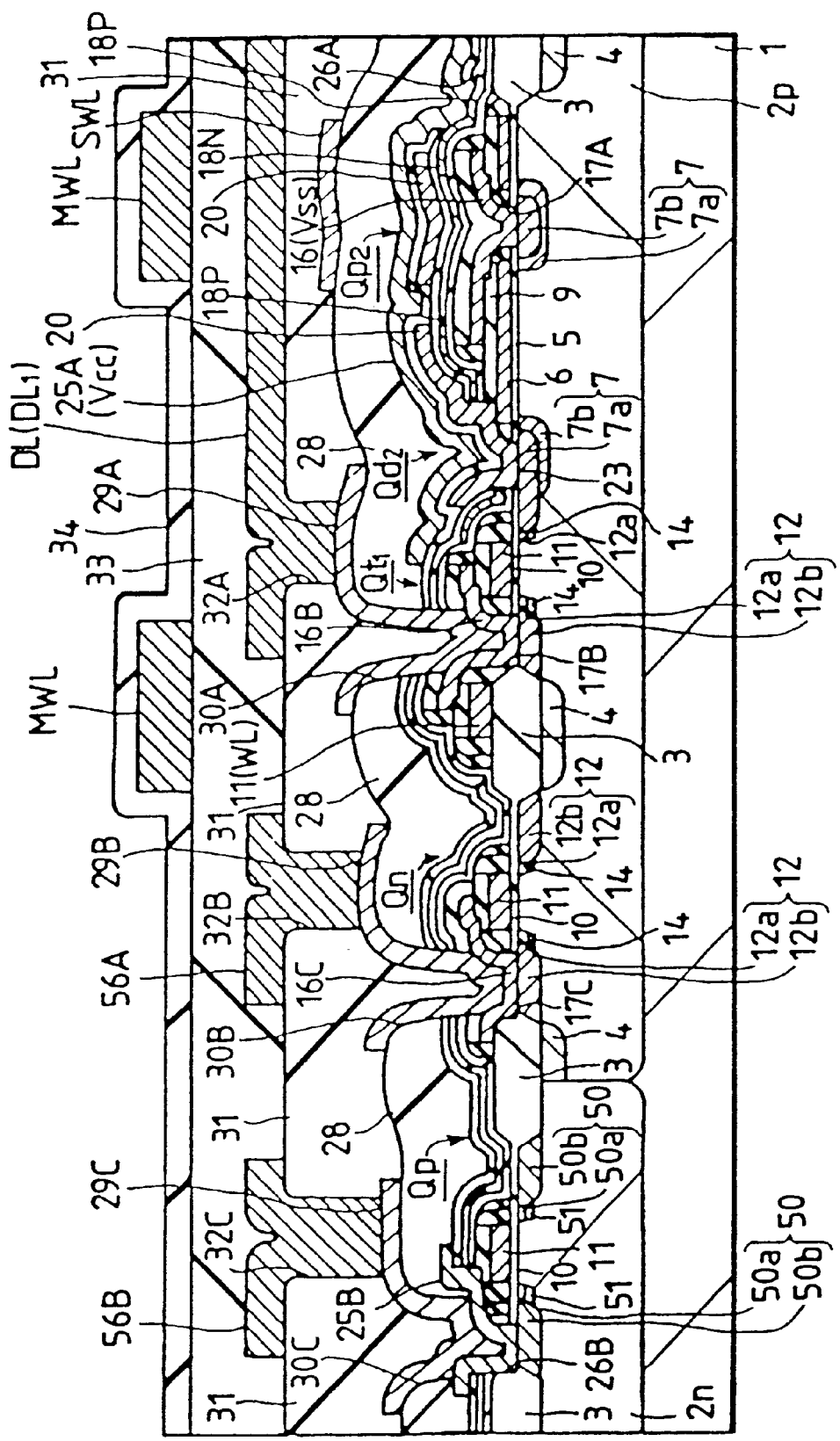
FIG. 43 is another partial sectional view of the semiconductor substrate of the first embodiment, illustrating how the embodiment is manufactured.

A photo resist film, not shown, is then formed over the above-mentioned wiring material. This photo resist film is used as a mask through which to etch the wiring material below. The etching process produces the main word lines MWL on the sub-arrays SMA. After the photo resist film is removed by ashing, the final passivation film 34 is deposited all over the semiconductor substrate 1. The final passivation film 34 is made of a four-film layered structure comprising a silicon oxide film, another silicon oxide film, a silicon nitride film and a polyimide resin film. The silicon oxide film and the silicon nitride film are formed by the CVD method each. The polyimide resin film is deposited by the spin-on method to a thickness of about 10,000 nm (FIG. 43).

The above-described processes complete manufacture of the SRAM according to the invention.

[Second Embodiment]

Described below is an SRAM practiced as the second embodiment of the invention. In the second embodiment, portions of the reference voltage lines ($V_{SS}$) 16A furnished as the source lines common to the driver MISFETs $Qd_1$ and $Qd_2$ for the memory cells MC differ in shape from the comparable portions of the first embodiment.

Figure 44:
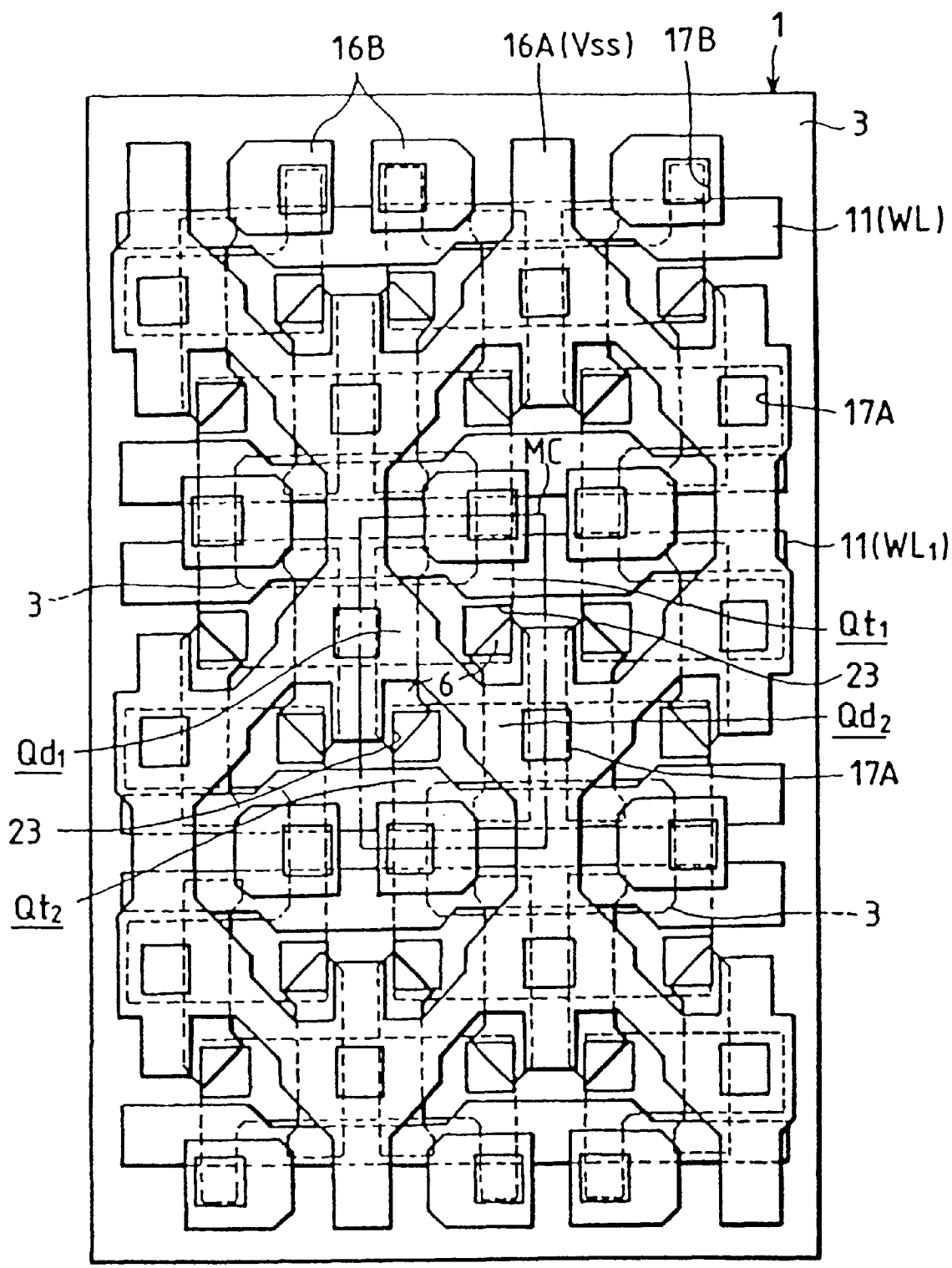
FIG. 44 is a partial plan view of a sub-array pattern layout of a semiconductor integrated circuit device practiced as a second embodiment of the invention.
Figure 45:
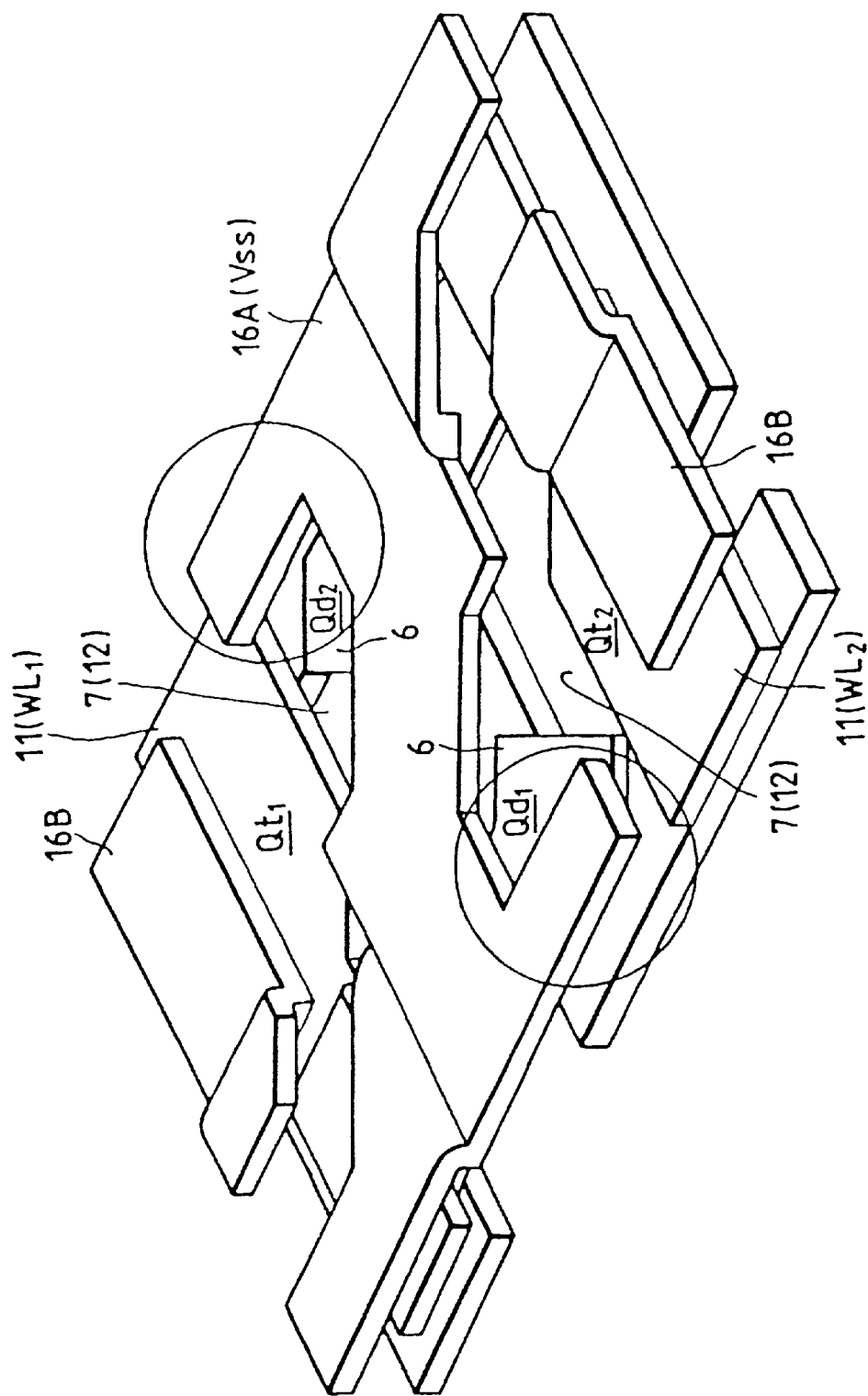
FIG. 45 is a schematic perspective view of a memory cell pattern layout of the second embodiment.

Specifically, as shown in FIGS. 44 and 45, some portions of the reference voltage lines ($V_{SS}$) 16A formed during the process of manufacturing the third layer gate material (the encircled portions in FIG. 45) are extended in the row direction. The reference voltage lines ($V_{SS}$) 16A and the gate electrodes 11 (word lines $WL_1$) enclose the upper part of one of the semiconductor regions (drain region) 7 of the driver MISFET $Qd_1$ (i.e., one of the semiconductor regions 12 of the transfer MISFET $Qt_1$). Likewise, the reference voltage lines ($V_{SS}$) 16A and the gate electrodes 11 (word lines $WL_2$) enclose the upper part of one of the semiconductor regions (drain region) 7 of the driver MISFET $Qd_2$ (i.e., one of the semiconductor regions 12 of the transfer MISFET $Qt_2$). The silicon oxide film 21 as thick as 125 to 155 nm is formed over the reference voltage lines ($V_{SS}$) 16A, and another silicon oxide film 13 with a thickness of 100 to 200 nm is deposited over the word lines WL. That is, the semiconductor regions (drain regions) 7 of the driver MISFETs $Qd_1$ and $Qd_2$ are surrounded by these thick silicon oxide films 13 and 21.

The arrangement above provides greater margins of alignment than before in forming the contact hole 23 interconnecting a plurality of regions and gate electrodes. The regions and gate electrodes to be interconnected via the contact hole 23 on the semiconductor region (drain region) 7 of one driver MISFET Qd include: the semiconductor region (drain region) 7, the drain region 18P of one load MISFET Qp, the gate electrode 20 of the other load MISFET Qp, and the gate electrode 6 of the other driver MISFET Qd.

Even if the positions in which to form the contact hole 23 are misaligned, those portions of the silicon oxide films 13 and 21 which are removed by etching are sufficiently small in quantity compared with the thicknesses of these films.

That is, the silicon oxide films 13 and 21 act as buffer layers for the etching process. This makes it possible to reduce the occupied area of the semiconductor regions (drain regions) 7 of the driver MISFETs Qd as well as the occupied area of the memory cells MC, whereby the degree of integration of the SRAM is enhanced.

[Third Embodiment]

Figure 46:
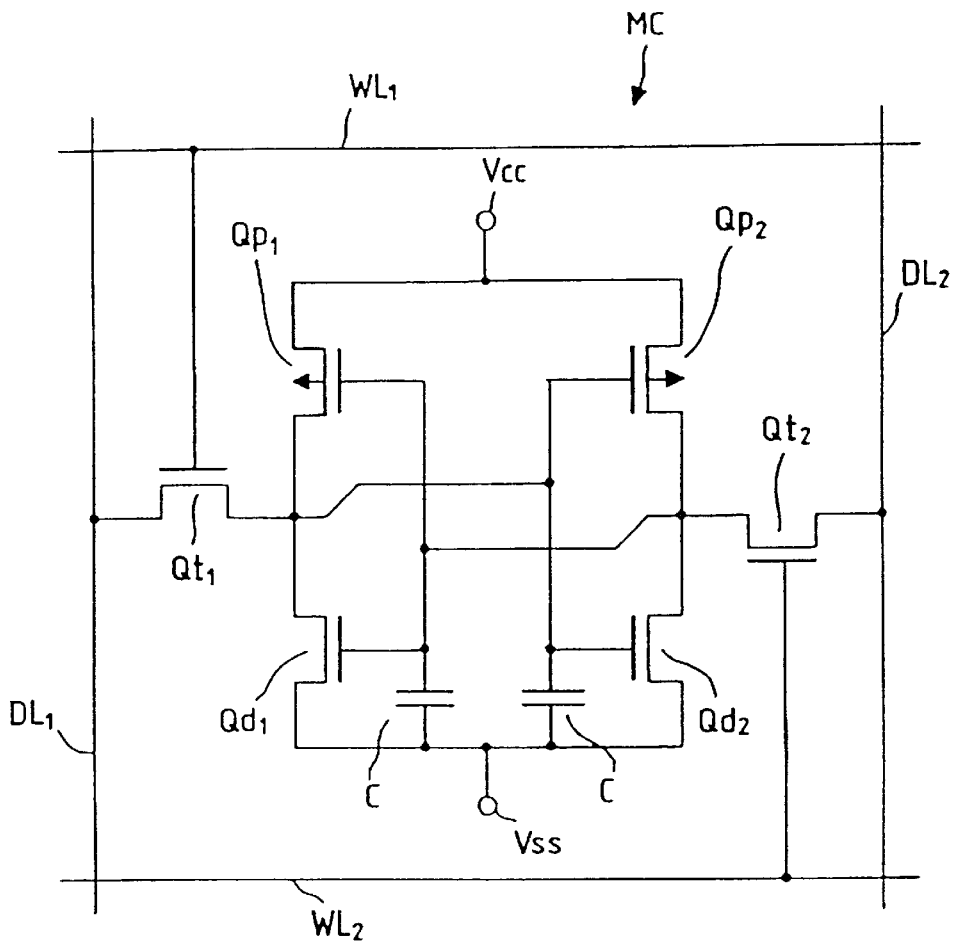
FIG. 46 is an equivalent circuit diagram of a memory cell of a semiconductor integrated circuit device practiced as a third embodiment of the invention.

The memory cells MC of the SRAM practiced as the first embodiment of the invention have two capacitor elements C between the gate electrodes 20 of the load MISFETs $Qp_1$ and $Qp_2$ on the one hand, and the supply voltage lines ($V_{CC}$) 25A on the other. (The gate electrodes 20 are formed during the process of manufacturing the fifth layer gate material, and the supply voltage lines ($V_{CC}$) 25A are furnished during the process of producing the sixth layer gate material.) By contrast, as shown in FIG. 46, the SRAM practiced as the third embodiment of the invention involves having two capacitor elements C between the gate electrodes 6 of the driver MISFETs $Qd_1$ and $Qd_2$ on the one hand, and the reference voltage lines ($V_{SS}$) 16A on the other, the lines 16A being connected to the source regions 7 of the driver MISFETs $Qd_1$ and $Qd_2$.

As such, the capacitor elements C of the third embodiment constitute a stacked structure. In this structure, the gate electrodes 6 of the driver MISFETs $Qd_1$ and $Qd_2$ act as the first electrodes, and the reference voltage lines ($V_{SS}$) 16A as the second electrodes (plate electrodes). Furthermore, the insulating film between the gate electrodes 6 and the reference voltage lines ($V_{SS}$) 16A serves as a dielectric film.

A specific method for manufacturing the capacitor elements C according to the invention will now be described with reference to FIGS. 47 through 53. From the description that follows, the method for manufacturing the n- and p-channel type MISFETs of the peripheral circuits is omitted.

Figure 47:
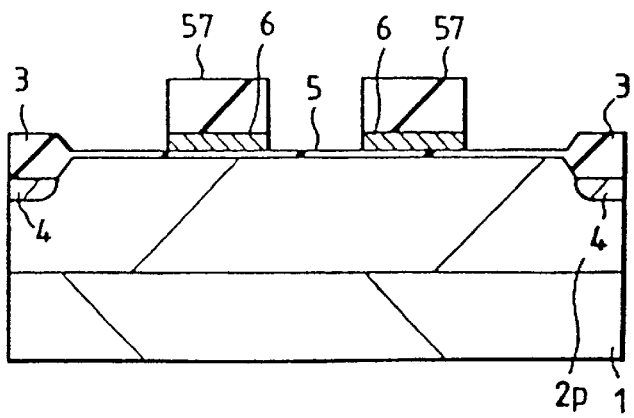
FIG. 47 is a partial sectional view of the semiconductor substrate of the third embodiment, depicting how the embodiment is manufactured.

As with the first embodiment, the gate insulating film 5 of the driver MISFETs $Qd_1$ and $Qd_2$ for the memory cells MC is first formed over the main surface of the active regions for the $p^-$-type wells $2p$ of the semiconductor substrate 1. After this, a polycrystal silicon film, which constitutes the first layer gate material but is not shown, is deposited all over the semiconductor substrate 1. A photo resist film 57 formed over the polycrystal silicon film is used as a mask through which to etch the polycrystal silicon film below. The etching process forms the gate electrodes 6 for the driver MISFETs $Qd_1$ and $Qd_2$ (FIG. 47).

Figure 48:
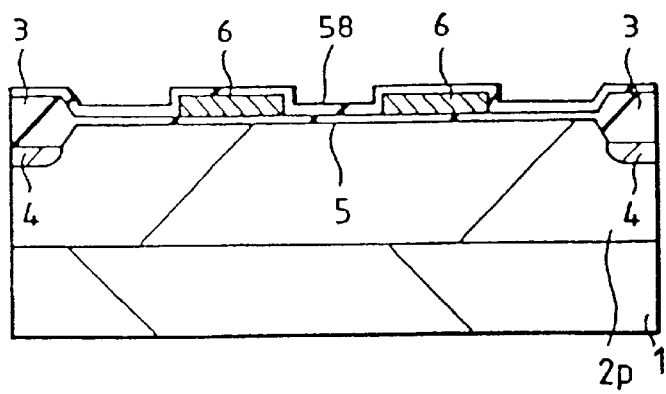
FIG. 48 is another partial sectional view of the semiconductor substrate of the third embodiment, depicting how the embodiment is manufactured.

With the above photo resist film removed by ashing, an insulating film 58 is deposited all over the semiconductor substrate 1 (FIG. 48). The insulating film 58 is made of a layered structure comprising a silicon oxide film (lower layer) and a silicon nitride film (upper layer) formed illustratively by the CVD method each. Alternatively, the insulating film 58 may be composed of a silicon nitride film alone.

Figure 49:
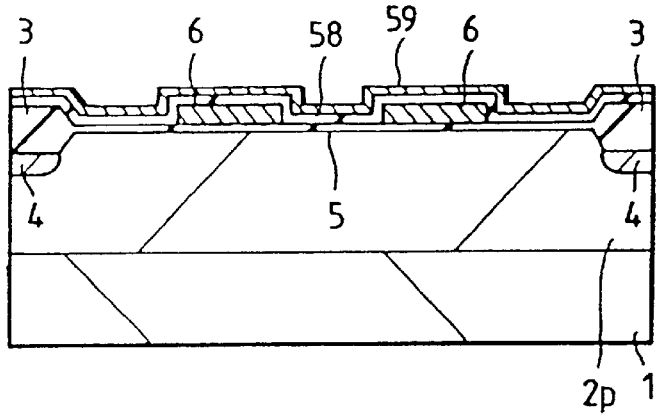
FIG. 49 is another partial sectional view of the semiconductor substrate of the third embodiment, depicting how the embodiment is manufactured.

A polycrystal silicon film 59, which constitutes the second layer gate material, is deposited by the CVD method all over the semiconductor substrate 1 (FIG. 49). While being deposited, the polycrystal silicon film 59 is given n-type impurities (e.g., phosphorus P) to reduce its resistance value.

Although not shown, the main surface of the active regions for the $p^-$-type wells $2p$ on the semiconductor substrate 1 is fed with impurities that are intended to control the threshold value of the transfer MISFETs $Qt_1$ and $Qt_2$. With the impurities added, a thin hydrofluoric acid water solution is used to etch the silicon oxide film for removal from the main surface of the active regions for the $p^-$-type wells $2p$. Then the gate insulating film 10 is formed anew by thermal oxidation.

The third layer gate material, not shown, is deposited all over the semiconductor substrate 1. With a photo resist film formed after the deposition, that photo resist film is used as a mask to etch the third layer gate material below. The etching process forms the gate electrodes 11 (and word lines WL) of the transfer MISFETs $Qt_1$ and $Qt_2$. The gate electrodes 11 (and word lines WL) are made of a polycide film comprising a polycrystal silicon film and a tungsten silicide ($WSi_x$) film. While being deposited, the polycrystal silicon film of the lower layer is given n-type impurities (e.g., phosphorus (p)) to reduce its resistance value.

After the above photo resist film is removed by ashing, a new photo resist film, not shown, is formed over the main surface of the semiconductor substrate 1. The new photo resist film is used as a mask through which to add successively p-type impurities (e.g., $BF_2$) and then n-type impurities (e.g., phosphorus P) to that main surface part of the semiconductor substrate 1 which includes the regions for accommodating the transfer MISFETs $Qt_1$ and $Qt_2$. Thereafter, the photo resist film is removed by ashing. The n- and p-type impurities added to the main surface of the semiconductor substrate 1 are allowed to diffuse therein. Diffusion of the impurities forms the n-type semiconductor regions 12a and p-type semiconductor regions 14 over that main surface of the semiconductor substrate 1 which includes the source- and drain-forming regions of the transfer MISFETs $Qt_1$ and $Qt_2$.

A photo resist film, not shown, is formed over the main surface of the semiconductor substrate 1. This photo resist film is used as a mask through which to add n-type impurities (e.g., phosphorus (P)) to that main surface part of the semiconductor substrate 1 which includes the regions for accommodating the driver MISFETs $Qd_1$ and $Qd_2$. After the above photo resist film is removed by ashing, a new photo resist film, not shown, is formed over the main surface of the semiconductor substrate 1. The new photo resist film is used as a mask through which to add n-type impurities (e.g., arsenic (As)) to that main surface part of the semiconductor substrate 1 which includes the regions for accommodating the transfer MISFETs $Qt_1$ and $Qt_2$.

Figure 50:
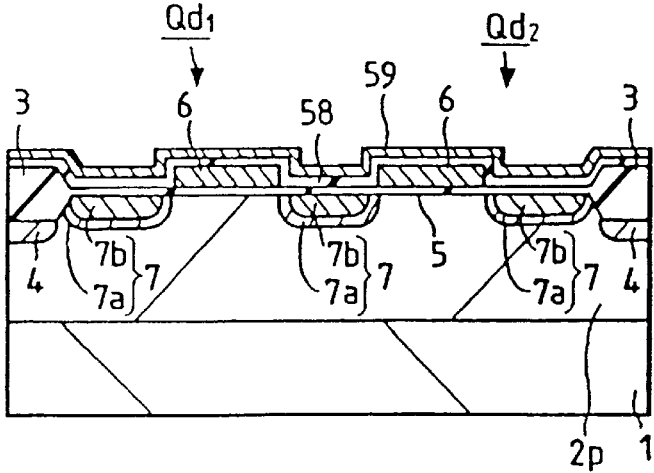
FIG. 50 is another partial sectional view of the semiconductor substrate of the third embodiment, depicting how the embodiment is manufactured.

With the above photo resist film removed by ashing, the n-type impurities added to the main surface of the semiconductor substrate 1 are allowed to diffuse therein. Two kinds of n-type impurities (phosphorus(P) and arsenic (AS)) having different diffusion rates and different densities have by this time been added to that main surface part of the semiconductor substrate 1 which includes the regions for accommodating the driver MISFETs $Qd_1$ and $Qd_2$. The As impurities form the $n^+$-type semiconductor regions 7b of high impurity density, and the P impurities form the n-type semiconductor regions 7a of low impurity density under the regions 7b. This in turn forms the semiconductor regions (source and drain regions) 7 of the driver MISFETs $Qd_1$ and $Qd_2$ over the main surface of the semiconductor substrate 1. Now the driver MISFETs $Qd_1$ and $Qd_2$ are complete (FIG. 50).

Figure 51:
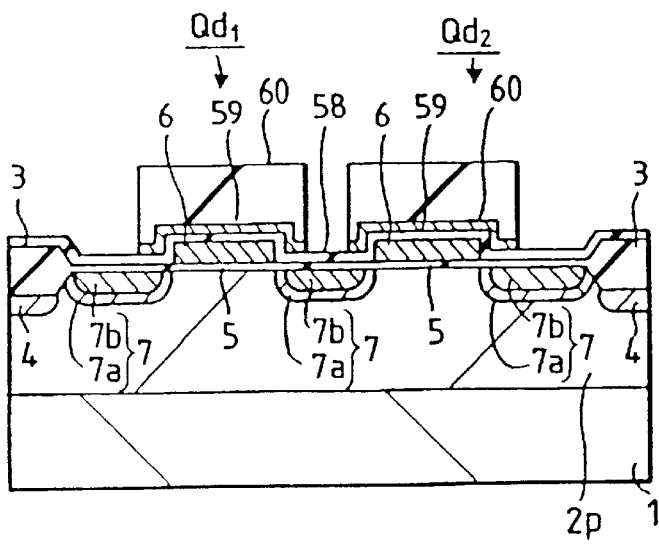
FIG. 51 is another partial sectional view of the semiconductor substrate of the third embodiment, depicting how the embodiment is manufactured.

After a photo resist film 60 is formed over the main surface of the semiconductor substrate 1, that film 60 is used as a mask through which to etch the polycrystal silicon film (i.e., second layer gate material) above the insulating film 58. The etching process leaves intact the polycrystal silicon film 59 in such a way that it covers the gate electrodes 6 of the driver MISFETs $Qd_1$ and $Qd_2$ (FIG. 51). The insulating film 58 under the polycrystal silicon film 59 is composed of a silicon nitride film (and a silicon oxide film thereunder). That silicon nitride film acts as a stopper against etching, leaving the gate electrodes 6 of the driver MISFETs $Qd_1$ and $Qd_2$ intact.

Figure 52:
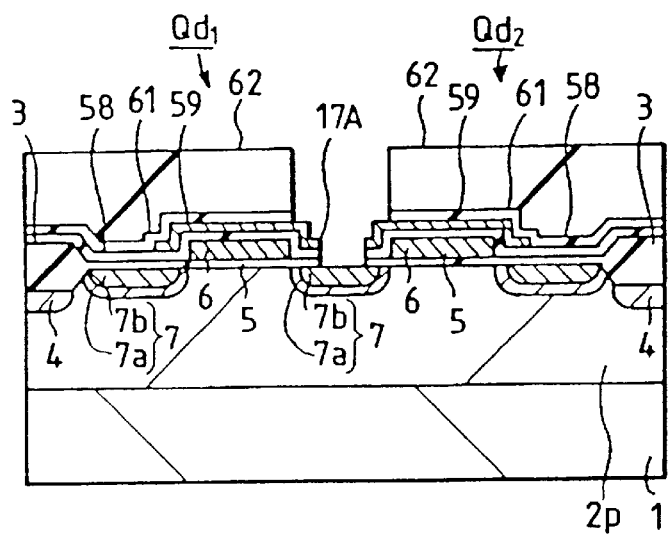
FIG. 52 is another partial sectional view of the semiconductor substrate of the third embodiment, depicting how the embodiment is manufactured.

An insulating film 61 is then deposited all over the main surface of the semiconductor substrate 1. The insulating film 61 comprises a silicon oxide film formed by the CVD method. A photo resist film 62, after being formed over the insulating film 61, is used as a mask with which to bore a hole through the insulating film 61, insulating film 58 and gate insulating film 5. This is the contact hole 17A made on one of the semiconductor regions (source region) 7 of the driver MISFETs $Qd_1$ and $Qd_2$ (FIG. 52).

After the above photo resist film 62 is removed by ashing, the fourth layer gate material, not shown, is deposited all over the semiconductor substrate 1. The gate material is made of a polycide film comprising a polycrystal silicon film and a tungsten silicide ($WSi_x$) film. While being deposited, the polycrystal silicon film is given n-type impurities (e.g., phosphorus (P))to reduce its resistance value.

Figure 53:
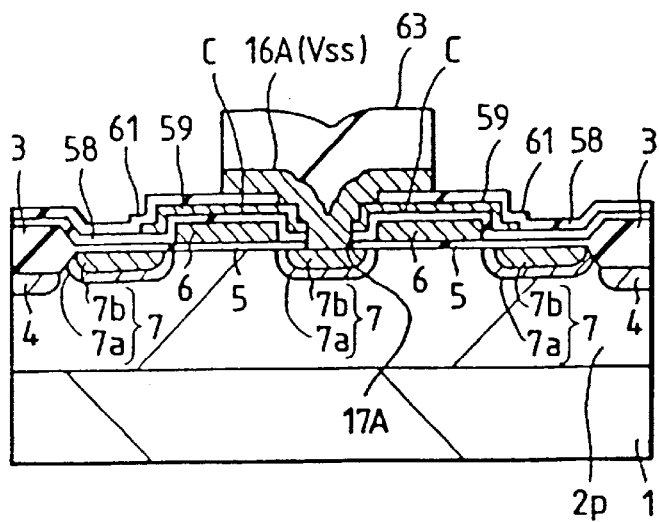
FIG. 53 is another partial sectional view of the semiconductor substrate of the third embodiment, depicting how the embodiment is manufactured.

Then a photo resist film 63 is formed over the fourth layer gate material (polycide film). The photo resist film 63 is used as a mask through which to etch the fourth layer gate material (polycide film) from the top component film downward. The etching process forms the reference voltage lines ($V_{SS}$) 16A that are connected via the contact hole 17A to one of the semiconductor regions (source region) 7 of the driver MISFETs $Qd_1$ and $Qd_2$. At the same time, capacitor elements C are formed in a stacked structure (FIG. 53). In this structure, the gate electrodes 6 of the driver MISFETs $Qd_1$ and $Qd_2$ act as the first electrodes, and the reference voltage lines ($V_{SS}$) 16A as the second electrodes (plate electrodes). The insulating films 58 and 61 serve as dielectric films between the gate electrodes 6 and the reference voltage lines ($V_{SS}$) 16A.

The capacitor elements C of the third embodiment described above are arranged so that the polycrystal silicon film 59 over the gate electrodes 6 of the driver MISFETs $Qd_1$ and $Qd_2$ are connected via the side wall of the contact hole 17B to the reference voltage lines ($V_{SS}$) 16A. This connective arrangement makes effectively thinner the dielectric films (insulating films 58 and 61) between the gate electrodes 6 and the reference voltage lines ($V_{SS}$) 16A. That in turn provides for a greater capacity of the capacitor elements C, whereby the resistance of the memory cells MC to α-ray soft errors is improved.

[Fourth Embodiment]

Figure 54:
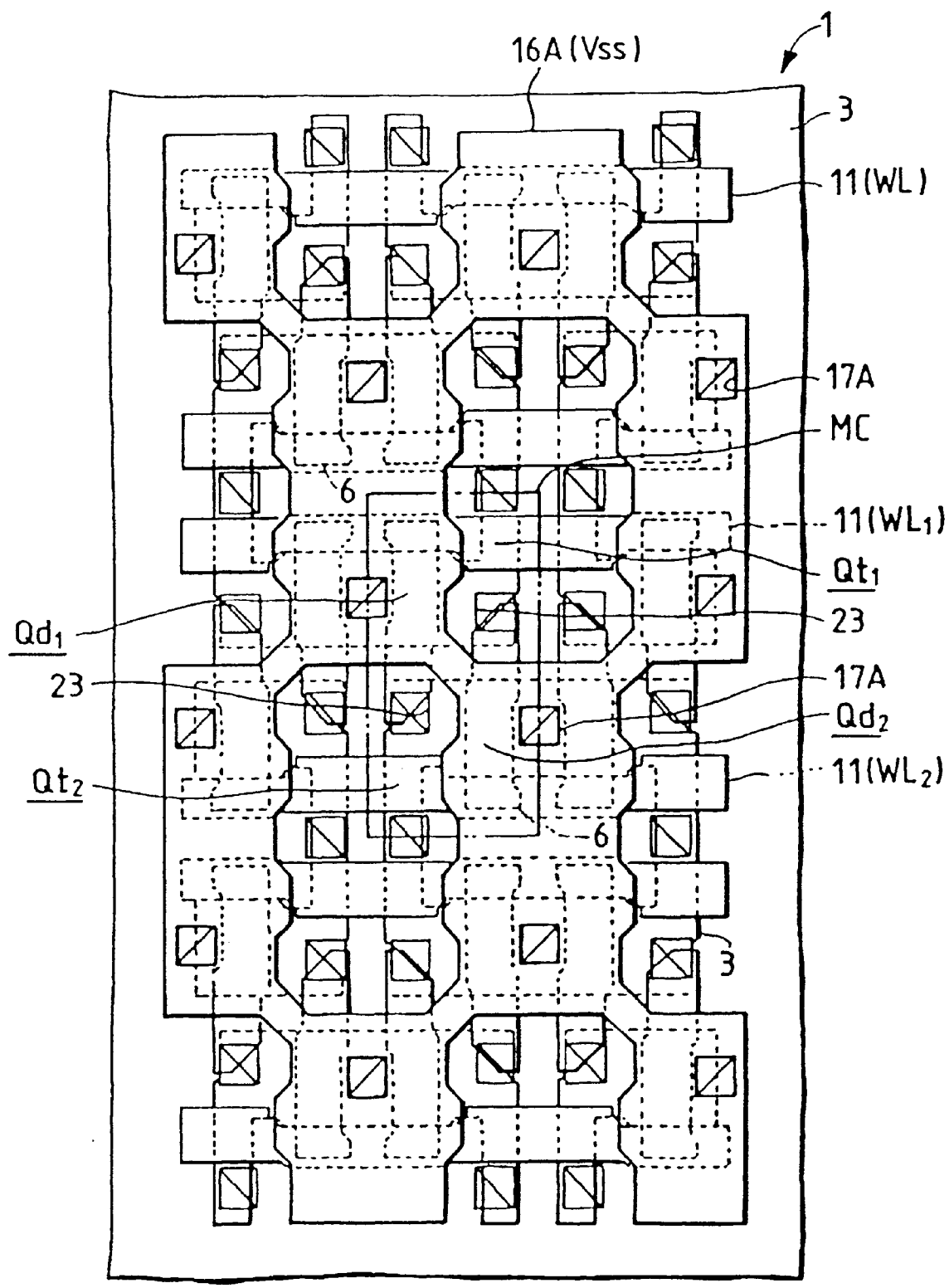
FIG. 54 is a partial plan view of a sub-array pattern layout of a semiconductor integrated circuit device practiced as a fourth embodiment of the invention.

FIG. 54 is a partial plan view of a sub-array pattern layout of a semiconductor integrated circuit device (SRAM in this case) practiced as the fourth embodiment of the invention. As shown in FIG. 54, the memory cells MC of the SRAM are arranged in such a way that the first conductive strip formed over the main surface of the semiconductor substrate 1 constitutes the gate electrodes 6 of the driver MISFETs $Qd_1$ and $Qd_2$. In the same arrangement, the second conductive strip formed over the gate electrodes 6 constitutes the gate electrodes 11 (word lines WL) of the transfer MISFETs $Qt_1$ and $Qt_2$, and the third conductive strip formed over the gate electrodes 11 (word lines WL) constitutes the reference voltage lines ($V_{SS}$) 16A.

Figure 55:
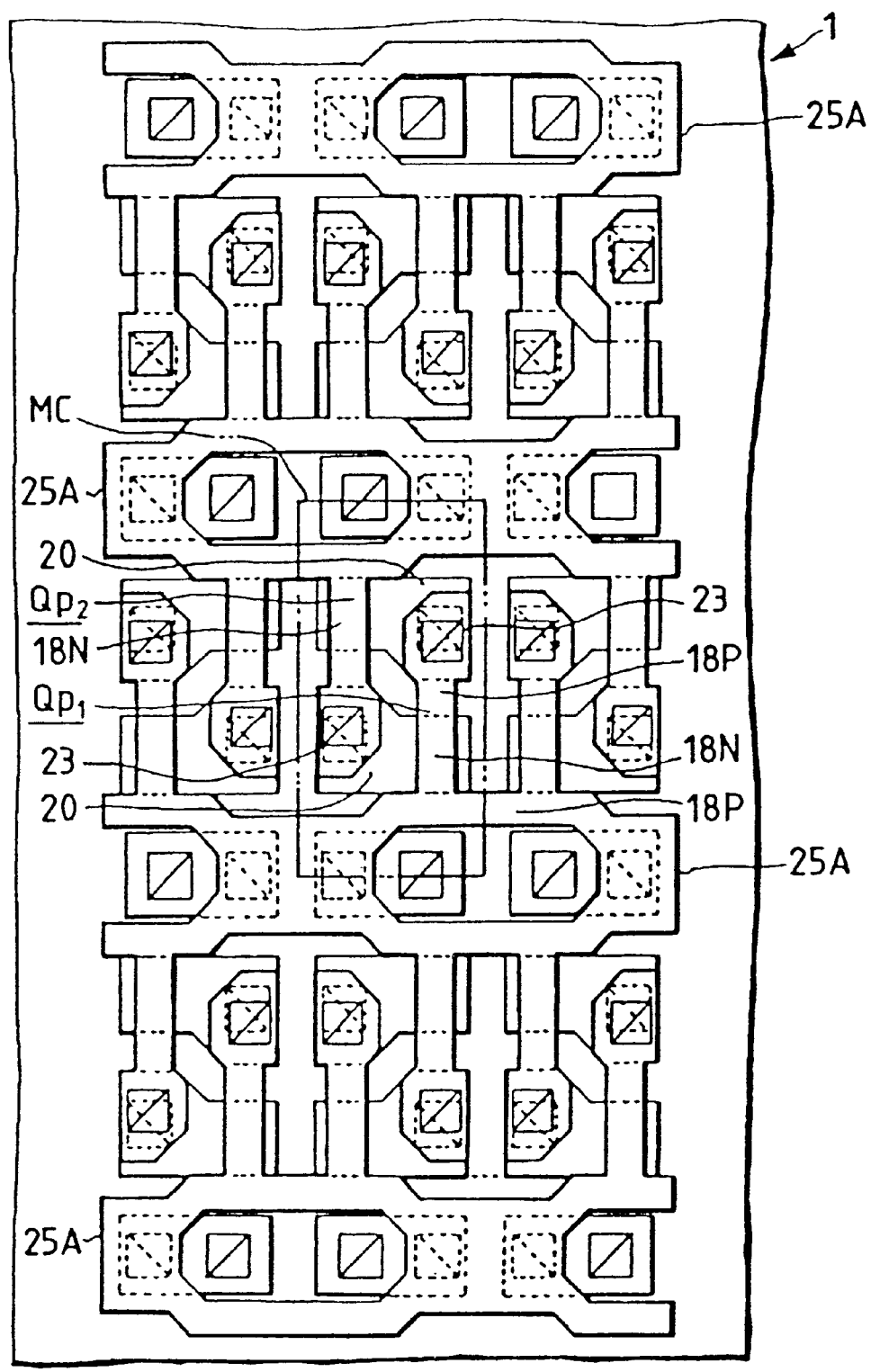
FIG. 55 is a partial plan view of another sub-array pattern layout of the fourth embodiment.

As depicted in FIG. 55, the fourth conductive strip formed over the reference voltage lines ($V_{SS}$) 16A constitutes the gate electrodes 20 of the load MISFETs $Qp_1$ and $Qp_2$. The fifth conductive strip formed over the gate electrodes 20 constitutes the source regions 18P, channel regions 18N and drain regions 18P of the load MISFETs $Qp_1$ and $Qp_2$. The fifth conductive strip also constitutes the supply voltage lines ($V_{CC}$) 25A. That is, the supply voltage lines ($V_{CC}$) 25A are formed integrally with the source regions 18P, channel regions 18N and drain regions 18P of the load MISFETs $Qp_1$ and $Qp_2$ As described, the difference between the fourth and the first embodiments is that in the memory cell layout, the conductive strip constituting the source regions 18P, channel regions 18N and drain regions 18P of the load MISFETs $Qp_1$ and $Qp_2$, and the conductive strip constituting the gate electrodes 20 of the load MISFETs $Qp_1$ and $Qp_2$, are switched in the vertical direction between the two embodiments. For a better view, FIG. 55 omits such components under the gate electrodes 20 of the load MISFETs $Qp_1$ and $Qp_2$ as the reference voltage lines ($V_{SS}$) 16A, driver MISFETs $Qd_1$ and $Qd_2$, transfer MISFETs $Qt_1$ and $Qt_2$, and field insulating film 3.

A typical method for manufacturing the load MISFETs $Qp_1$ and $Qp_2$ of the fourth embodiment will now be described with reference to FIGS. 56 through 59. The description that follows excludes the explanation of the method for manufacturing the reference voltage lines ($V_{SS}$) 16A, driver MISFETs $Qd_1$ and $Qd_2$ and transfer MISFETs $Qt_1$ and $Qt_2$ of the memory cell MC. Also excluded is the explanation of the method for manufacturing the n- and p-channel type MISFETs of the peripheral circuits.

Figure 56:
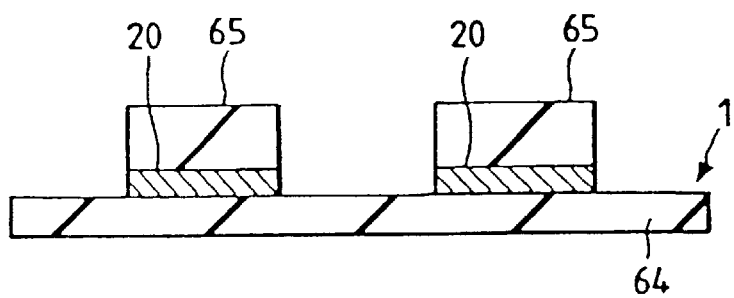
FIG. 56 is a partial sectional view of the semiconductor substrate of the fourth embodiment, showing how the embodiment is manufactured.

A polycrystal silicon film, not shown, is initially deposited over an insulating film 64 of the semiconductor substrate 1 as the fourth layer gate material. Under the insulating film 64 are the reference voltage lines ($V_{SS}$) 16A composed of the third layer gate material, not shown. The polycrystal silicon film is formed by the CVD method. While being deposited, the polycrystal silicon film is given n-type impurities (e.g., phosphorus P) to reduce its resistance value. A photo resist film 65 is then formed over the polycrystal silicon film. The photo resist film 65 is used as a mask through which to etch the polycrystal silicon film below. The etching process forms the gate electrodes 20 of the load MISFETs $Qp_1$ and $Qp_2$ (FIG. 56).

Figure 57:
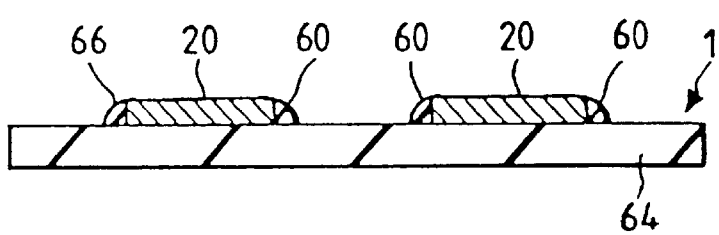
FIG. 57 is another partial sectional view of the semiconductor substrate of the fourth embodiment, showing how the embodiment is manufactured.

After the photo resist film 65 is removed by ashing, a silicon oxide film, not shown, is deposited all over the semiconductor substrate 1. The silicon oxide film is etched by the anisotropic etching method such as RIE. The etching process produces side wall spacers 66 on the side walls of the gate electrodes 20 for the load MISFETs $Qp_1$ and $Qp_2$ (FIG. 57).

Figure 58:
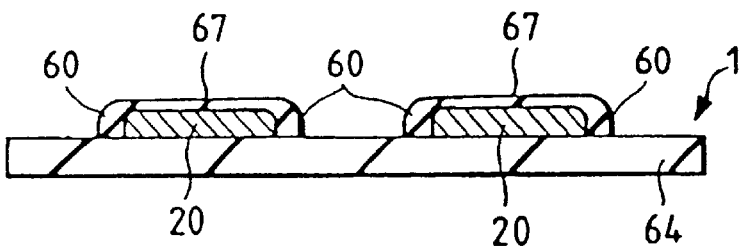
FIG. 58 is another partial sectional view of the semiconductor substrate of the fourth embodiment, showing how the embodiment is manufactured.

The gate electrodes 20 of the load MISFETs $Qp_1$ and $Qp_2$ are then subjected to thermal oxidation, which produces a gate insulating film 67 for the load MISFETs $Qp_1$ and $Qp_2$ over the gate electrodes 20 (FIG. 58). The thermal oxidation process rounds the edges of the gate electrodes 20 of the load MISFETs $Qp_1$ and $Qp_2$ as a result of heat-induced deformation.

Figure 59:
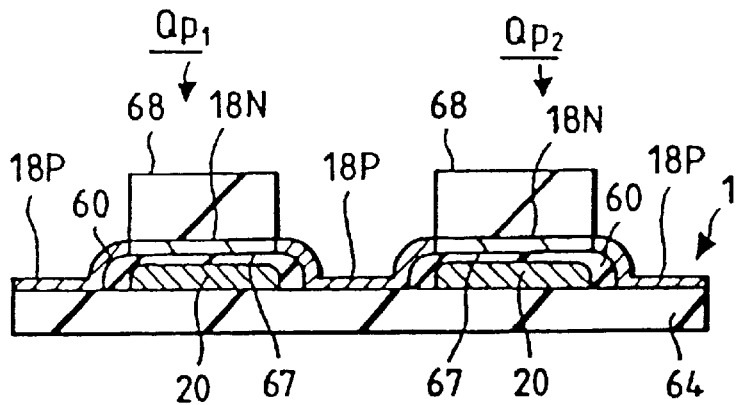
FIG. 59 is another partial sectional view of the semiconductor substrate of the fourth embodiment, showing how the embodiment is manufactured.

After the thermal oxidation, a polycrystal silicon film constituting the fifth layer gate material is deposited by the CVD method all over the semiconductor substrate 1. Then n-type impurities (e.g., phosphorus (P)) are added through ion implantation to the polycrystal silicon film in order to set the threshold voltage of the load MISFETs $Qp_1$ and $Qp_2$ for the enhancement type. With the ion implantation finished, a photo resist film 68 is formed over the polycrystal silicon film. This photo resist film 68 is used as a mask through which to add p-type impurities (e.g., $BF_2$) to part of the polycrystal silicon film. Addition of the p-type impurities forms the drain and the source regions 18P of the load MISFETs $Qp_1$ and $Qp_2$. The channel regions 18N of the load MISFETs $Qp_1$ and $Qp_2$ are formed between the drain and the source regions 18P. This completes the load MISFETs $Qp_1$ and $Qp_2$ (FIG. 59).

The load MISFETs $Qp_1$ and $Qp_2$ of the fourth embodiment formed as described have the side walls of their gate electrodes 20 protected by the side wall spacers 66 and have the edges of the gate electrodes 20 rounded by thermal oxidation. This structure improves the dielectric strength of the gate insulating film 67 formed over the gate electrodes 20. In addition, the gate insulating film 67 formed by thermal oxidation with the fourth embodiment offers higher levels of dielectric strength than that formed by the CVD method. This enhances the reliability of the load MISFETs $Qp_1$ and $Qp_2$.

Figure 60:
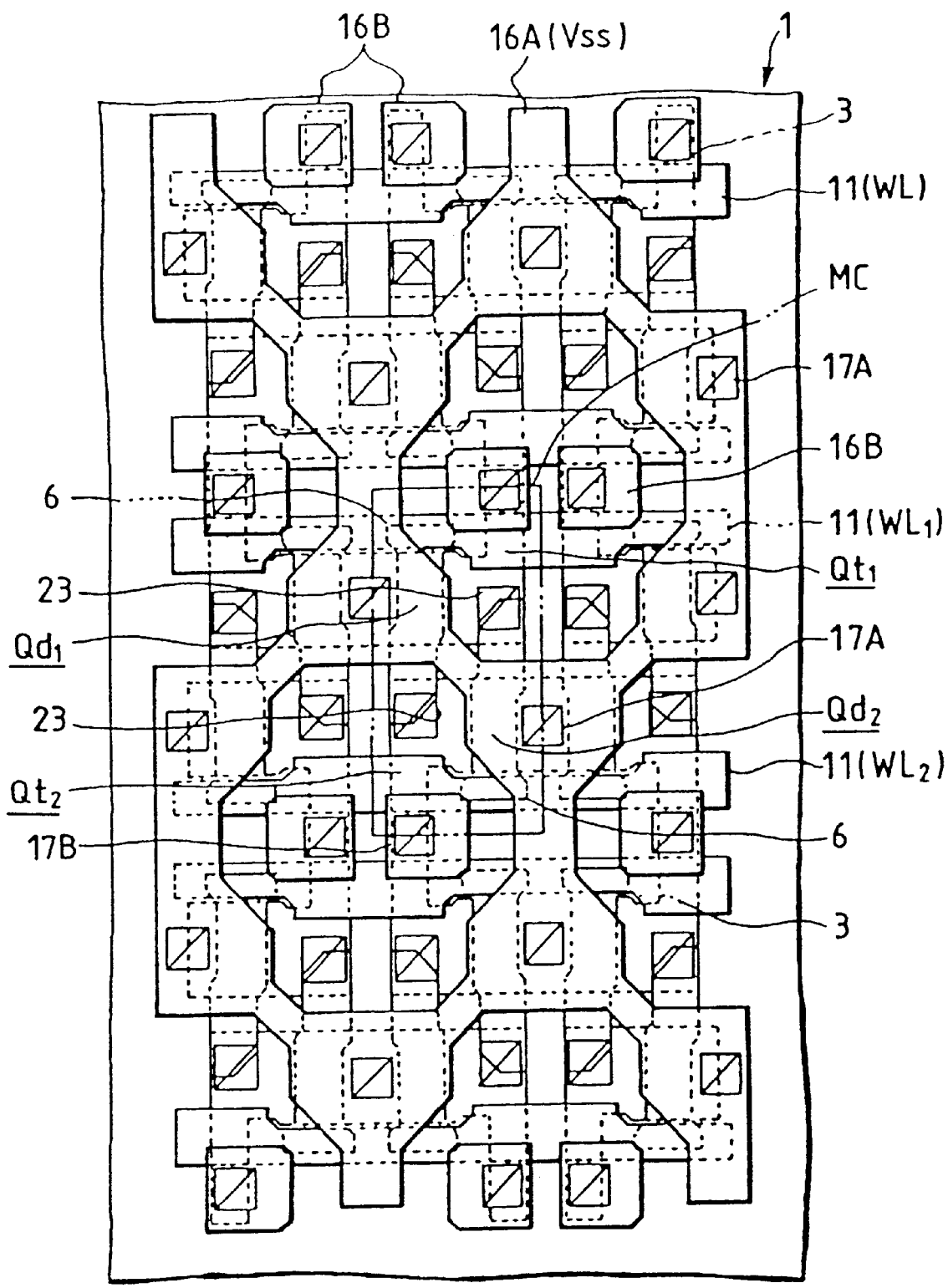
FIG. 60 is a partial plan view of a sub-array pattern layout constituting a variation of the fourth embodiment.

As a variation of the fourth embodiment, the gate electrodes 6 of the driver MISFETs $Qd_1$ and $Qd_2$, the gate electrodes 11 (word lines WL) of the transfer MISFETs $Qt_1$ and $Qt_2$, and the reference voltage lines ($V_{SS}$) 16A may be patterned as shown in FIG. 60 in the memory cell constitution of the SRAM.

Figure 61:
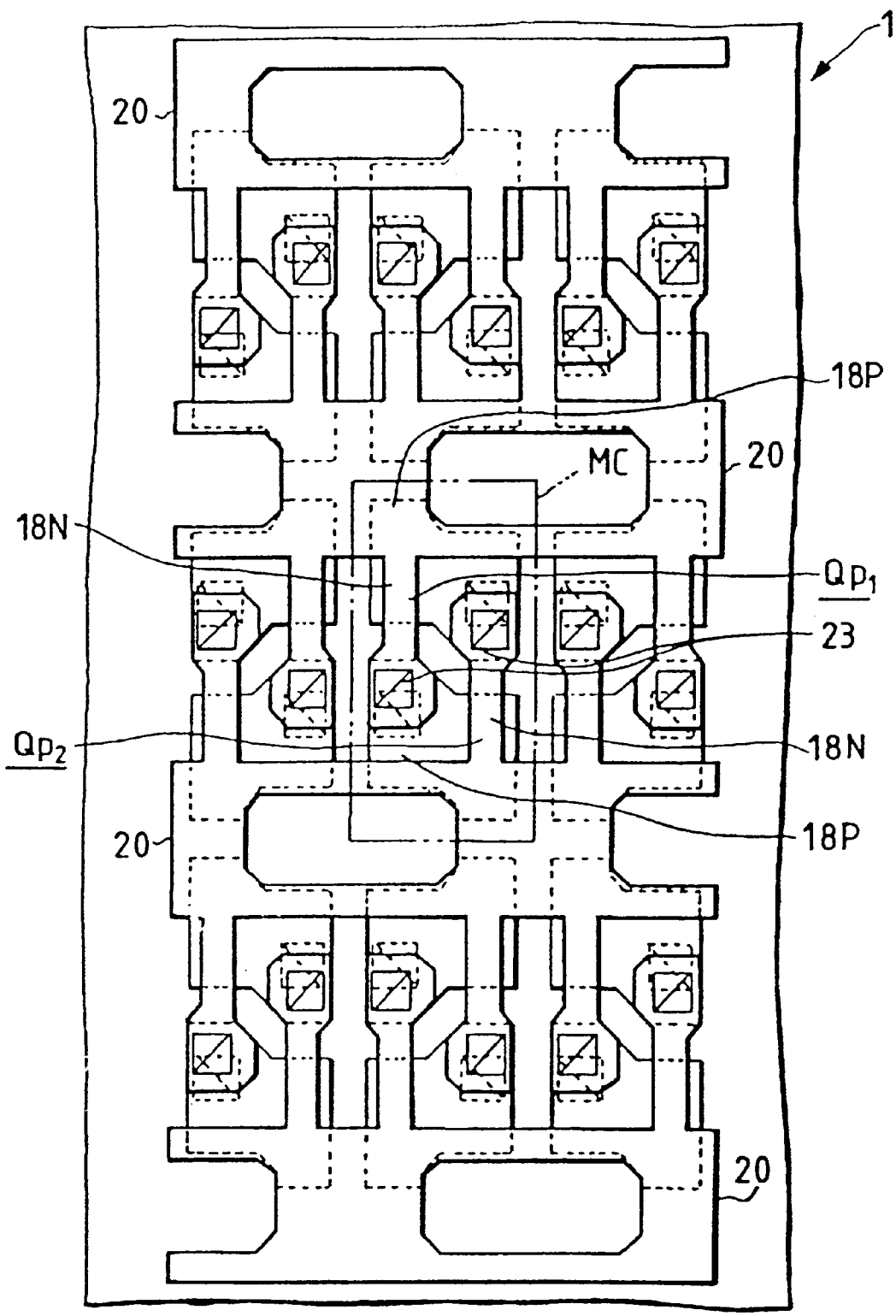
FIG. 61 is a partial plan view of another sub-array pattern layout constituting another variation of the fourth embodiment.

As another variation of the fourth embodiment, the gate electrodes 20 of the load MISFETs $Qp_1$ and $Qp_2$; the source region 18P, channel regions 18N and drain regions 18P of the load MISFETs $Qp_1$ and $Qp_2$; and the supply voltage lines ($V_{CC}$) 25A, may be patterned as depicted in FIG. 61. For a better view, FIG. 61 omits such components under the gate electrodes 20 of the load MISFETs $Qp_1$ and $Qp_2$ as the reference voltage lines ($V_{SS}$) 16A, driver MISFETs $Qd_1$ and $Qd_2$, transfer MISFETs $Qt_1$ and $Qt_2$, and field insulating film 3.

While preferred embodiments of the invention have been described using specific terms, such description is for illustrative purposes only, and it is to be understood that changes and variations may be made without departing from the spirit or scope of the claims that follow.

The major benefits of the present invention are recapitulated below.

(1) According to the invention, the capacitor elements C of large capacitance are formed between the gate electrodes of the load MISFETs on the one hand, and the supply voltage lines occupying a large area over these gate electrodes on the other. This structure enhances the resistance of the memory cells in the SRAM to α-ray soft errors.

(2) According to the invention, holes are made on part of the supply voltage lines so as to reduce the resistivity thereof. The structure thus prevents drops in the supply voltage fed through the supply voltage lines to the memory cells, whereby stable SRAM operation is ensured.

(3) According to the invention, one contact hole interconnects the drain region of one driver MISFET, the gate electrode of one load MISFET, the drain region of the other load MISFET, and the gate electrode of the other driver MISFET over the main surface of the semiconductor substrate. Compared with prior art setups where these conductive strips are connected via a plurality of contact holes, this single contact hole structure reduces the memory cell area by the amount equivalent to the multiple contact holes eliminated. In addition, the single contact hole structure requires fewer steps to follow for the manufacture thereof than the multiple contact hole setups.

(4) According to the invention, the contact hole formed on the drain regions of the driver MISFETs is surrounded by a thick insulating film. The structure provides greater margins of alignment for the contact hole to be formed. That in turn reduces the area of the drain regions of the driver MISFETs, whereby the degree of integration of the SRAM is enhanced.

(5) According to the structure, the data lines are connected to the drain regions of the transfer MISFETs via the pad layer made of the conductive strip constituting the reference voltage lines. The structure eliminates the need for margins of alignment for the contact hole to be formed on the drain regions. This reduces the necessary area of the drain regions of the transfer MISFETs, whereby the degree of integration of the SRAM is boosted.

(6) According to the invention, one semiconductor region of the n-channel MISFETs constituting part of the peripheral circuits is wired via the pad layer formed by the conductive strip constituting the reference voltage lines. The structure eliminates the need for margins of alignment for the contact hole to be formed on that semiconductor region. This reduces the semiconductor region area of the n-channel MISFETs, whereby the degree of integration of the SRAM is improved.

(7) According to the invention, one semiconductor region of the p-channel MISFETs constituting part of the peripheral circuits is wired via the pad layer formed by the conductive strip constituting the supply voltage lines. The structure eliminates the need for margins of alignment for the contact hole to be formed on that semiconductor region. This reduces the semiconductor region area of the p-channel MISFETs, whereby the degree of integration of the SRAM is increased.

(8) According to the invention, the asymmetrically constructed n-channel MISFETs constituting part of the peripheral circuits have the source regions formed in the double diffused drain structure. This setup reduces the resistance value of the source regions and prevents voltage drops, whereby the operating speed of the SRAM is increased.

(9) According to the invention, the low-density p-type semiconductor regions are formed under the low-density n-type semiconductor regions. This structure minimizes the short channel effect of the n-channel MISFETs, whereby the SRAM is boosted in terms of reliability and degree of integration.

(10) According to the invention, the low-density n-type semiconductor regions are formed under the low-density p-type semiconductor regions. This structure minimizes the short channel effect of the p-channel MISFETs, whereby the SRAM is enhanced in terms of reliability and degree of integration.

(11) According to the invention, the insulating film under the conductive strip making up the supply voltage lines is constituted by a silicon oxide film and a silicon nitride film, the latter film being deposited over the former in layered fashion. When that conductive strip is etched to form the supply voltage lines, the insulating film under the conductive strip is protected from erosion. Thus the structure improves the dielectric strength of the capacitor elements constituted by the conductive strip, by the insulating film under the strip and by another conductive strip under the insulating film. That in turn enhances the resistance of the memory cells in the SRAM to α-ray soft errors.

(12) According to the invention, side wall spacers are formed on the side wall of the gate electrodes of the load MISFETs. The side wall spacers protect the edges of the gate electrodes. Thermally oxidizing the gate electrodes rounds the edges thereof, which improves the dielectric strength of the gate insulating film of the load MISFETs. This enhances the reliability of the SRAM. In addition, the gate insulating film offers a higher dielectric strength when formed by thermal oxidation than by the CVD method. Thus the SRAM is further improved in terms of reliability.

(13) According to the invention, capacitor elements are formed between the gate electrodes of the driver MISFETs and the reference voltage lines. The second conductive strip is formed between the first and the second insulating films constituting the dielectric film of the capacitor elements. This arrangement makes it possible effectively-to reduce the thickness of the dielectric film, whereby the capacitance of the capacitor elements is boosted and the resistance of the memory cells in the SRAM to α-ray soft errors is improved.

What is claimed is:

1. A semiconductor integrated circuit device, comprising:
   a first n-channel MISFET and a second n-channel MISFET, each formed on a semiconductor substrate and having a gate electrode formed over said substrate and extending over a channel-forming region thereof;
   a first p-channel MISFET and a second p-channel MISFET, each formed on said substrate and having a gate electrode formed over said substrate and extending over a channel-forming region thereof;
   a first conductive strip extending over said substrate, a drain region of said first n-channel MISFET, and a drain region of said first p-channel MISFET, said first conductive strip being electrically connected to said drain region of said first n-channel MISFET, said drain region of said first p-channel MISFET, said gate electrode of said second p-channel MISFET;
   a second conductive strip extending over said substrate, a drain region of said second n-channel MISFET, and a drain region of said second p-channel MISFET, said second conductive strip being electrically connected to said drain region of said second n-channel MISFET, said drain region of said second p-channel MISFET, said gate electrode of said first n-channel MISFET, and said gate electrode of said first p-channel MISFET;
   a dielectric film extending over said first conductive strip and said second conductive strip, and said gate electrodes of said first and second p-channel MISFETs; and
   a first power voltage line formed on said dielectric film and extending over said first conductive strip, said second conductive strip, and said gate electrodes of said first and second p-channel MISFETs,
   wherein a first capacitor element is comprised of said first conductive strip, said dielectric film, and said first power voltage line, and
   wherein a second capacitor element is comprised of said second conductive strip, said dielectric film, and said first power voltage line.

2. A semiconductor integrated circuit device according to claim 1, wherein said dielectric film contains a silicon nitride film.

3. A semiconductor integrated circuit device according to claim 1, wherein said dielectric film has a thickness less than that of said first conductive strip and said second conductive strip.

4. A semiconductor integrated circuit device, comprising:
   a first n-channel MISFET and a second n-channel MISFET of a memory cell of a static random access memory, each formed on a semiconductor substrate and having a gate electrode formed over said substrate and extending over a channel-forming region thereof;
   a first p-channel MISFET and a second p-channel MISFET of said memory cell, each formed on said substrate and having a gate electrode formed over said substrate and extending over a channel-forming region thereof;
   a first conductive strip extending over said substrate, a drain region of said first n-channel MISFET, and a drain region of said first p-channel MISFET, said first conductive strip being electrically connected to said drain region of said first n-channel MISFET, said drain region of said first p-channel MISFET, said gate electrode of said second n-channel MISFET, and said gate electrode of said second p-channel MISFET;
   a second conductive strip extending over said substrate, a drain region of said second n-channel MISFET, and a drain region of said second p-channel MISFET, said second conductive strip being electrically connected to said drain region of said second n-channel MISFET, said drain region of said second p-channel MISFET, said gate electrode of said first n-channel MISFET, and said gate electrode of said first p-channel MISFET;

a dielectric film extending over said first conductive strip and said second conductive strip; and a first power voltage line formed on said dielectric film and extending over said first conductive strip, said second conductive strip, and said gate electrodes of said first and second p-channel MISFETs, wherein said first power voltage line is formed to cover said first conductive strip and said second conductive strip, wherein a first capacitor element is comprised of said first conductive strip, said dielectric film, and said first power voltage line, and wherein a second capacitor element is comprised of said second conductive strip, said dielectric film, and said first power voltage line.

5. A semiconductor integrated circuit device according to claim 4, wherein said first power voltage line is formed to cover said first and second p-channel MISFETs.

6. A semiconductor integrated circuit device according to claim 4, wherein said dielectric film contains a silicon nitride film.

7. A semiconductor integrated circuit device according to claim 4, wherein said dielectric film has a thickness less than that of said first conductive strip and said second conductive strip.

8. A semiconductor integrated circuit device, comprising:

a first n-channel MISFET and a second n-channel MISFET of a memory cell of a static random access memory, each formed on a semiconductor substrate and having a gate electrode formed over said substrate and extending over a channel-forming region thereof;

a first p-channel MISFET and a second p-channel MISFET of said memory cell, each formed on said substrate and having a gate electrode formed over said substrate and extending over a channel-forming region thereof;

a first conductive strip extending over said substrate, a drain region of said first n-channel MISFET, and a drain region of said first p-channel MISFET, said first conductive strip being electrically connected to said drain region of said first n-channel MISFET, said drain region of said first p-channel MISFET, said gate electrode of said second n-channel MISFET, and said gate electrode of said second p-channel MISFET;

a second conductive strip extending over said substrate, a drain region of said second n-channel MISFET, and a drain region of said second p-channel MISFET, said second conductive strip being electrically connected to said drain region of said second n-channel MISFET, said drain region of said second p-channel MISFET, said gate electrode of said first n-channel MISFET, and said gate electrode of said first p-channel MISFET;

a dielectric film extending over at least said first conductive strip and said second conductive strip, the dielectric film containing a silicon nitride film and having a thickness less than that of said first conductive strip and said second conductive strip; and a first power voltage line formed on said dielectric film and extending over said first conductive strip, said second conductive strip, and said gate electrodes of said first and second p-channel MISFETs, wherein said first power voltage line is formed to cover said first conductive strip and said second conductive strip, wherein a first capacitor element is comprised of said first conductive strip, said dielectric film, and said first power voltage line, and wherein a second capacitor element is comprised of said second conductive strip, said dielectric film, and said first power voltage line.

9. A semiconductor integrated circuit device according to claim 8, wherein said first power voltage line is formed to cover said first and second p-channel MISFETs.

* * * * *